(12) United States Patent
Nakazawa et al.

(10) Patent No.: US 9,028,649 B2
(45) Date of Patent: May 12, 2015

(54) SEMICONDUCTOR DIE PICK-UP APPARATUS AND METHOD OF PICKING UP SEMICONDUCTOR DIE USING THE SAME

(71) Applicant: Shinkawa Ltd., Tokyo (JP)

(72) Inventors: Motoki Nakazawa, Tokyo (JP); Shinichi Sasaki, Tokyo (JP); Akiko Fujii, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 8 days.

(21) Appl. No.: 13/834,708

(22) Filed: Mar. 15, 2013

(65) Prior Publication Data

US 2013/0272837 A1    Oct. 17, 2013

Related U.S. Application Data

(63) Continuation of application No. PCT/JP2011/067581, filed on Aug. 1, 2011.

(30) Foreign Application Priority Data

Sep. 28, 2010 (JP) .................. 2010-217444

(51) Int. Cl.
*B32B 38/10*  (2006.01)
*H01L 21/683*  (2006.01)
(Continued)

(52) U.S. Cl.
CPC ... *H01L 21/6838* (2013.01); *H01L 2221/68336* (2013.01); *H01L 2221/68386* (2013.01);
(Continued)

(58) Field of Classification Search
CPC ........... H01L 2221/68381; H01L 2221/68386; H01L 2221/68318; H01L 2221/68322; H01L 2221/68336; H01L 2221/68354; H01L 21/67271; Y10S 156/932; Y10S 156/943
USPC .................. 156/707, 716, 758, 765, 932, 943
See application file for complete search history.

(56) References Cited

U.S. PATENT DOCUMENTS 6,561,743 B1    5/2003 Nakatsu
7,240,422 B2    7/2007 Cheung et al.
(Continued)

FOREIGN PATENT DOCUMENTS

| JP | 3209736 | 9/2001 |
|----|---------|--------|
| JP | 2005-328054 | 11/2005 |
| JP | 4215818 | 1/2009 |
| JP | 2010-206036 | 9/2010 |
| WO | 2010/001497 | 1/2010 |
| WO | 2010/052759 | 5/2010 |

OTHER PUBLICATIONS

International Search Report dated Nov. 1, 2011, from corresponding International Application No. PCT/JP2011/067581.

*Primary Examiner* — Mark A Osele
(74) *Attorney, Agent, or Firm* — Katten Muchin Rosenman LLP

(57) ABSTRACT

Provided is a semiconductor die pick-up apparatus including a stage, a suction opening, a cover that opens and closes a suction opening, and projections and primary holes arranged at a circumferential edge of the suction opening and project from a contact surface. When picking up a semiconductor die, in a state in which at least a portion of a contour of the semiconductor die sticks out from the projections toward the outer circumference of the stage, a retaining sheet at the portion sticking out from the primary holes is suctioned, a tip end of the cover is caused to advance upward, the cover is caused to slide while pushing the retaining sheet and the semiconductor die upward to open the suction opening sequentially, the opened suction opening is caused to suction the retaining sheet sequentially to separate the retaining sheet from the semiconductor die.

19 Claims, 31 Drawing Sheets

(51) Int. Cl.
*H01L 21/67* (2006.01)
*H01L 23/00* (2006.01)

(52) U.S. Cl.
CPC ...... *H01L2221/6839* (2013.01); *Y10S 156/943* (2013.01); *Y10S 156/932* (2013.01); *H01L 21/67132* (2013.01); **ABC *H01L 21/6836*** (2013.01); *H01L 24/27* (2013.01); *H01L 2224/83191* (2013.01); *H01L 2221/68327* (2013.01); *H01L 2221/68377* (2013.01); *H01L 24/29* (2013.01); *H01L 24/75* (2013.01); *H01L 24/83* (2013.01); *H01L 2224/27436* (2013.01); *H01L 2224/2919* (2013.01); *H01L 2224/75745* (2013.01)

(56) References Cited

U.S. PATENT DOCUMENTS

| | | | |
|---|---|---|---|
| 7,303,647 B2 * | 12/2007 | Cheung et al. | 156/765 |
| 7,820,006 B2 | 10/2010 | Umehara et al. | |
| 2005/0255673 A1 | 11/2005 | Cheung et al. | |
| 2009/0075459 A1 * | 3/2009 | Sato et al. | 438/464 |
| 2009/0101282 A1 * | 4/2009 | Fujino et al. | 156/344 |
| 2010/0038031 A1 * | 2/2010 | Koike | 156/344 |
| 2010/0226745 A1 | 9/2010 | Umehara et al. | |

* cited by examiner

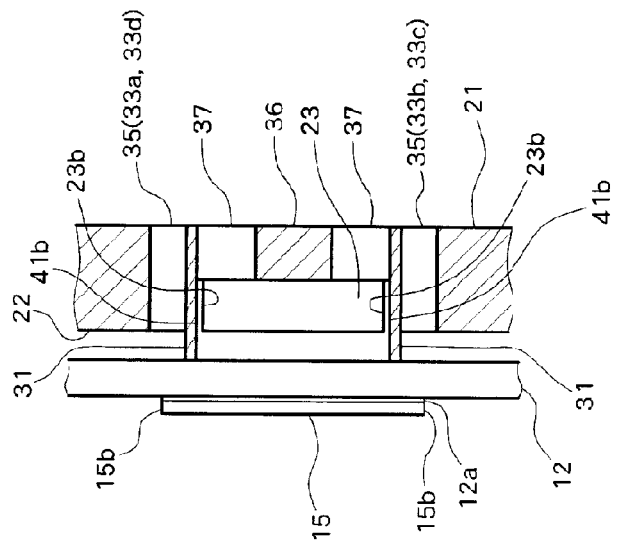
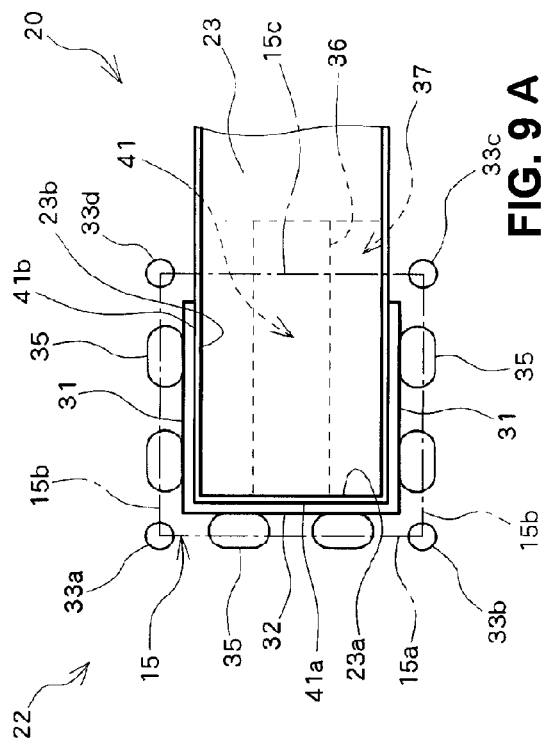
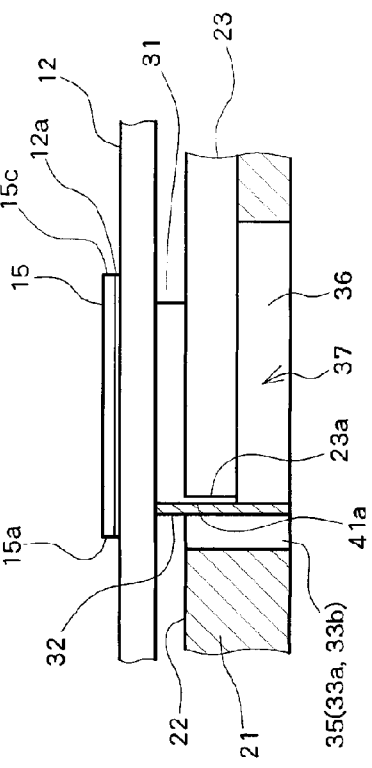
FIG. 9A
FIG. 9B
FIG. 9C

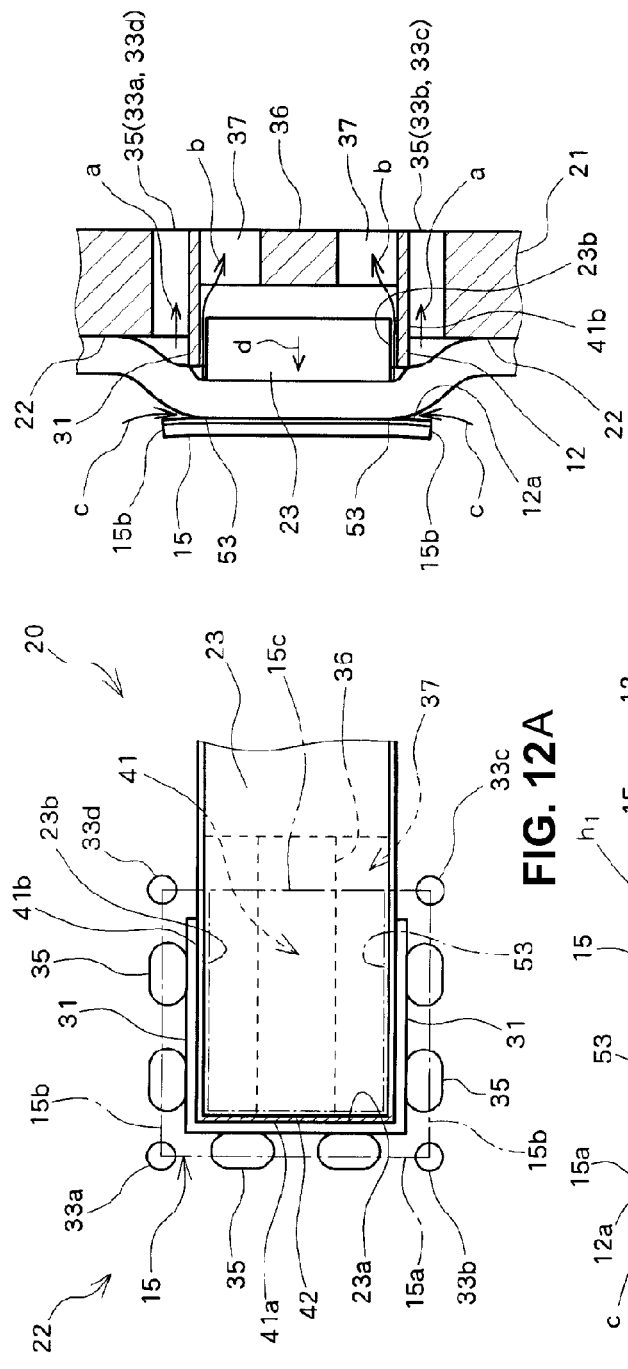
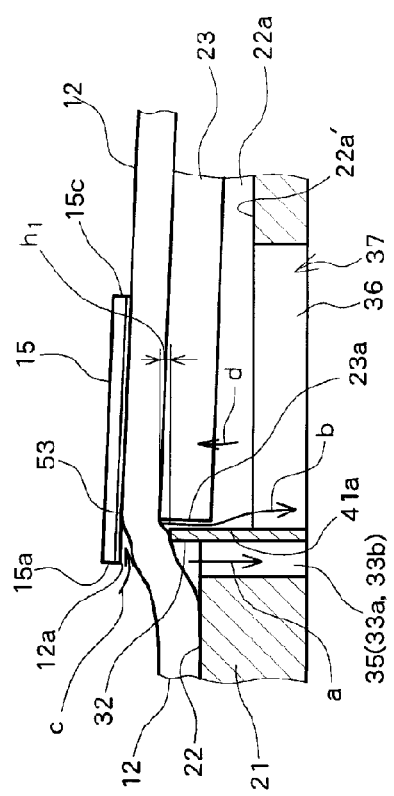
FIG. 12A
FIG. 12B
FIG. 12C

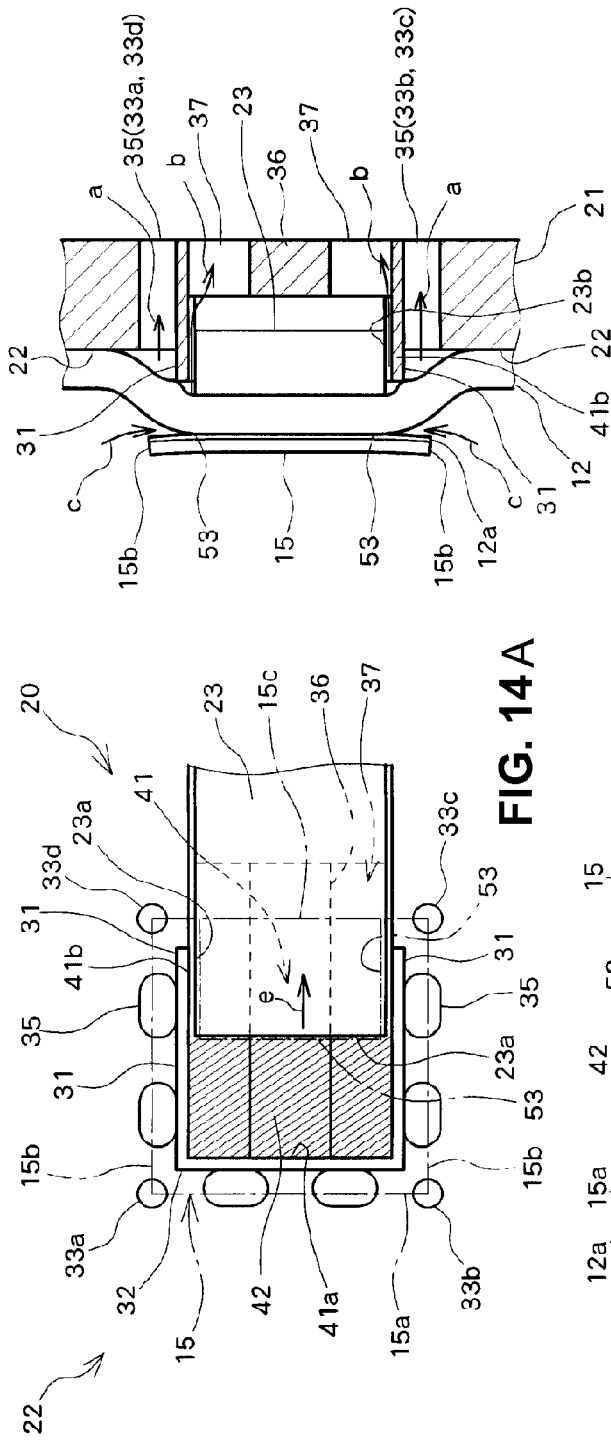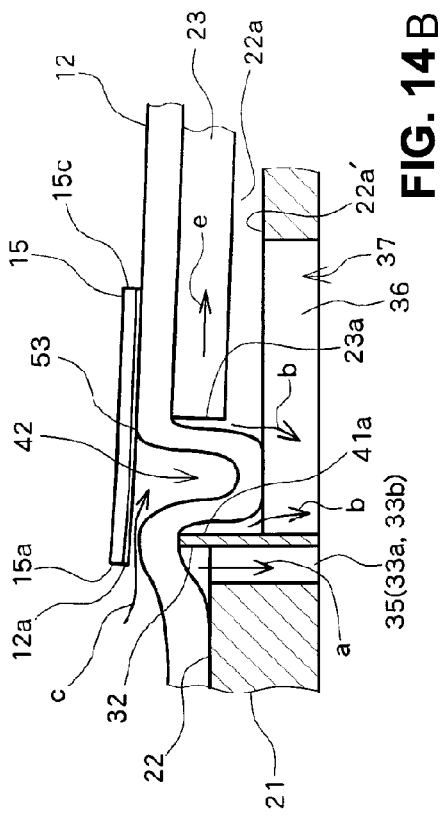

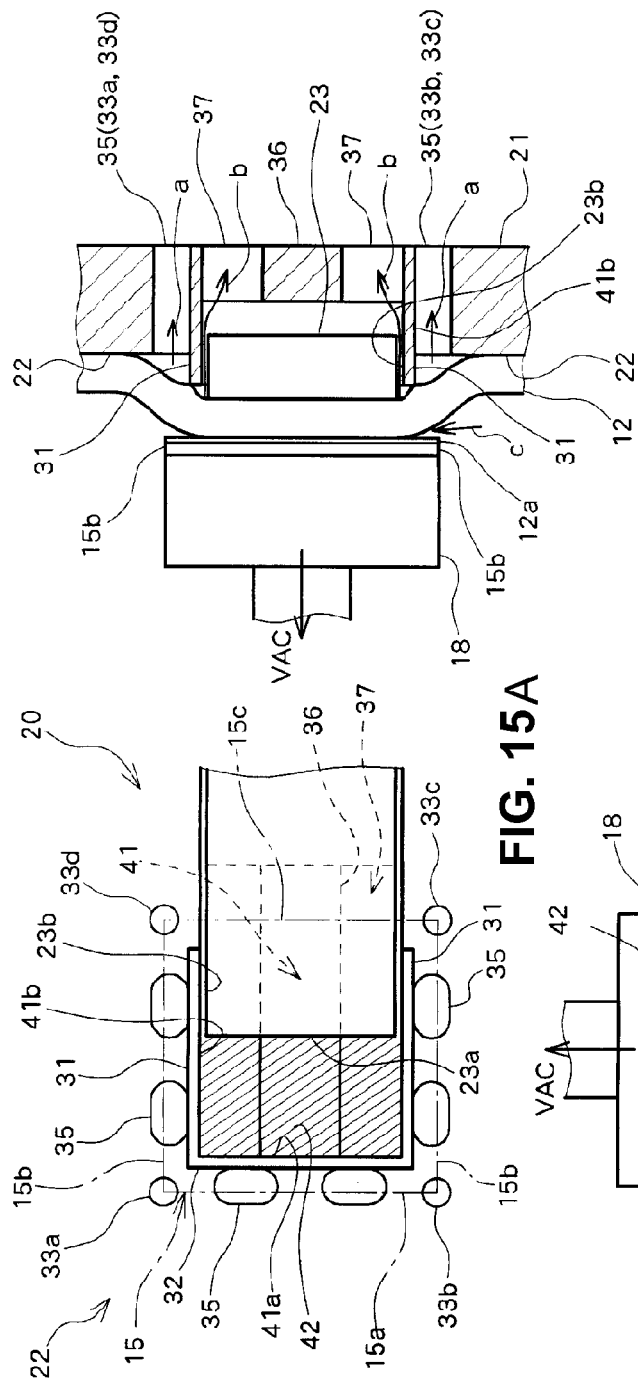
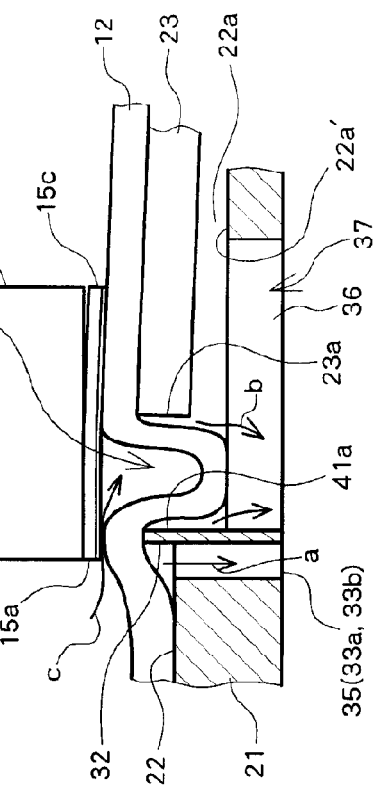
FIG. 15A
FIG. 15B
FIG. 15C

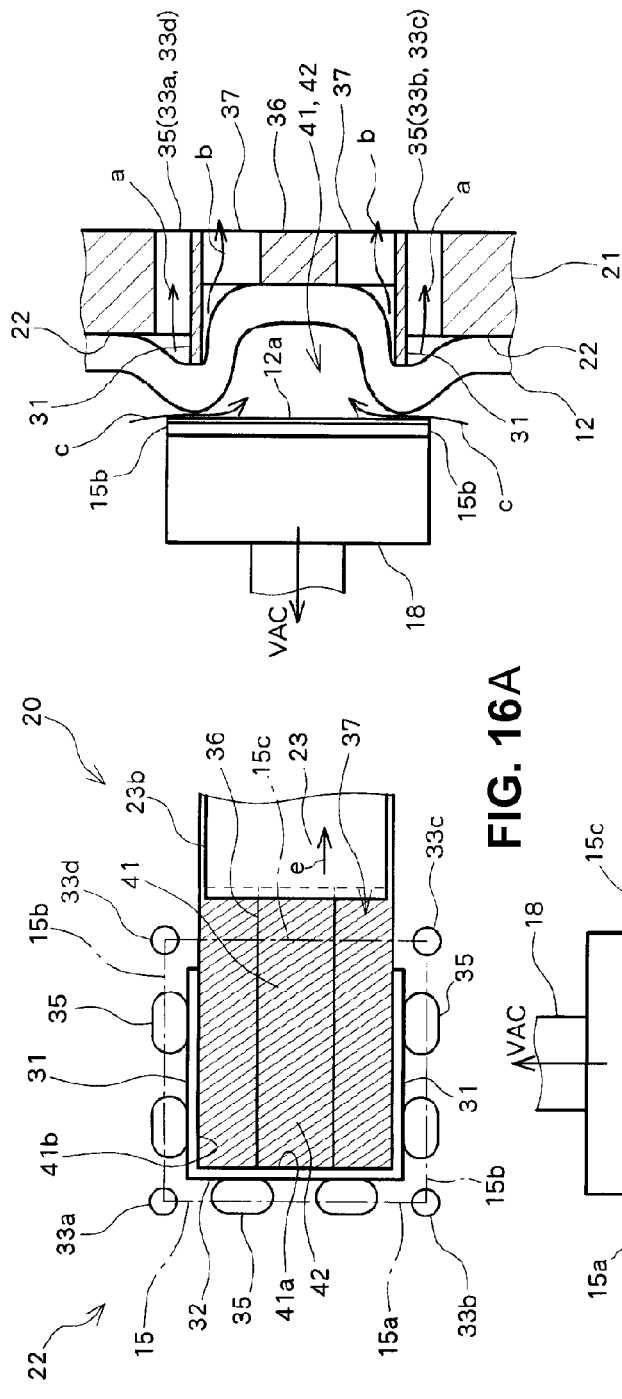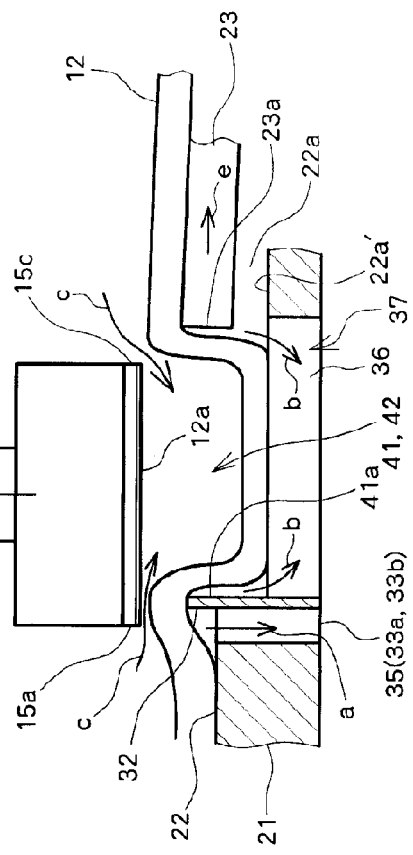

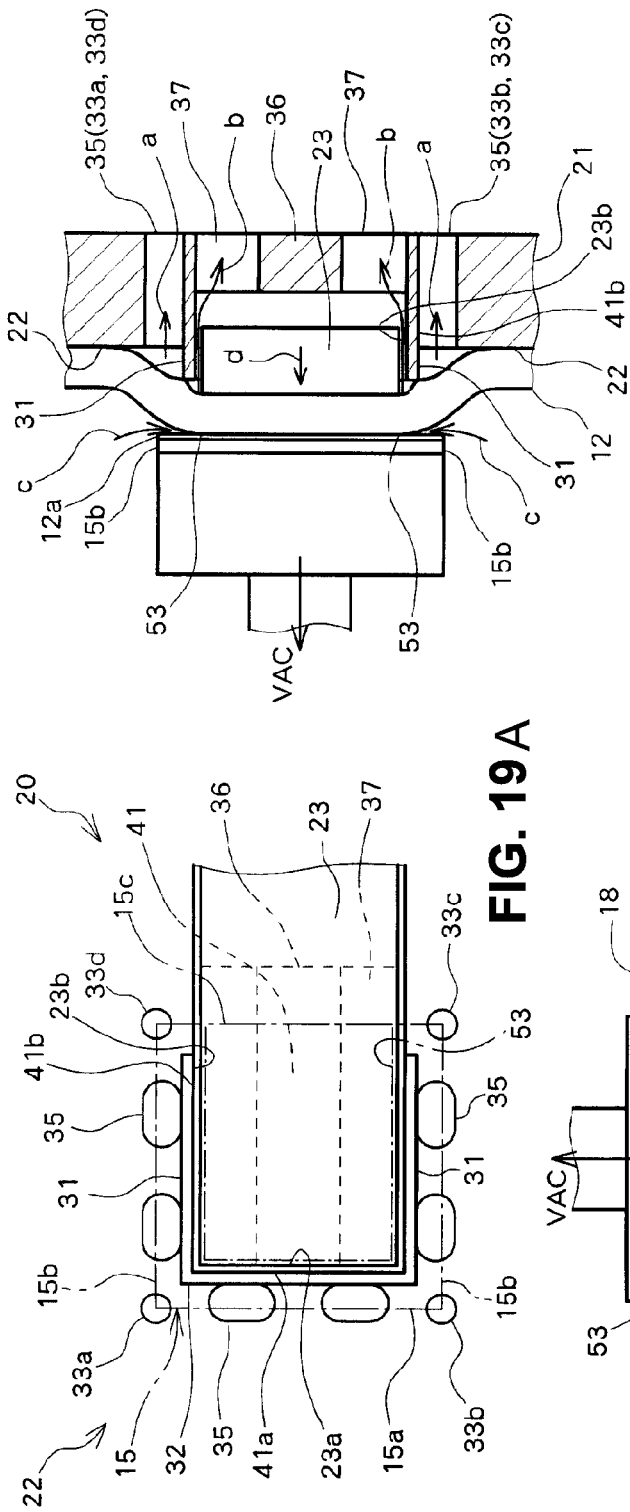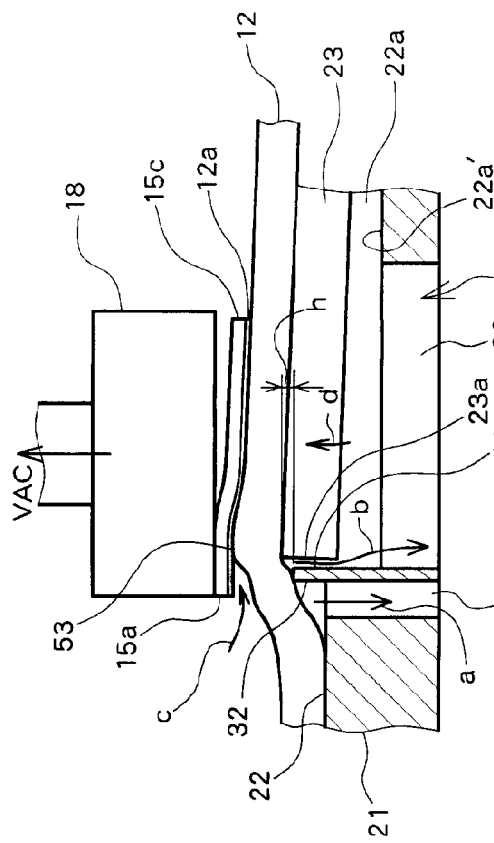

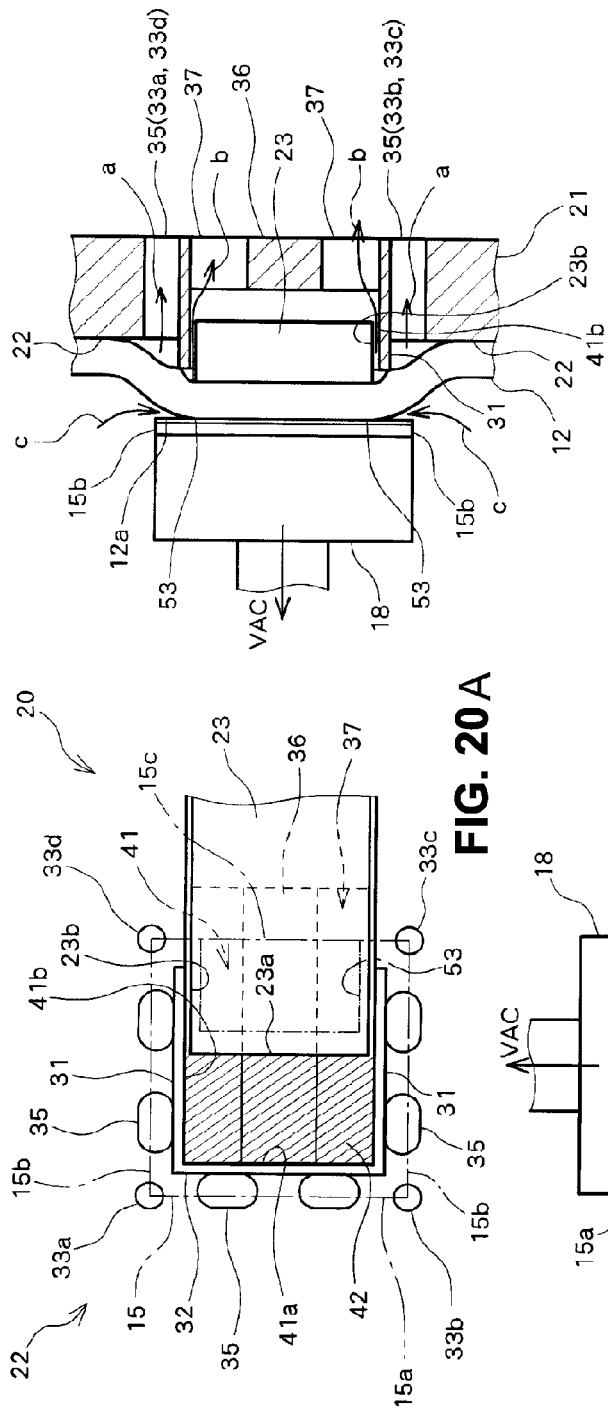
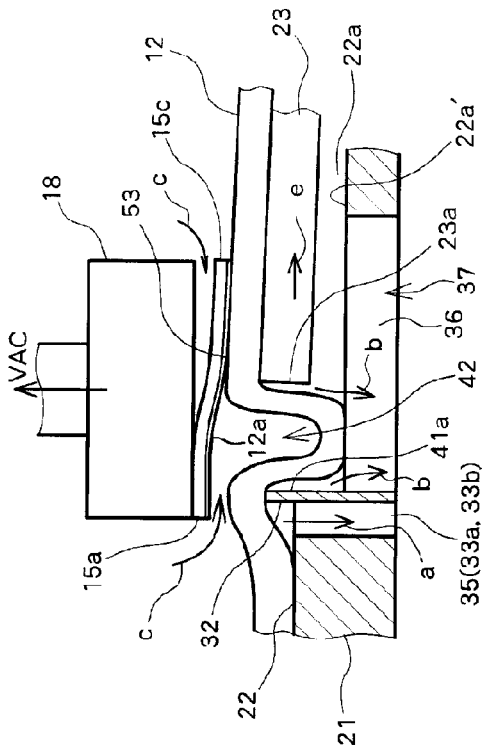
FIG. 20A
FIG. 20B
FIG. 20C

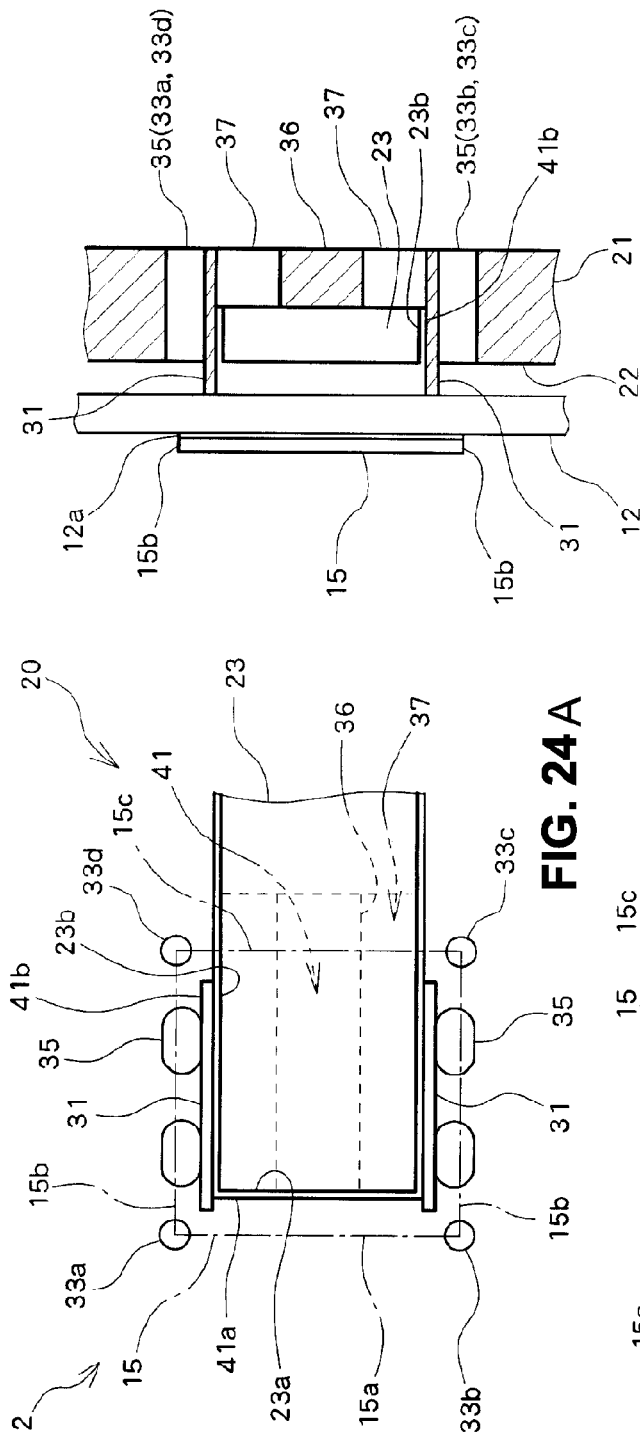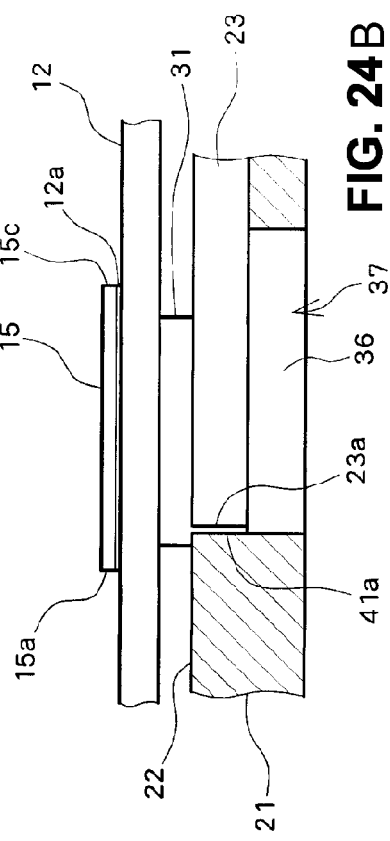
FIG. 24A  FIG. 24B  FIG. 24C

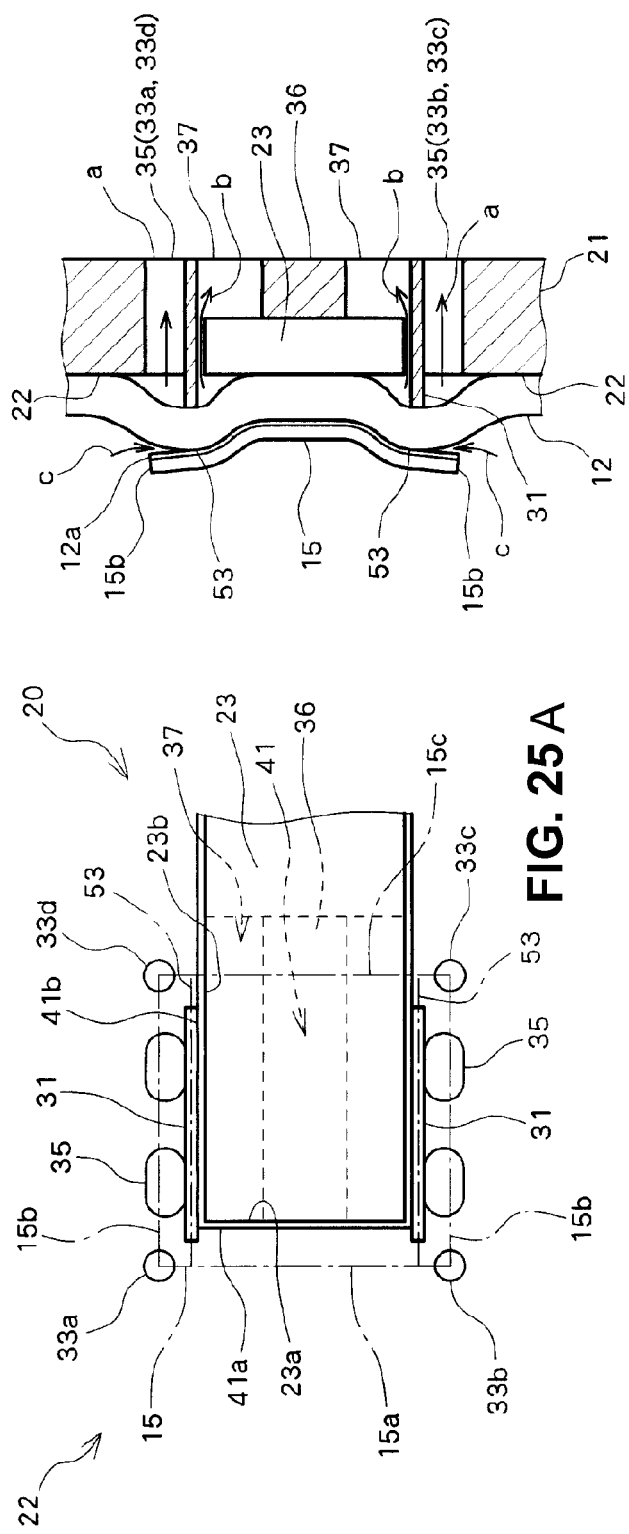
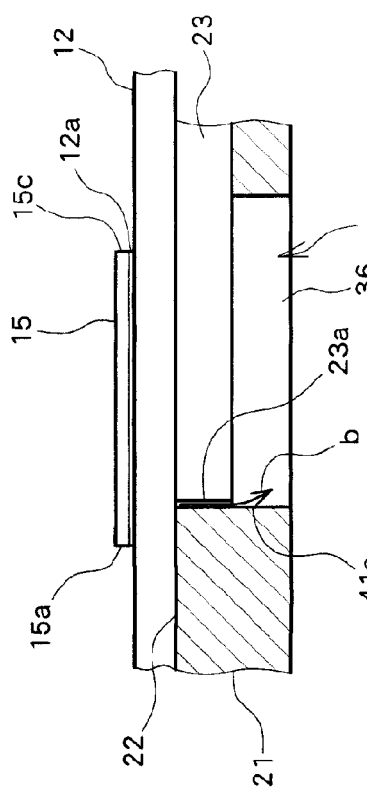
FIG. 25A
FIG. 25B
FIG. 25C

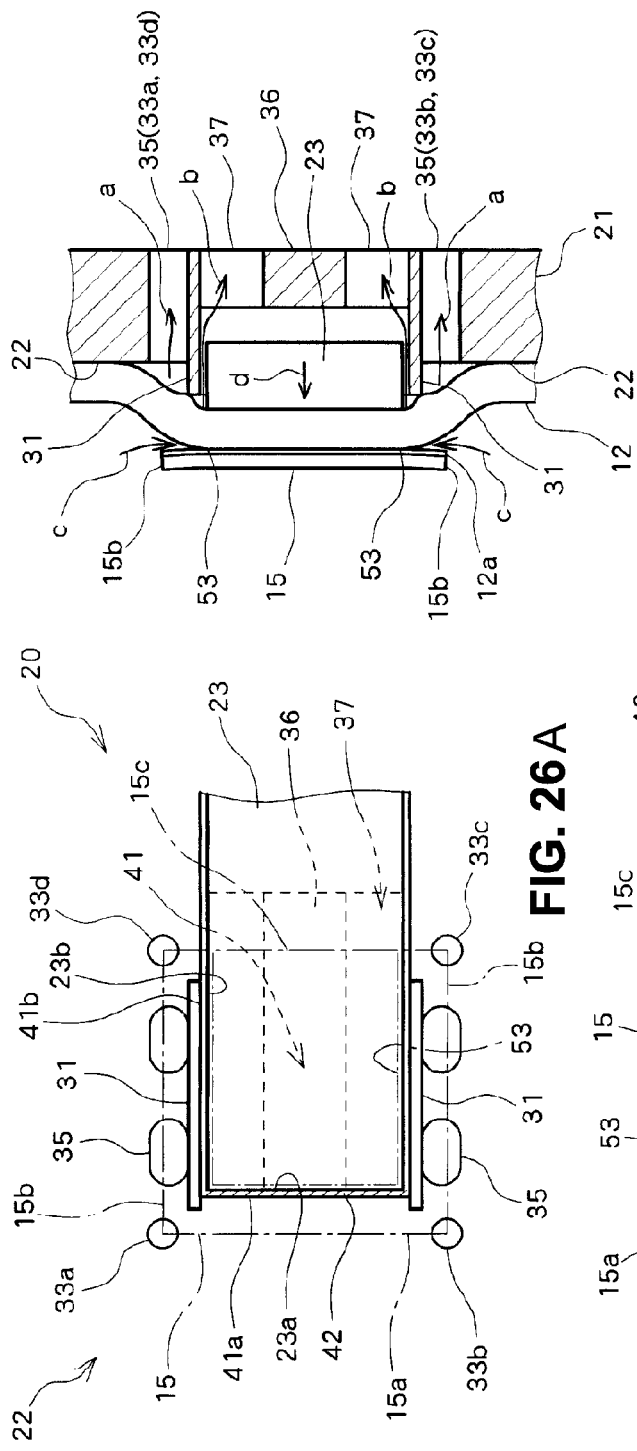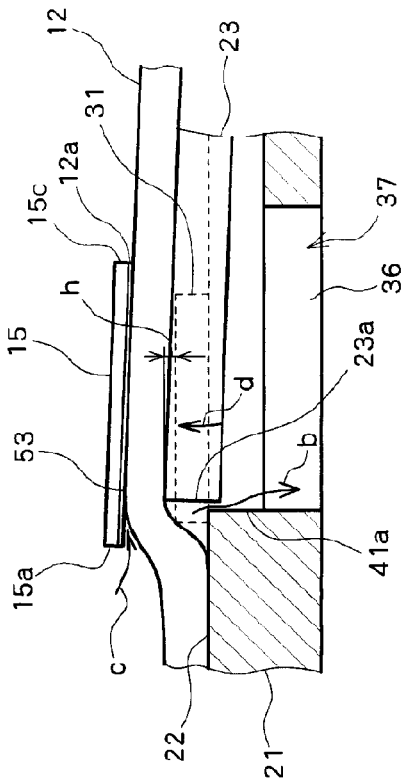
FIG. 26A
FIG. 26B
FIG. 26C

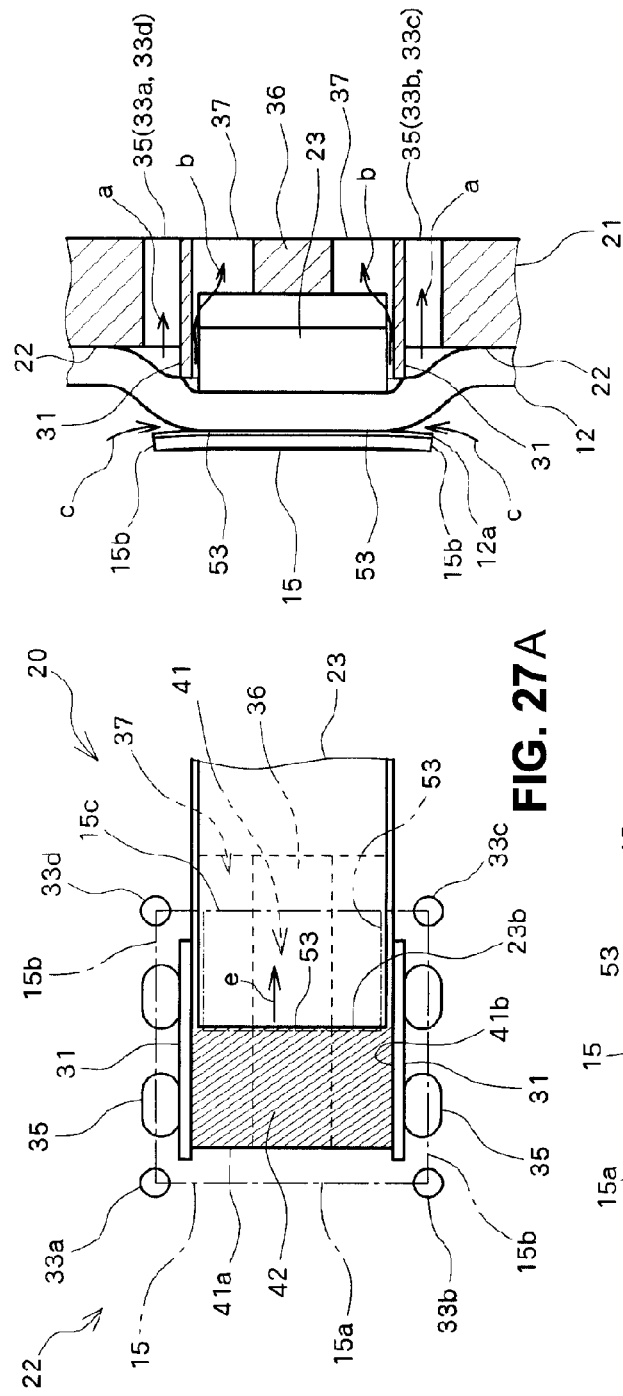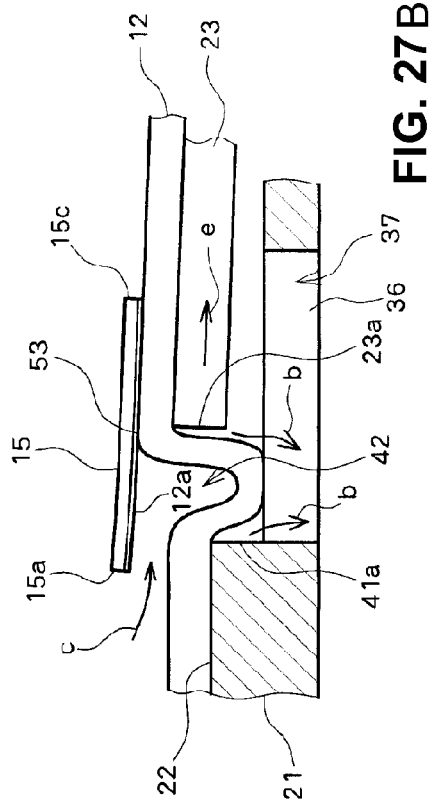

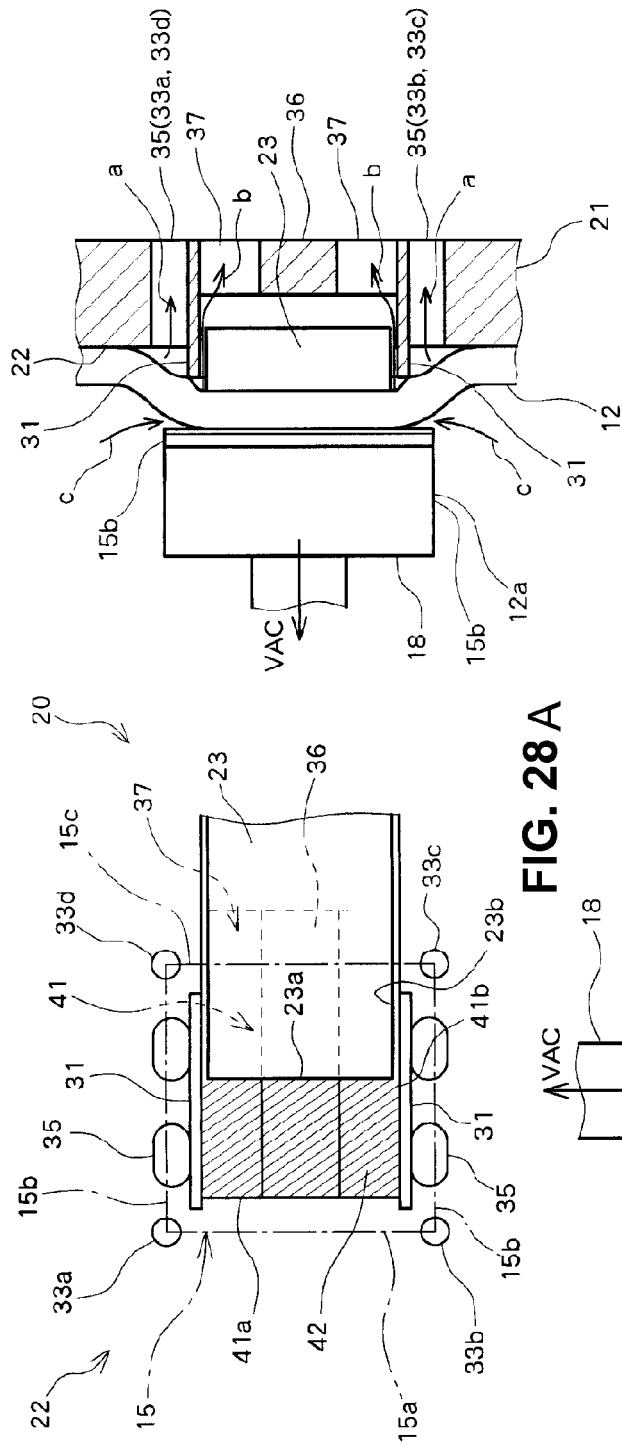
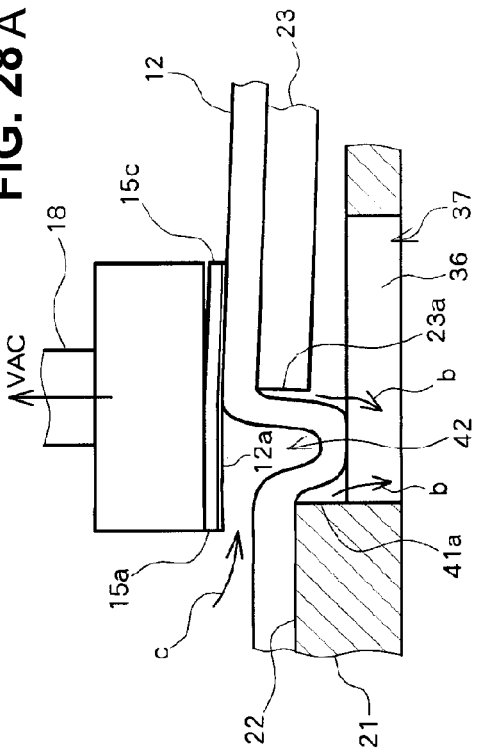
FIG. 28A
FIG. 28B
FIG. 28C

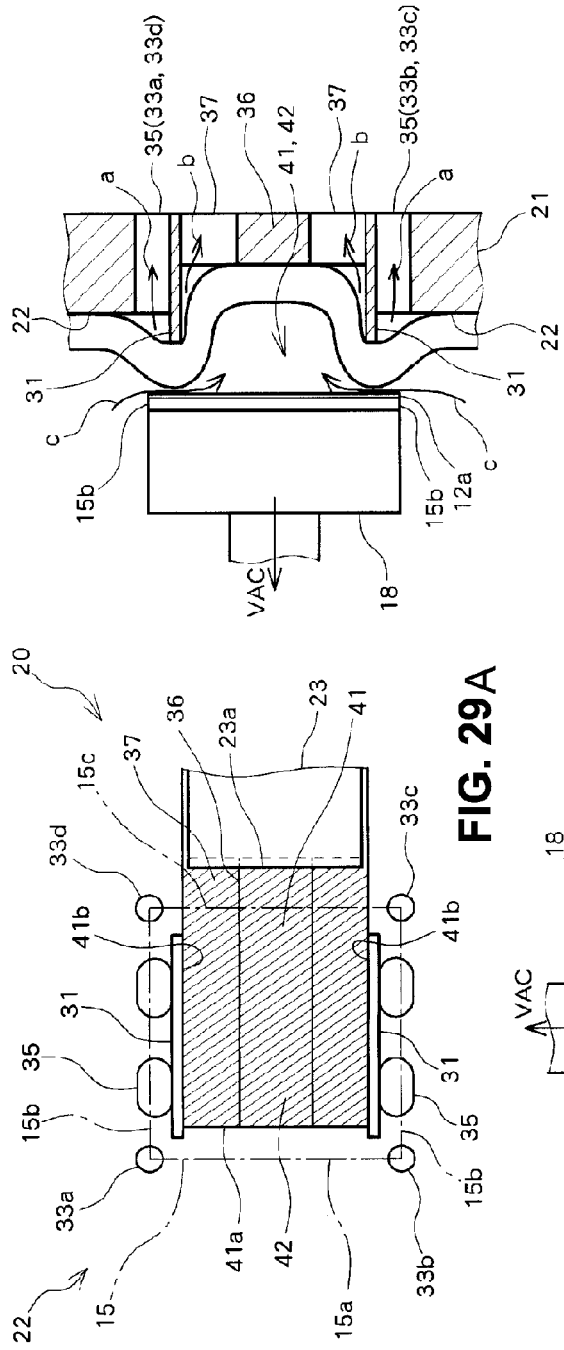
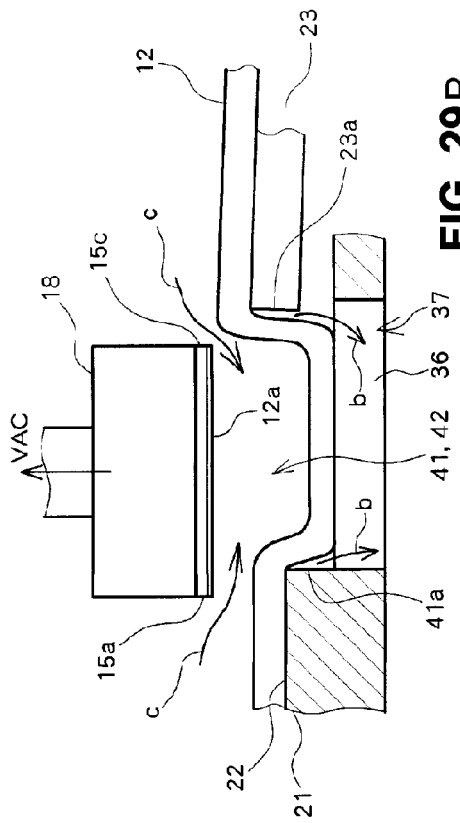

SEMICONDUCTOR DIE PICK-UP APPARATUS AND METHOD OF PICKING UP SEMICONDUCTOR DIE USING THE SAME

The present invention relates to a structure of semiconductor dice pick-up apparatus and a method of picking up the semiconductor dice using this apparatus.

BACKGROUND ART

A semiconductor die is fabricated by dicing a 6-inch large or 8-inch large wafer into dice of a predetermined size. When dicing, an adhesive retaining tape is attached on a back surface of a wafer so that semiconductor dice may not fall apart after dicing, and the wafer is diced from a front surface using a dicing saw or the like. At this time, the retaining tape on the back surface is slightly cut into but not cut off, and retains the semiconductor dice. Then, the semiconductor dice that have been diced are picked up one by one from the retaining tape, and transferred to the next step such as die bonding.

Conventionally, as a method of picking up the semiconductor dice from an adhesive retaining tape, a method using a plunge-up needle is commonly used (see FIG. 15 in Patent Document 1, for example). According to this method, the center of the semiconductor die is plunged up with a plunge-up needle from under a retaining sheet to which a tensile force is applied toward a surrounding area in a state in which the semiconductor die is suctioned with a collet, the adhesive retaining sheet is separated from the semiconductor die by the tensile force applied to the retaining sheet, and the semiconductor die is picked up with the collet.

However, this method using the plunge-up needle has a problem that the semiconductor die may become broken by being plunged up if the semiconductor die is thin, and therefore it becomes difficult to use this method in picking up of recent thin semiconductor dice.

Thus, there have been proposed methods of separating and picking up the semiconductor die from an adhesive retaining sheet without using a plunge-up needle. As an example, Patent Document 1 proposes a method of: providing a projecting portion whose width is smaller than that of the semiconductor die to be picked up on a front surface of a stage; providing suction holes in the front surface of the stage around the projecting portion; when picking up the semiconductor die, placing the semiconductor die to be picked up on the projecting portion so that the semiconductor die to be picked up sticks out from the projecting portion and held with a collet; vacuum-suctioning a retaining sheet downward through the suction holes to separate a portion of the retaining sheet that sticks out from the projecting portion off from the semiconductor die; and thereafter moving the projecting portion horizontally with the stage front surface while the semiconductor die is being suctioned with the collet to separate the remaining portion of the retaining sheet from the semiconductor die (see FIG. 9 to FIG. 10 in Patent Document 1).

Further, Patent Document 2 proposes a method of: providing suction openings in a contact surface of a stage; when picking up the semiconductor die, causing a tip end of a cover that opens and closes the suction opening to be advanced from the contact surface; causing the cover to slide while pushing up a retaining sheet and the semiconductor die to sequentially open the suction openings; sequentially causing the opened suction openings to suction the retaining sheet and separate the retaining sheet; and causing a collet that stands by above the semiconductor die to sequentially suction the semiconductor die, thereby picking up the semiconductor die (see FIG. 11 and FIG. 13 in Patent Document 2).

RELATED ART DOCUMENTS

Patent Documents

Patent Document 1: Japanese Patent No. 3209736
Patent Document 2: Japanese Patent No. 4215818

SUMMARY OF THE INVENTION

Technical Problems

In contrast, in recent years, semiconductor dice have become increasingly thinner, and there are cases in which the conventional techniques described in Patent Documents 1 and 2 cannot sufficiently separate a retaining sheet. According to the conventional technique described in Patent Document 1, if a semiconductor die is thinner and its strength is lower, when the portion of the retaining sheet sticking out from the projecting portion is suctioned downward, this portion cannot be separated from the semiconductor die, and rather the semiconductor die at this portion can be adversely bent downward along with the retaining sheet, and therefore there is a case in which the retaining sheet cannot be separated even when the projecting portion slides, or the semiconductor die can be damaged. Further, according to the conventional technique described in Patent Document 2, the retaining sheet is suctioned downward along a chamfered portion provided at each corner of both sides of the cover as the cover is advanced from the contact surface, and whereby the retaining sheet at side edges of the semiconductor die is separated from the semiconductor die (see FIG. 8 in Patent Document 2). This provides triggers for separating the retaining sheet at the side edges of the semiconductor die, and the retaining sheet is separated from an entire surface of the semiconductor die by these portions and triggers for separating the retaining sheet at the side edges of the semiconductor die formed by causing the tip end of the cover to be advanced from the suction surface. However, if the semiconductor die is thinner and its strength is lower, the retaining sheet at the side edges of the semiconductor die can not be separated from the semiconductor die when the retaining sheet is suctioned downward along the chamfered portions of the cover by causing the cover to be advanced from the contact surface, and rather the semiconductor die of this portion can be adversely bent downward along with the retaining sheet, and therefore there is a case in which the retaining sheet cannot be separated even when the cover slides, or the semiconductor die can be damaged.

Thus, an object of the present invention is to facilitate picking up of a thinner semiconductor die using a semiconductor die pick-up apparatus.

Solutions to Problems

A semiconductor die pick-up apparatus according to the present invention is a semiconductor die pick-up apparatus for picking up the semiconductor die applied to a retaining sheet, the apparatus provided with: a stage including a contact surface configured to be in close contact with one surface of the retaining sheet, the one surface being opposite of another surface to which semiconductor dice are applied; a suction opening provided in the contact surface; a cover provided for the stage so as to allow a tip end of the cover on a closing side of the suction opening to advance freely from the contact surface, and configured to slide along the contact surface to open and close the suction opening; a projection arranged along a circumferential edge of the suction opening and projects from the contact surface; suction holes provided in the contact surface on a side of an outer circumference of the stage from the projection; and a collet configured to suction the semiconductor die.

In the semiconductor die pick-up apparatus according to the present invention, it is preferable that when picking up the semiconductor die, in a state in which at least a portion of a contour of the semiconductor die to be picked up sticks out from the projection toward the outer circumference of the stage, the retaining sheet at the portion sticking out from the projection toward the outer circumference of the stage is suctioned into the suction holes, the tip end of the cover is caused to advance up to a position equal to or higher than an upper end surface of the projection from the contact surface, the cover is caused to slide while the retaining sheet and the semiconductor die to be picked up are pushed upward to open the suction opening sequentially, the opened suction opening is caused to suction the retaining sheet sequentially to separate the retaining sheet from the semiconductor die to be picked up, and the collet is caused to suction the semiconductor die to be picked up.

In the semiconductor die pick-up apparatus according to the present invention, it is preferable that the suction opening extends linearly, and the projection includes two side projections respectively provided along linearly extending opposing sections of the circumferential edge of the suction opening, and an interval between outer surfaces of the side projections on an opposite side of the suction opening is smaller than a width of the semiconductor die to be picked up. It is also preferable that the projection further includes an end surface projection provided along a section of the circumferential edge at an end of the suction opening which the tip end of the cover moves closer to and away from.

In the semiconductor die pick-up apparatus according to the present invention, it is preferable that the suction holes include four primary holes arranged at four corners of a rectangular region that includes the end of the suction opening which the tip end of the cover moves closer to and away from and at least a portion of the side projections, two facing sides of the rectangular region being parallel with the side projections, a width of the rectangular region in a direction perpendicular to a direction in which the suction opening extends is substantially the same as a width of the semiconductor die to be picked up, and a length of the rectangular region in the direction in which the suction opening extends is substantially the same as a length of the semiconductor die to be picked up.

In the semiconductor die pick-up apparatus according to the present invention, it is preferable that when picking up the semiconductor die, the tip end of the cover is caused to advance up to the position equal to or higher than the upper end surface of the projection from the contact surface, the cover is caused to slide to a first predetermined position while the retaining sheet and the semiconductor die to be picked up are pushed upward to open the suction opening sequentially to the first predetermined position, the opened suction opening is caused to suction the retaining sheet sequentially to separate the retaining sheet from the semiconductor die to be picked up to a portion near the first predetermined position, the collet is moved down immediately above the semiconductor die to be picked up to suction a portion of the semiconductor die to be picked up, the cover thereafter is caused to slide further in the sliding direction from the first predetermined position while the retaining sheet and the semiconductor die to be picked up are pushed upward to open the suction opening sequentially further in the sliding direction from the first predetermined position, the further opened suction opening is caused to suction the retaining sheet sequentially to separate the retaining sheet from the semiconductor die to be picked up further in the sliding direction from the portion near the first predetermined position, and the collet is caused to sequentially suction the remaining portion of the semiconductor die to be picked up.

In the semiconductor die pick-up apparatus according to the present invention, it is preferable that when picking up the semiconductor die, the tip end of the cover is caused to advance up to the position equal to or higher than the upper end surface of the projection from the contact surface, the cover is caused to slide to a first predetermined position while the retaining sheet and the semiconductor die to be picked up are pushed upward to open the suction opening sequentially to the first predetermined position, the opened suction opening is caused to suction the retaining sheet sequentially to separate the retaining sheet from the semiconductor die to be picked up to a portion near the first predetermined position, the collet is moved down immediately above the semiconductor die to be picked up to suction the semiconductor die to be picked up, the cover thereafter is caused to slide further in the sliding direction from the first predetermined position while the retaining sheet and the semiconductor die to be picked up are pushed upward to open the suction opening sequentially further in the sliding direction from the first predetermined position, and the further opened suction opening is caused to suction the retaining sheet sequentially to separate the retaining sheet from the semiconductor die to be picked up further in the sliding direction from the portion near the first predetermined position.

In the semiconductor die pick-up apparatus according to the present invention, it is preferable that when picking up the semiconductor die, the collet sequentially suctions the semiconductor die to be picked up as the retaining sheet is sequentially separated from the semiconductor die to be picked up in a state in which the collet holds the semiconductor die to be picked up. It is also preferable that when picking up the semiconductor die, the collet is moved upward in synchronization as the tip end of the cover is advanced up to the position equal to or higher than the upper end surface of the projection from the contact surface.

In the semiconductor die pick-up apparatus according to the present invention, it is preferable that the stage is cylindrical, the cover is substantially as wide as the suction opening, and when the tip end is advanced from the contact surface, a surface that pushes up the retaining sheet is inclined downward from a side of the tip end to a back end on the side of opening the suction opening, a sliding groove is provided, the sliding groove being recessed from the contact surface by a thickness of the cover, the sliding groove being substantially as wide as the cover, and the sliding groove extending toward an outer circumferential surface of the stage from a position of an end of the suction opening on an opening side of the cover to a position on a side of an inner circumference of the stage from a position of the back end of the cover in a state in which the cover closes the suction opening at a position that deviates from overlapping with a cylindrical surface of the outer circumference of the stage, an inclined surface is provided, the inclined surface extending from a bottom surface of the sliding groove at a side edge of at the outer circumference of the stage toward a side opposite of the contact surface, and when picking up the semiconductor die, the cover is caused to slide to sequentially open the suction opening while a surface of the cover that is opposite of a surface pushing up the retaining sheet is brought into contact with an edge between the bottom surface of the sliding groove and the inclined surface.

In the semiconductor die pick-up apparatus according to the present invention, it is preferable that an inclination angle of the inclined surface with respect to the contact surface is greater than an inclination angle of the surface of the cover that is opposite of the surface pushing up the retaining sheet with respect to the contact surface. It is also preferable that a stepped portion is provided, the stepped portion extending from the inclined surface to the outer circumference surface of the stage along the contact surface, and an angle of a surface including the edge and the side edge of the stepped portion at the outer circumference of the stage with respect to the contact surface is greater than an inclination angle of the surface of the cover that is opposite of the surface pushing up the retaining sheet with respect to the contact surface.

A method of picking up a semiconductor die according to the present invention is a method of picking up a semiconductor die applied to a retaining sheet using a semiconductor die pick-up apparatus for picking up a semiconductor die applied to the retaining sheet, the apparatus including: a stage including a contact surface configured to be in close contact with one surface of the retaining sheet, the one surface being opposite of another surface to which semiconductor dice are applied; a suction opening provided in the contact surface; a cover provided for the stage so as to allow a tip end of the cover on a closing side of the suction opening to advance freely from the contact surface, and configured to slide along the contact surface to open and close the suction opening; a projection arranged along a circumferential edge of the suction opening and projects from the contact surface; suction holes provided in the contact surface on a side of an outer circumference of the stage from the projection; and a collet configured to suction the semiconductor die, the method is provided with: an alignment step of, when picking up the semiconductor die, aligning positions of the semiconductor die to be picked up in a state in which at least a portion of a contour of the semiconductor die to be picked up sticks out from the projection toward the outer circumference of the stage; and a pick-up step of picking up the semiconductor die by suctioning the retaining sheet at the portion sticking out from the projection toward the outer circumference of the stage into the suction holes, causing the tip end of the cover to advance up to a position equal to or higher than an upper end surface of the projection from the contact surface, causing the cover to slide while the retaining sheet and the semiconductor die to be picked up are pushed upward to open the suction opening sequentially, causing the opened suction opening to suction the retaining sheet sequentially to separate the retaining sheet from the semiconductor die to be picked up, and causing the collet to suction the semiconductor die to be picked up.

In the method of picking up the semiconductor die according to the present invention, it is preferable that the pick-up step includes, when picking up the semiconductor die, causing the tip end of the cover to advance up to the position equal to or higher than the upper end surface of the projection from the contact surface, causing the cover to slide to a first predetermined position while the retaining sheet and the semiconductor die to be picked up are pushed upward to open the suction opening sequentially to the first predetermined position, causing the opened suction opening to suction the retaining sheet sequentially to separate the retaining sheet from the semiconductor die to be picked up to a portion near the first predetermined position, moving the collet down immediately above the semiconductor die to be picked up to suction a portion of the semiconductor die to be picked up, thereafter causing the cover to slide further in the sliding direction from the first predetermined position while the retaining sheet and the semiconductor die to be picked up are pushed upward to open the suction opening sequentially further in the sliding direction from the first predetermined position, causing the further opened suction opening to suction the retaining sheet sequentially to separate the retaining sheet from the semiconductor die to be picked up further in the sliding direction from the portion near the first predetermined position, and causing the collet to sequentially suction the remaining portion of the semiconductor die to be picked up.

In the method of picking up the semiconductor die according to the present invention, it is preferable that the pick-up step includes, when picking up the semiconductor die, causing the tip end of the cover to advance up to the position equal to or higher than the upper end surface of the projection from the contact surface, causing the cover to slide to a first predetermined position while the retaining sheet and the semiconductor die to be picked up are pushed upward to open the suction opening sequentially to the first predetermined position, causing the opened suction opening to suction the retaining sheet sequentially to separate the retaining sheet from the semiconductor die to be picked up to a portion near the first predetermined position, moving the collet down immediately above the semiconductor die to be picked up to suction the semiconductor die to be picked up, thereafter causing the cover to slide further in the sliding direction from the first predetermined position while the retaining sheet and the semiconductor die to be picked up are pushed upward to open the suction opening sequentially further in the sliding direction from the first predetermined position, and causing the further opened suction opening to suction the retaining sheet sequentially to separate the retaining sheet from the semiconductor die to be picked up further in the sliding direction from the portion near the first predetermined position.

In the method of picking up the semiconductor die according to the present invention, it is preferable that the pick-up step includes, when picking up the semiconductor die, causing the collet to sequentially suction the semiconductor die to be picked up as the retaining sheet is sequentially separated from the semiconductor die to be picked up in a state in which the collet holds the semiconductor die to be picked up. It is also preferable to move the collet upward, when picking up the semiconductor die, in synchronization as the tip end of the cover is advanced up to the position equal to or higher than the upper end surface of the projection from the contact surface.

It is preferable that the projection of the semiconductor die pick-up apparatus using the method of picking up the semiconductor die according to the present invention includes two side projections respectively provided along linearly extending opposing sections of the circumferential edge of the suction opening, the suction holes include four primary holes arranged at four corners of a rectangular region that includes the end of the suction opening which the tip end of the cover moves closer to and away from and at least a portion of the side projections, two facing sides of the rectangular region being parallel with the side projections, a width of the rectangular region in a direction perpendicular to a direction in which the suction opening extends is substantially the same as a width of the semiconductor die to be picked up, a length of the rectangular region in the direction in which the suction opening extends is substantially the same as a length of the semiconductor die to be picked up, and the alignment step includes aligning the positions of the semiconductor die to be picked up such that four corners of the semiconductor die to be picked up respectively come above the primary holes.

Effects of Invention

The present invention provides an effect of facilitating picking up of a thinner semiconductor die using the semiconductor die pick-up apparatus.

BRIEF DESCRIPTION OF DRAWINGS

FIG. 3b is a cross-sectional view of the wafer holder of FIG. 3a.

FIGS. 9a, 9b, and 9c are explanatory diagrams illustrating a state in which the stage for a semiconductor die is aligned with the semiconductor die in the semiconductor die pick-up apparatus according to the embodiment of the present invention.

FIGS. 12a, 12b, and 12c are explanatory diagrams illustrating a state in which the tip end of the cover of the semiconductor die pick-up apparatus according to the embodiment of the present invention is advanced from the contact surface.

FIGS. 14a, 14b, and 14c are explanatory diagrams illustrating a state in which the cover of the semiconductor die pick-up apparatus according to the embodiment of the present invention slides to the first position.

FIGS. 15a, 15b, and 15c are explanatory diagrams illustrating a state in which a collet moves down to the semiconductor die after the cover of the semiconductor die pick-up apparatus according to the embodiment of the present invention slides to the first position.

FIGS. 16a, 16b, and 16c are explanatory diagrams illustrating a state in which the collet of the semiconductor die pick-up apparatus according to the embodiment of the present invention has picked up the semiconductor die.

FIGS. 19a, 19b, and 19c are explanatory diagrams illustrating a state in which the tip end of the cover of the semiconductor die pick-up apparatus according to the different embodiment of the present invention is advanced from a contact surface.

FIGS. 20a, 20b, and 20c are explanatory diagrams illustrating a state in which the cover of the semiconductor die pick-up apparatus according to the different embodiment of the present invention slides.

FIGS. 24a, 24b, and 24c are explanatory diagrams illustrating a state in which the stage for a semiconductor die is aligned with the semiconductor die in the semiconductor die pick-up apparatus according to the different embodiment of the present invention.

FIGS. 25a, 25b, and 25c are explanatory diagrams illustrating a state in which a vacuum is produced within the stage of the semiconductor die pick-up apparatus according to the different embodiment of the present invention.

FIGS. 26a, 26b, and 26c are explanatory diagrams illustrating a state in which the tip end of the cover of the semiconductor die pick-up apparatus according to the different embodiment of the present invention is advanced from a contact surface.

FIGS. 27a, 27b, and 27c are explanatory diagrams illustrating a state in which the cover of the semiconductor die pick-up apparatus according to the different embodiment of the present invention slides to the first position.

FIGS. 28a, 28b, and 28c are explanatory diagrams illustrating a state in which the collet moves down to the semiconductor die after the cover of the semiconductor die pick-up apparatus according to the different embodiment of the present invention slides to the first position.

FIGS. 29a, 29b, and 29c are explanatory diagrams illustrating a state in which the collet of the semiconductor die pick-up apparatus according to the different embodiment of the present invention picks up the semiconductor die.

DESCRIPTION OF EMBODIMENTS

Figure 1:
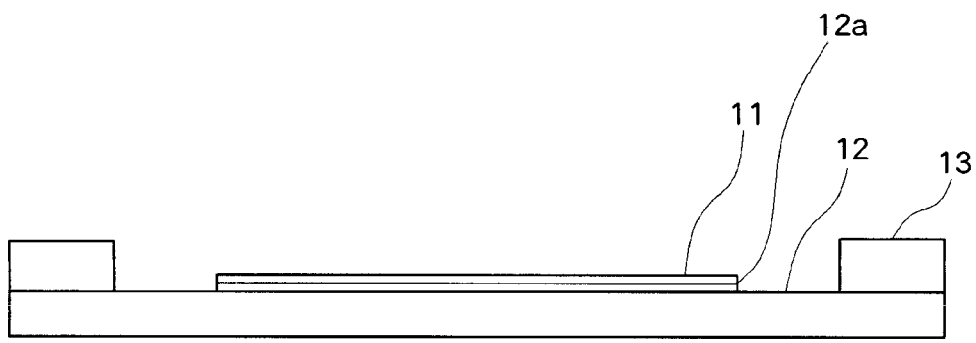
FIG. 1 is an explanatory diagram illustrating a wafer attached to a retaining sheet.
Figure 2:
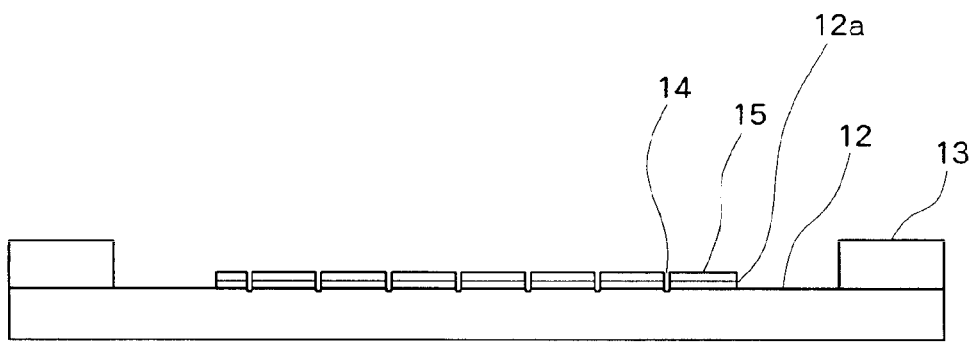
FIG. 2 is an explanatory diagram illustrating semiconductor dice attached to the retaining sheet.

Hereinafter, embodiments according to the present invention will be described with reference to the drawings. Before describing a semiconductor die pick-up apparatus according to the present invention, a wafer and a wafer holder shall be described. As illustrated in FIG. 1, a die attachment film 12a and an adhesive retaining sheet 12 are applied to a back surface of a wafer 11, and the die attachment film 12a and the retaining sheet 12 are attached to a metallic ring 13. The thickness of the thin wafer 11 of recent years is on the order of 15 μm, the thickness of the die attachment film 12a of recent years is somewhere in the range from 5 to 20 μm, and the thickness of the retaining sheet is on the order of 100 μm. The wafer 11 is handled in a manner attached to the metallic ring 13 with the die attachment film 12a and the retaining sheet 12 interposed therebetween as described above. Then, as illustrated in FIG. 2, the wafer 11 and the die attachment film 12a are diced with a dicing saw or the like from a front surface in a dicing step, resulting in semiconductor dice 15 each having the die attachment film 12a attached to a back surface thereof. A cut-in gap 14 that has been produced in the dicing is provided between the semiconductor dice 15 and between the die attachment films 12a. While the depth of the cut-in gap 14 is such that it reaches a portion of the retaining sheet 12 through the semiconductor dice 15, the retaining sheet 12 is not cut off, and the semiconductor dice 15 are retained with the retaining sheet 12.

Figure 3A:
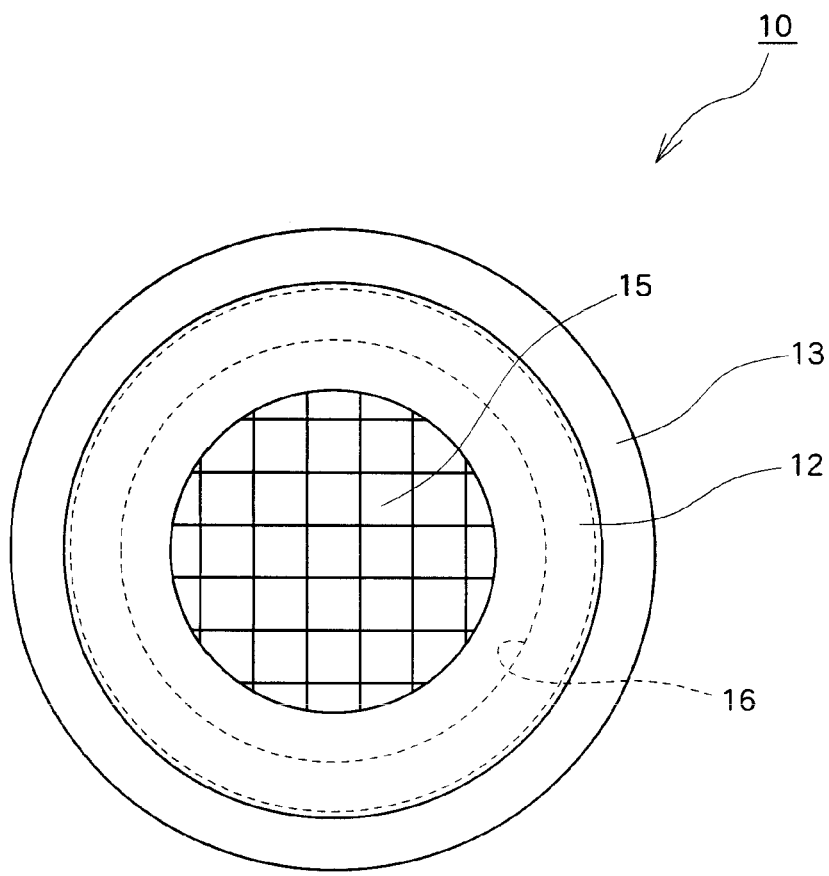
FIG. 3a is a plan view of a wafer holder.
Figure 3B:
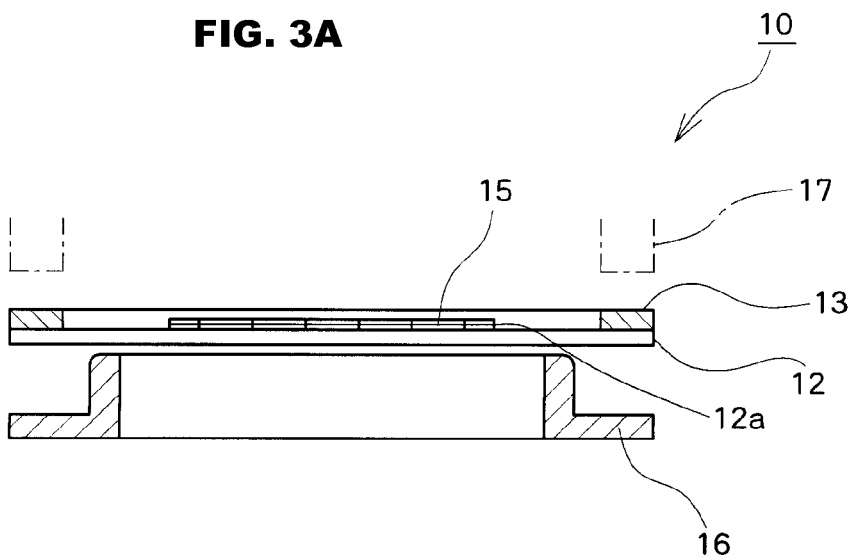

The semiconductor dice 15 to which the die attachment films 12a, the retaining sheet 12, and the ring 13 are attached in this manner are attached to a wafer holder 10 as illustrated in FIG. 3a and FIG. 3b. The wafer holder 10 is provided with an annular expand ring 16 having a flange, and a ring holder 17 that secures the ring 13 on the flange of the expand ring 16. The ring holder 17 is driven along a direction of approach and retraction with respect to the flange of the expand ring 16 by a ring holder driving unit that is not depicted. An inner diameter of the expand ring 16 is greater than a diameter of the wafer having the semiconductor dice 15 arranged, the expand ring 16 has a predetermined thickness, and the flange is provided outside the expand ring 16 and attached on an end surface on a side away from the retaining sheet 12 so as to project outward. Further, an outer circumference of the expand ring 16 on a side of the retaining sheet 12 is configured as a curved surface so that the retaining sheet 12 can be expanded smoothly when attaching the retaining sheet 12 to the expand ring 16. Moreover, the wafer holder 10 is configured to be movable in a direction along the surface of the retaining sheet 12 by a wafer holder horizontal direction driving unit that is not depicted.

As illustrated in FIG. 3b, the retaining sheet 12 applied to the semiconductor dice 15 is substantially flat before set to the expand ring 16.

Figure 4:
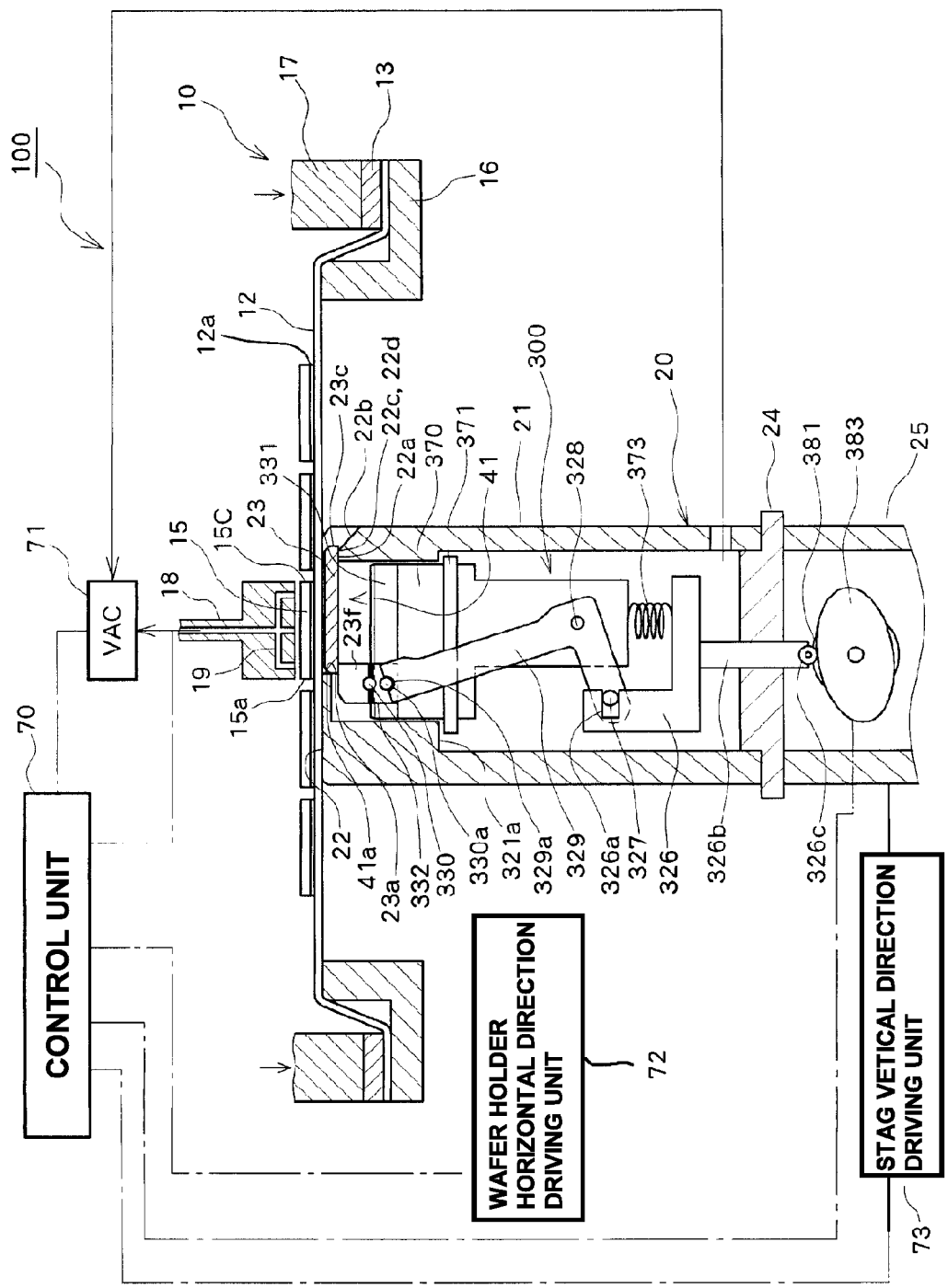
FIG. 4 is an explanatory diagram illustrating a configuration of a semiconductor die pick-up apparatus according to an embodiment of the present invention.

FIG. 4 is a diagram illustrating a configuration of a semiconductor die pick-up apparatus 100 according to the embodiment of the present invention, showing a state in which stacked bodies of the die attachment film 12a and the semiconductor die 15 applied to the retaining sheet 12 are set to the semiconductor die pick-up apparatus 100. In this state, the ring holder 17 moves downward onto the ring 13, and a tensile force of the retaining sheet 12 is adjusted by adjusting a descending amount (or push-in amount). As the expand ring 16 includes a step between an upper surface with which the retaining sheet 12 is brought into contact and a surface of the flange, when the ring 13 is pressed against the surface of the flange, the retaining sheet 12 is expanded along the curved surface of the upper portion of the expand ring 16 by an amount of the step between the upper surface and the surface of the flange of the expand ring 16. For this reason, a tensile force directed outwardly from the center of the retaining sheet is exerted on the retaining sheet 12 secured on the expand ring 16. Further, as the retaining sheet 12 is expanded due to this tensile force, the gap between the semiconductor dice 15 having the die attachment film 12a applied to the retaining sheet 12 increases.

The wafer holder 10 has a wafer holder horizontal direction driving unit 72 configured to move the wafer holder 10 in a plane along the retaining sheet 12. The wafer holder horizontal direction driving unit 72 can be configured, for example, to drive the wafer holder 10 horizontally with a motor and a gear provided inside, or to move the wafer holder 10 in an XY direction along a guide with a driving source such as a motor provided outside. Further, above the wafer holder 10, there is provided a collet 18 configured to suction and move a stacked body of the die attachment film 12a and the semiconductor die 15. The collet 18 includes suction holes 19 for suctioning the semiconductor die 15 in a suction surface, and each of the suction holes 19 is connected to a vacuum apparatus 71. Moreover, under the wafer holder 10, there is provided a stage 20. The stage 20 is driven by a stage vertical direction driving mechanism 73 in a vertical direction that is a direction of approach and retraction with respect to the retaining sheet 12. The stage vertical direction driving mechanism 73 can be configured, for example, to drive the stage 20 vertically with a motor and a gear provided inside, or to move the stage 20 vertically along a guide with a driving source such as a motor provided outside.

Figure 5:
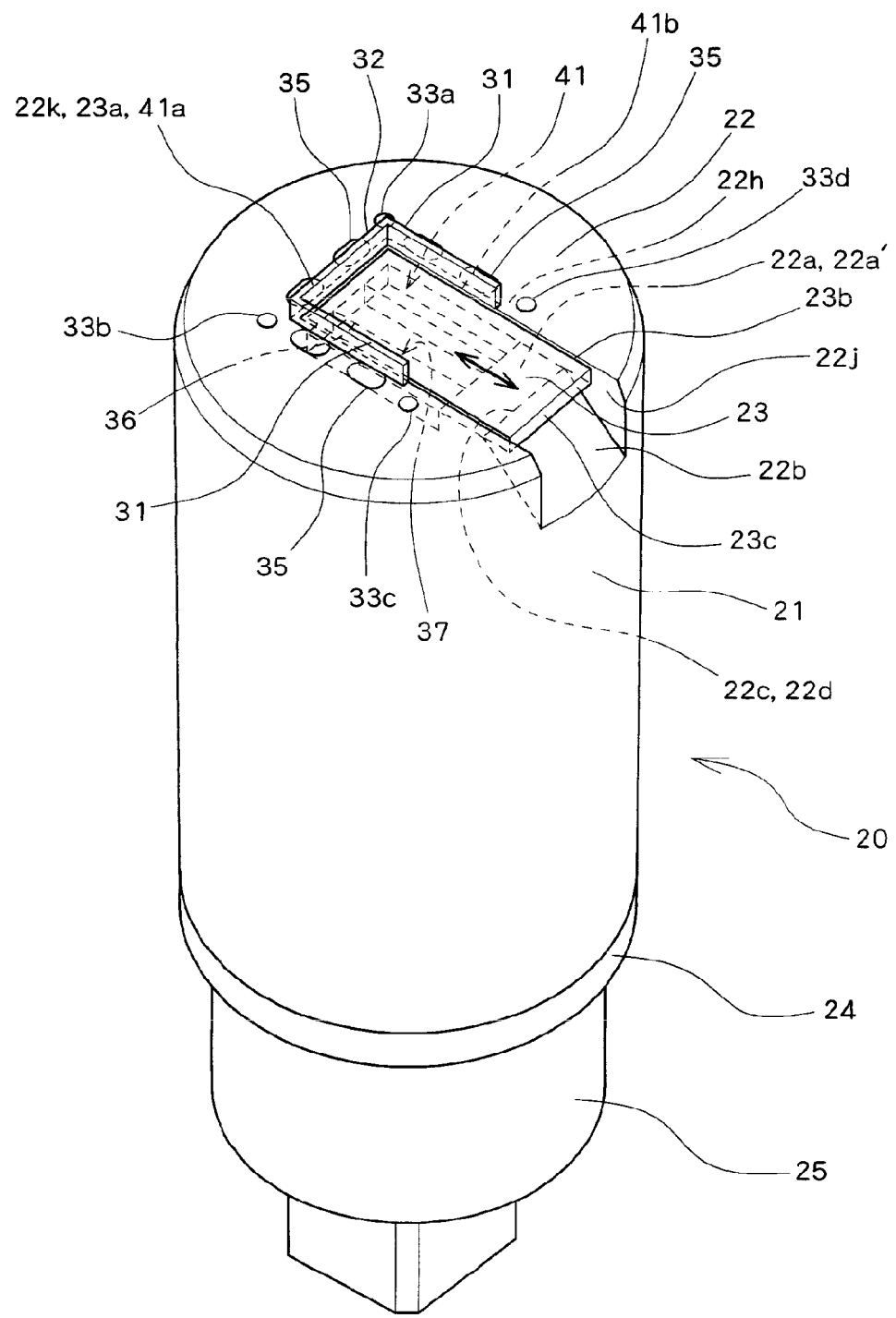
FIG. 5 is a perspective view illustrating a stage of the semiconductor die pick-up apparatus according to the embodiment of the present invention.

As illustrated in FIG. 5, the stage 20 is provided with a cylindrical case 21 having, on its upper surface, a contact surface 22 that is brought into close contact with the retaining sheet 12, a base body 24 disposed on a side of the case 21 opposite from the contact surface 22, and a driving unit 25 attached to the base body 24 and configured to drive a slider driving mechanism 300 mounted within the case 21. The base body 24 of the stage 20 is attached to a stage securing unit that is not depicted. The contact surface 22 is provided with a suction opening 41, and the suction opening 41 is opened and closed with a cover 23 configured to slide along the contact surface 22. Along a rim of the suction opening 41, side projections 31 and an end surface projection 32 projecting from the contact surface 22 are provided, and four primary holes 33a, 33b, 33c, and 33d and a plurality of subsidiary holes 35 that are communicated with an interior of the case 21 are provided in the contact surface 22 on a side of an outer circumference of the stage 20 from the side projections 31 and the end surface projection 32. The projection height of the side projections 31 and the end surface projection 32 from the contact surface can be on the order of 0.3 mm, for example.

Figure 6:
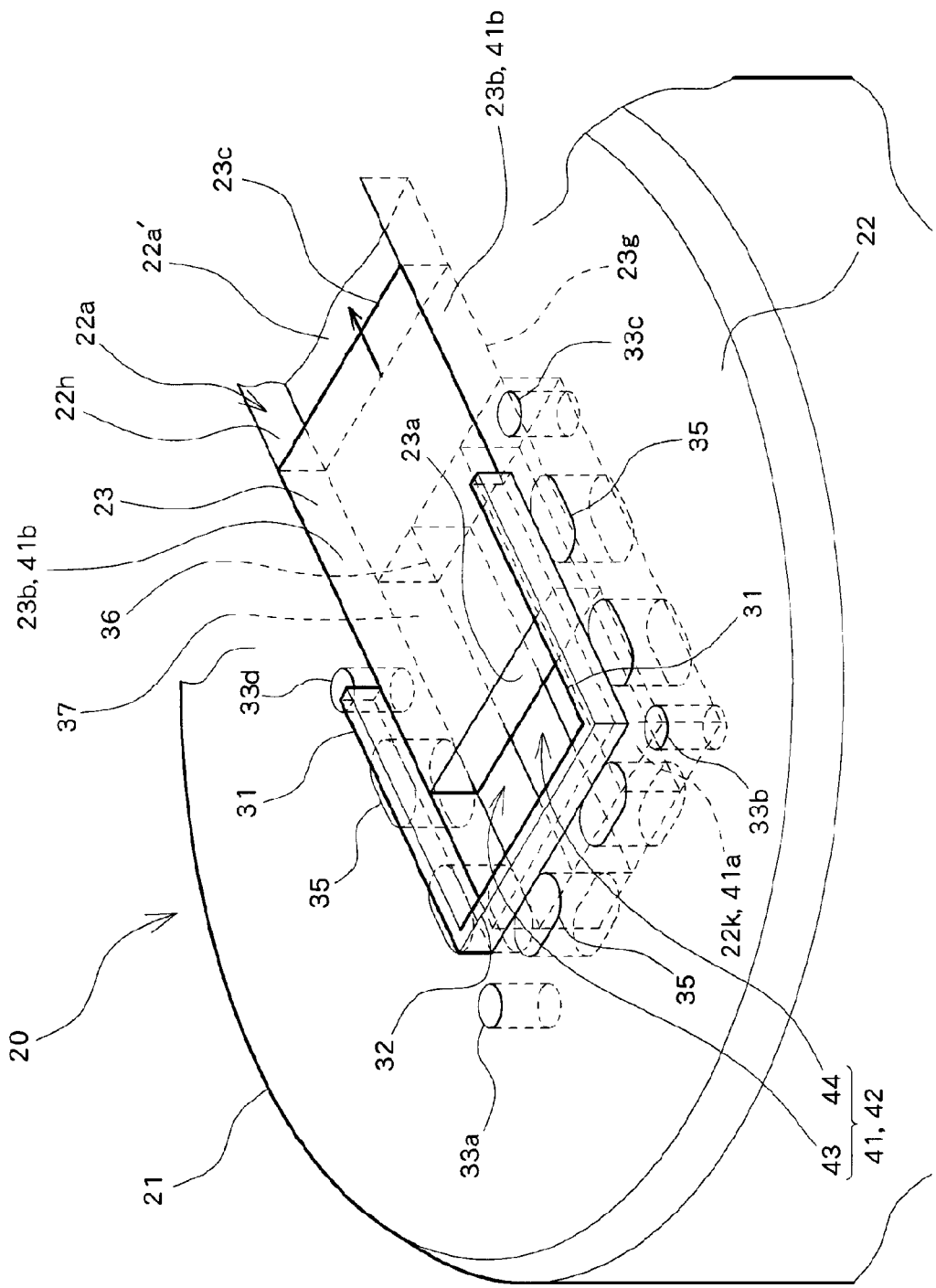
FIG. 6 is a perspective view illustrating an upper surface of the stage of the semiconductor die pick-up apparatus according to the embodiment of the present invention.

As illustrated in FIG. 6, the contact surface 22 is provided with a sliding groove 22a that is recessed by the thickness of the cover 23, whose width is substantially the same as that of the cover 23, and that extends linearly and outwardly from a side of an inner circumference to a side of the outer circumference of the stage. A surface of the cover 23 on a side of a direction of moving closer to and away from an end surface 22k of the sliding groove 22a on the side of the inner circumference of the stage is a tip end 23a of the cover 23, a surface of the cover 23 facing toward a side surface 22h of the sliding groove 22a is a side surface 23b, and an end surface on a side opposite from the tip end 23a is a back end 23c. Further, two communicating holes 37 communicated with the interior of the case 21 are provided in a bottom surface 22a' the sliding groove 22a on the side of the inner circumference of the stage. Each of the side surfaces of the communicating holes 37 is in the same plane with the side surface 22h of the sliding groove 22a, and a surface of each of the communicating holes 37 on a side of the tip end 23a of the cover 23 is in the same plane with the end surface 22k of the sliding groove 22a on the side of the inner circumference of the stage. Further, between the two communicating holes 37, there is provided a connecting rib 36 whose upper surface is in the same plane with the bottom surface 22a' of the sliding groove 22a. For this reason, the upper surface of the connecting rib 36 is recessed from the contact surface 22 by the thickness of the cover 23. When the tip end 23a of the cover 23 is in contact with the end surface 22k of the sliding groove 22a on the side of the inner circumference of the stage, the communicating holes 37 are covered with the cover 23, and an upper surface of the cover 23 is in the same plane with the contact surface 22.

As illustrated in FIG. 6, when the cover 23 slides in a direction indicated by an arrow in FIG. 6, the tip end 23a of the cover 23 moves away from the end surface 22k of the sliding groove 22a on the side of the inner circumference of the stage, and two regions appear: a hole region 43 communicated with the interior of the case 21 from the contact surface 22, and a recessed region 44 that is recessed from the contact surface 22 to the upper surface of the connecting rib 36. The hole region 43 and the recessed region 44 together form an opening section 42 that is recessed from the contact surface 22, and are communicated with the interior of the case 21. Therefore, when a vacuum is produced by the vacuum apparatus 71 within the case 21, the hole region 43 and the recessed region 44 that constitute the opening section 42 are both in a vacuum state. Specifically, the suction opening 41 is a region that is recessed from the contact surface 22 and communicated with the interior of the case 21 so that the opening section 42 is formed by the sliding of the cover 23, the suction opening 41 having a rectangular shape of the width of the sliding groove 22a and the length from the end surface 22k of the sliding groove 22a on the side of the inner circumference of the stage to the tip end 23a of the cover 23 when the cover 23 completely slides. Therefore, the end surface 22k of the sliding groove 22a on the side of the inner circumference of the stage corresponds to an end surface 41a of the suction opening 41, the side surface 22h of the sliding groove 22a corresponds to a side surface 41b of the suction opening 41, and the opening section 42 corresponds to a region where the cover 23 has slid within the suction opening 41. Then, when the tip end 23a of the cover 23 is in contact with the end surface 22k of the sliding groove 22a on the side of the inner circumference of the stage, the suction opening 41 is in a closed state, and when the tip end 23a of the cover 23 is distant from the end surface 22k of the sliding groove 22a on the side of the inner circumference of the stage, the suction opening 41 is in an open state.

As illustrated in FIG. 6, the band-plate shaped side projections 31 that project from the contact surface 22 are provided at the contact surface 22 along a rim of the both side surfaces 41b of the suction opening 41. Further, the band-plate shaped end surface projection 32 of the same height as the side projections 31 is provided at the contact surface 22 along a rim of the end surface 41a of the suction opening 41. The end surface projection 32 is provided along an entire width of the suction opening 41, and the side projections 31 and the end surface projection 32 integrally form a shape of a letter U or a letter C.

Figure 7:
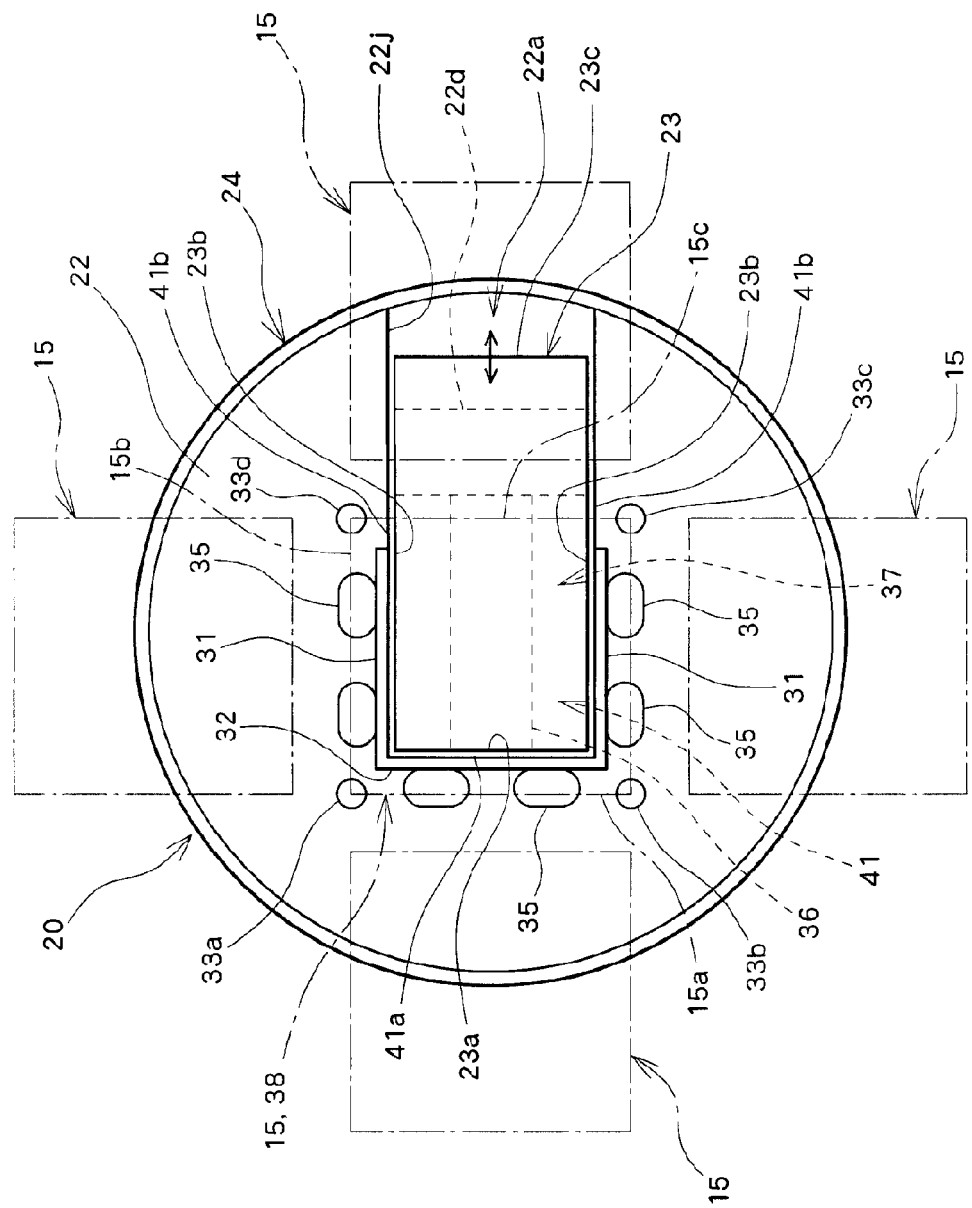
FIG. 7 is a plan view illustrating the upper surface of the stage of the semiconductor die pick-up apparatus according to the embodiment of the present invention.
Figure 8:
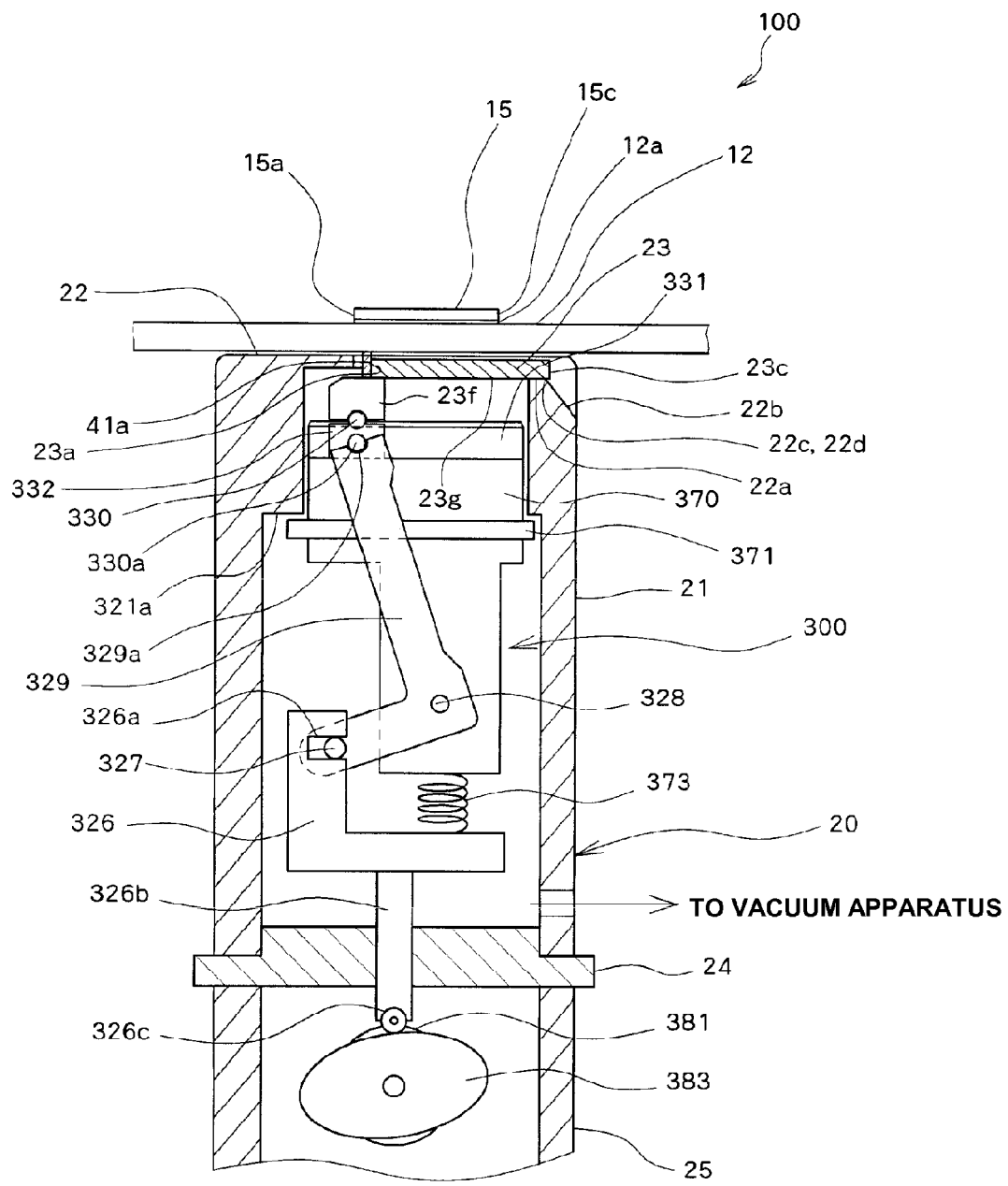
FIG. 8 is an explanatory diagram illustrating a state before a slider driving mechanism of the semiconductor die pick-up apparatus according to the embodiment of the present invention starts its operation.

As illustrated in FIG. 7, the four primary holes 33a-33d are arranged at four corners of a rectangular region 38 that includes the end surface 41a of the suction opening 41 which the tip end 23a of the cover 23 moves closer to and away from and the side projections 31, as well as a square whose two facing sides are parallel with the side projections 31. The rectangular region 38 is in the same shape as the semiconductor die 15 to be picked up, and the width and the length of the rectangular region 38 are substantially the same as those of the semiconductor die to be picked up. Therefore, when positioning the stage 20, it is possible to position the stage 20 such that four corners of the semiconductor die 15 to be picked up correspond respectively to centers of the primary holes 33a-33d. Further, as the width of the suction opening 41 in a direction perpendicular to a sliding direction, and an interval between the suction opening 41 of the side projections 31 and an opposite surface in the direction perpendicular to the sliding direction are smaller than the width of the semiconductor die 15, when positioning the stage 20 such that the four corners of the semiconductor die 15 to be picked up correspond respectively to the centers of the primary holes 33a-33d, a side surface 15b of the semiconductor die 15 sticks out toward a side of the outer circumference of the stage 20 from the side projections 31, or toward a side opposite from the suction opening 41. Moreover, as the end surface projection 32 is included in the rectangular region 38, and the primary holes 33a and 33b are arranged on a side opposite from the suction opening 41 of the end surface projection 32, when positioning the stage 20 such that the four corners of the semiconductor die 15 to be picked up correspond respectively to the centers of the primary holes 33a-33d, a tip end 15a of the semiconductor die 15 sticks out toward a side of the outer circumference of the stage 20 from the end surface projection 32, or toward a side opposite from the suction opening 41.

Further, as illustrated in FIG. 7, the oval subsidiary holes 35 are respectively provided between the primary holes 33b and 33c and between the primary holes 33a and 33d on a side of the outer circumference of the stage of the side projections 31 or on the side opposite from the suction opening 41. The subsidiary holes are provided so as to adjacent to the side of the outer circumference of the stage of the side projections 31. Similarly, the oval subsidiary holes 35 are also provided between the primary holes 33a and 33b on a side of the outer circumference of the stage of the end surface projection 32 or on the side opposite from the suction opening 41. Here, the shape of the rectangular region 38 is not necessarily required to be the same as that of the semiconductor die 15, and can be of a size such that the four corners of the semiconductor die 15 to be picked up respectively fall within regions of the primary holes 33a-33d when positioning the stage 20. Further, the rectangular region 38 can include at least a portion of the side projections 31, and the length of the cover 23 of the side projections 31 along the sliding direction can be long, extending beyond the rectangular region 38. Moreover, the shape of the primary holes 33a-33d can be circular or in a different shape. While it is described that the subsidiary holes 35 are provided so as to adjacent to the side of the outer circumference of the stage of the side projections 31 and the end surface projection 32, the subsidiary holes 35 can be arranged such that the regions of the subsidiary holes 35 respectively overlap with the regions that the side surface 15b and the tip end 15a of the semiconductor die 15 stick out respectively from the side projections 31 and the end surface projection 32 toward the side of the outer circumference of the stage.

As illustrated in FIG. 5, the sliding groove 22a extending toward the side of the outer circumference of the stage 20 is provided with an inclined surface 22b that continues from the bottom surface 22a' of the sliding groove 22a. The bottom surface 22a' of the sliding groove 22a extends substantially parallelly with the contact surface 22, at a position that does not reach a cylindrical surface of the outer circumference of the stage 20, to an end portion 22c at a position on the side of the inner circumference of the stage from a position of the back end 23c of the cover 23 in a state in which the cover 23 closes the suction opening 41. The end portion 22c is linear, and the back end 23c of the cover 23 slightly projects to the side of the outer circumference of the stage 20 from the end portion 22c of the sliding groove 22a in a state in which the cover 23 is closed. The inclined surface 22b is inclined downward from the end portion 22c of the sliding groove 22a to an opposite direction from the contact surface 22. On the both sides of the inclined surface 22b, a side surface 22j that is in the same plane with the side surface 22h of the sliding groove 22a. The side surface 22j and the side surface 23b of the cover 23 constitute a sliding surface. A line of intersection between the inclined surface 22b and the bottom surface 22a' of the sliding groove 22a constitutes a linear ridge line 22d that extends perpendicular to the sliding direction of the cover 23.

As illustrated in FIG. 4, according to the semiconductor die pick-up apparatus 100 of this embodiment, the stage 20 is provided therein with the slider driving mechanism 300 configured to cause a slider 332 to which the cover 23 is rotatably attached to slide. The slider driving mechanism 300 is constituted from: a first link 326 driven by the driving unit 25 attached to the base body 24 of the stage 20 in a direction of approach and retraction with respect to the contact surface 22; a piston 370 slidably attached to the case 21 of the stage 20, and configured to approach and retract with respect to the contact surface 22; a stopper 321a provided within the case 21 and engaged with a flange 371 of the piston 370 so to restrict movement of the piston 370 in the direction of approach and retraction with respect to the contact surface 22; a spring 373 that couples the first link 326 with the piston 370 in the direction of approach and retraction with respect to the contact surface 22; a guide rail 331 attached to the piston 370 and extends along a direction that is substantially parallel with the contact surface 22 and which the suction opening 41 extends; the slider 332 slidably attached to the guide rail 331; and a second link 329 rotatably attached to the piston 370 with a pin 328, couples the slider 332 with the first link 326, and configured to convert, when the piston 370 is brought into contact with the stopper 321a, movement of the first link 326 in the direction of approach and retraction with respect to the contact surface 22 into movement of the slider 332 along the guide rail 331. The slider 332 is attached with a cylindrical pin 330 that extends along a width direction of the suction opening 41, and a substantially U-shaped cutout that is provided in an arm 23f extending from the tip end 23a of the cover 23 to a side closing the suction opening 41 is rotatably engaged with the pin 330. Further, the case 21 is connected to the vacuum apparatus 71 and configured such that a vacuum is produced therein.

The second link 329 couples the slider 332 with the first link 326 in a manner that a pin 327 provided for one end is fitted into an engagement groove 326a of the first link 326, and an engagement groove 329a provided for the other end sandwiches a pin 330a of the slider 332. Within the driving unit 25, a motor 381 for operating the slider driving mechanism 300 is attached, and a cam 383 in contact with a roller 326c provided for a tip end of a shaft 326b of the first link 326 is attached to a rotational axis of the motor 381.

As described above, the slider driving mechanism 300 converts the movement of the first link 326 in the direction of approach and retraction with respect to the contact surface 22 into movement that causes the slider 332 to move in parallel with the contact surface 22 by the L-shaped second link 329. Accordingly, it is possible to realize a mechanism having a compact configuration, which can be contained within the cylindrical case 21.

As illustrated in FIG. 4, the semiconductor die pick-up apparatus 100 is provided with a control unit 70 that is a computer having a CPU and the like therein, and the driving unit 25, the vacuum apparatus 71, the collet 18 and the wafer holder horizontal direction driving unit 72, and the stage vertical direction driving mechanism 73 are connected to the control unit 70. The driving unit 25, the vacuum apparatus 71, the collet 18 and the wafer holder horizontal direction driving unit 72, and the stage vertical direction driving mechanism 73 are each configured to be driven based on a command outputted from the control unit 70. Here, alternate long and short dash lines in FIG. 4 indicate signal lines that connect the control unit 70 with the driving unit 25, the vacuum apparatus 71, the collet 18 and the wafer holder horizontal direction driving unit 72, and the stage vertical direction driving mechanism 73, respectively.

Next, an operation of picking the semiconductor die 15 having the die attachment film 12a on its back surface from the retaining sheet 12 as a stacked body integral with the die attachment film 12a by the semiconductor die pick-up apparatus 100 will be described with reference to the drawings from FIG. 8 to FIGS. 16a, 16b, and 16c. FIG. 9a, FIG. 9b, FIG. 9c, FIGS. 10a, 10b, and 10c, FIG. 12, and FIGS. 14a, 14b, and 14c to FIGS. 16a, 16b, and 16c show states in the pick-up operation, and (a) in each figure is a plan view illustrating the contact surface 22 with a solid line and the semiconductor die 15 disposed thereon with an alternate long and short dash line. Here, the collet 18 is not illustrated in (a) in each figure. In each figure, (b) shows across section of a surface including the communicating holes 37 and the subsidiary holes 35 in the sliding direction of the cover 23 of the stage 20, and not a cross section of a surface including the primary holes 33a-33d, but positions of the primary holes 33a-33d in the sliding direction of the cover 23 are substantially the same as those of the subsidiary holes 35, and therefore indicated by the reference numerals 33a and 33b are shown in parentheses after the reference numeral 35 so that their functions can be described. In each figure, (c) shows a cross section of a surface in the width direction of the cover 23 including the subsidiary holes 35 near the substantial center of the suction opening 41, and not a cross section of a surface including the primary holes 33a-33d. Similarly to (b) in each figure, however, positions of the primary holes 33a-33d in the width direction of the cover 23 are substantially the same as those of the subsidiary holes 35, and therefore indicated by the reference numerals 33a and 33b are shown in parentheses after the reference numeral 35 so that their functions can be described.

As illustrated in FIG. 8 and FIG. 9a, FIG. 9b, and FIG. 9c, the control unit 70 illustrated in FIG. 4 starts an alignment step of the stage 20 and the semiconductor die 15 in a state in which the cover 23 is closed. As the cover 23 is at a position of closing the suction opening 41, the tip end 23a of the cover 23 is at a position in contact with the end surface 41a of the suction opening 41, and a lower surface of the back end 23c of the cover 23 is positioned on a front surface of the connecting rib 36 and a front surface of the sliding groove 22a and supported by the connecting rib 36 and the sliding groove 22a. Further, a front surface of the cover 23 and the contact surface 22 are substantially in the same plane. The control unit 70 moves the wafer holder 10 to a waiting position on the stage 20 in the horizontal direction using the wafer holder horizontal direction driving unit 72 illustrated in FIG. 4. Then, the control unit 70 stops moving the wafer holder 10 in the horizontal direction when the wafer holder 10 reaches a predetermined position above the waiting position of the stage 20, and moves the stage 20 upward using the stage vertical direction driving mechanism 73 until the contact surface 22 of the stage 20 comes into close contact with a lower surface of the retaining sheet 12. When the contact surface 22 of the stage 20 comes into close contact with the lower surface of the retaining sheet 12, the control unit 70 stops moving the stage 20 upward. Then, the control unit 70 again adjusts the position of the stage 20 in the horizontal direction using the wafer holder horizontal direction driving unit 72, such that the four corners of the semiconductor die 15 to be picked up correspond respectively to the centers of the primary holes 33a-33d as illustrated in FIG. 9a. Thereafter, upon completion of the advancement of the stage 20 to the lower surface of the retaining sheet 12 and the alignment between the stage 20 and the semiconductor die 15 to be picked up, the control unit 70 ends the alignment step.

In a state in which the alignment step has been completed, while the retaining sheet 12 on the side of the outer circumference of the stage 20 is in close contact with the contact surface 22 of the stage 20, the retaining sheet 12 is in contact with an upper end surfaces of the side projections 31 and the end surface projection 32 around the side projections 31 and the end surface projection 32, as illustrated in FIG. 9b and FIG. 9c. As the height of the side projections 31 and the end surface projection 32 is on the order of 0.3 mm and very small as compared to the outer diameter of the stage 20, and as a tensile force is acting on the retaining sheet 12 due to the expand ring 16 of the wafer holder 10, the retaining sheet 12 is positioned substantially parallel with the contact surface 22 near the side projections 31 and the end surface projection 32, and distant upward from the contact surface 22 by the height of the side projections 31 and the end surface projection 32, as illustrated in FIG. 9b and FIG. 9c. For this reason, a gap corresponds to the height of the side projections 31 and the end surface projection 32 is provided between the retaining sheet 12 and the contact surface 22. Further, a gap corresponds to the height of the side projections 31 and the end surface projection 32 is also provided between the front surface of the cover 23 in the same plane with the contact surface 22 and the retaining sheet.

Further, as illustrated in FIG. 9a and FIG. 9b, in the state in which the alignment step has been completed, the tip end 15a of the semiconductor die 15 to be picked up sticks out from the end surface projection 32 either to the side of the outer circumference of the stage or to the side opposite from the suction opening 41 of the end surface projection 32. Moreover, as illustrated in FIG. 9a and FIG. 9c, the both side surfaces 15b of the semiconductor die 15 to be picked up also stick out from the respective side projections 31 either to the side of the outer circumference of the stage or to the side opposite from the suction opening 41 of the side projections 31.

Figure 10A:
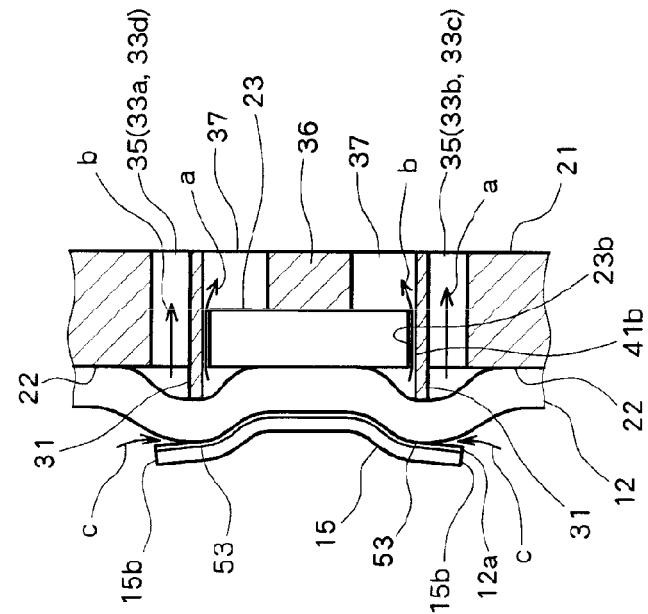
FIGS. 10a, 10b, and 10c are explanatory diagrams illustrating a state in which a vacuum is produced within the stage of the semiconductor die pick-up apparatus according to the embodiment of the present invention.
Figure 10B:
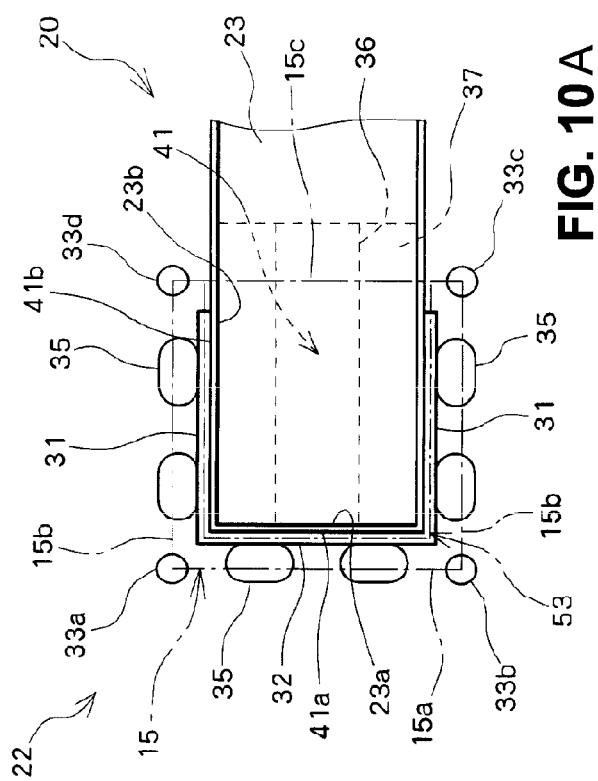
Figure 10C:
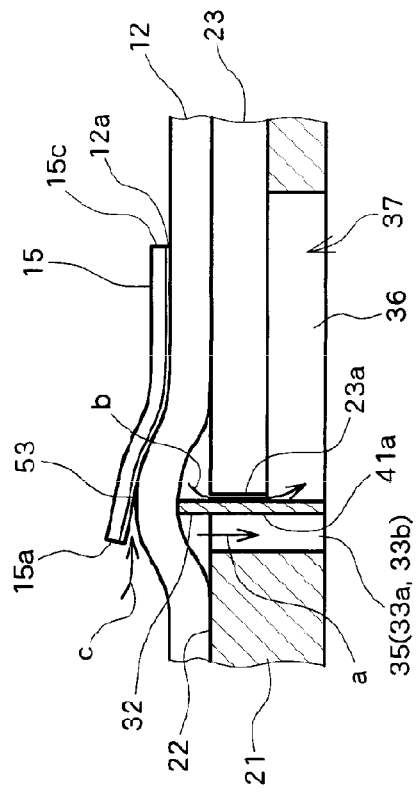

Upon completion of the alignment step, the control unit 70 starts a retaining sheet separation step as illustrated in FIG. 10a, FIG. 10b, and FIG. 10c through FIGS. 16a, 16b, and 16c. The control unit 70 illustrated in FIG. 4 produces a vacuum within the case 21 of the stage 20 using the vacuum apparatus 71 illustrated in FIG. 4. Reducing the pressure within the case 21 to a vacuum produces a vacuum within the four primary holes 33a-33d, the subsidiary holes 35, and the communicating holes 37 that communicate with the interior of the case 21 illustrated in FIG. 10a. Then, as illustrated in FIG. 10b and FIG. 10c, the air within the gap between the contact surface 22 of the end surface projection 32 on the side of the outer circumference of the stage or on the side opposite from the suction opening 41 and the retaining sheet 12 as illustrated in FIG. 9b and the air within the gap between the contact surface 22 of the side projections 31 on the side of the outer circumference of the stage or on the side opposite from the suction opening 41 as illustrated in FIG. 9c and the retaining sheet 12 are suctioned into the case 21 through the primary holes 33a-33d and the subsidiary holes 35 as indicated by an arrow a in FIG. 10b and FIG. 10c. Further, as there are the gaps between the tip end 23a of the cover 23 and the end surface 41a of the suction opening 41 and between the side surface 23b of the cover 23 and the side surface 41b of the suction opening 41, the air between the upper surface of the cover 23 in the region surrounded by the side projections 31 and the end surface projection 32 and the retaining sheet 12 is suctioned into the communicating holes 37 through the gaps as indicated by an arrow b in FIG. 10b and FIG. 10c. Then, as illustrated in FIG. 10b, the retaining sheet 12 on the side of the outer circumference of the stage from the end surface projection 32 or on the side opposite from the suction opening 41 is suctioned to the contact surface 22 through the primary holes 33a and 33b and the subsidiary holes 35, and the retaining sheet 12 on the side of the inner circumference of the stage the end surface projection 32 or on the side of the suction opening 41 or on the side of the cover 23 is suctioned to the upper surface of the cover 23. With this, as illustrated in FIG. 10b, the retaining sheet 12 is deformed into a peaked shape having a peak at an upper end surface of the end surface projection 32 inclined down to right and left in FIG. 10b, toward the side of the outer circumference of the stage and the side of the inner circumference of the stage in the sliding direction of the cover 23. Further, as illustrated in FIG. 10c, the retaining sheet 12 on the side of the outer circumference of the stage from the side projections 31 or on the side opposite from the suction opening 41 is suctioned to the contact surface 22 through the primary holes 33a-33d and the subsidiary holes 35, and the retaining sheet 12 on the side of the inner circumference of the stage of the side projections 31 or on the side of the suction opening 41 or on the side of the cover 23 is suctioned to the upper surface of the cover 23. Then, as illustrated in FIG. 10c, the retaining sheet 12 is deformed into a peaked shape having a peak at an upper end surface of each of the side projections 31 inclined down in the width direction of the cover 23 toward the side of the outer circumference of the stage and to the side of the inner circumference of the stage.

While a stacked body of the die attachment film 12a and the semiconductor die 15 applied to the retaining sheet 12 attempts to deform into the same peaked shape following the retaining sheet 12, curvature of the retaining sheet 12 is large near the end surface projection 32, and even the stacked body of the die attachment film 12a and the semiconductor die 15 having low rigidity cannot follow this curvature. Consequently, as illustrated in FIG. 10b, the die attachment film 12a and the retaining sheet 12 are separated at the tip end 15a of the semiconductor die 15 sticking to the side of the outer circumference of the stage of the end surface projection 32, and the air comes into the gap as indicated by an arrow c in FIG. 10b. As illustrated in FIG. 10b, the die attachment film 12a on the side of the tip end 15a of the semiconductor die 15 is separated from the retaining sheet 12 along with the semiconductor die 15 from the tip end 15a to a position of a separation line 53 above the upper end surface of the end surface projection 32. Similarly, the semiconductor die 15 and the die attachment film 12a applied to the retaining sheet 12 cannot follow large curvature of the retaining sheet 12 near the side projections 31, and as illustrated in FIG. 10c, the die attachment film 12a and the retaining sheet 12 are separated at the side surfaces 15b of the semiconductor die 15 sticking to the side of the outer circumference of the stage of the side projections 31, and the air comes into the gaps as indicated by arrows c in FIG. 10c. As illustrated in FIG. 10c, the die attachment film 12a on the side surfaces 15b of the semiconductor die 15 is separated from the retaining sheet 12 along with the semiconductor die 15 from the both side surfaces 15b to the position of the separation line 53 above the upper end surfaces of the side projections 31. Further, although no projection sticking out from the contact surface 22 is provided on a side of a back end 15c of the semiconductor die 15, the retaining sheet 12 near the corners on the side of the back end 15c of the semiconductor die 15 is separated in the same manner from the die attachment film 12a due to the primary holes 33c and 33d and the side projections 31 that are provided immediately therebelow.

As described above, by producing a vacuum within the case 21, the die attachment film 12a and the retaining sheet 12 are separated at the portions projecting to the side of the outer circumference of the stage from the end surface projection 32 of the tip end 15a and the side projections 31 of the both side surfaces 15b of the semiconductor die 15. At this time, the positions of the semiconductor die 15 and the stage 20 are adjusted such that the centers of the primary holes 33a-33d correspond respectively to the four corners of the semiconductor die 15, and therefore the die attachment film 12a is ensured to be separated from the retaining sheet 12 at the four corners of the semiconductor die 15. In other words, by producing a vacuum within the case 21, the die attachment film 12a and the retaining sheet 12 are separated at the four corners of the semiconductor die 15 and the three sides of the tip end 15a and the both side surfaces 15b, and the separation line 53 provided substantially in a shape of a letter U or a letter C is formed as illustrated in FIG. 10a. Here, while the separation line 53 includes three straight lines in FIG. 10a, this is only schematic illustration of the separation line, and the separation line is often not constituted by straight lines.

Figure 11:
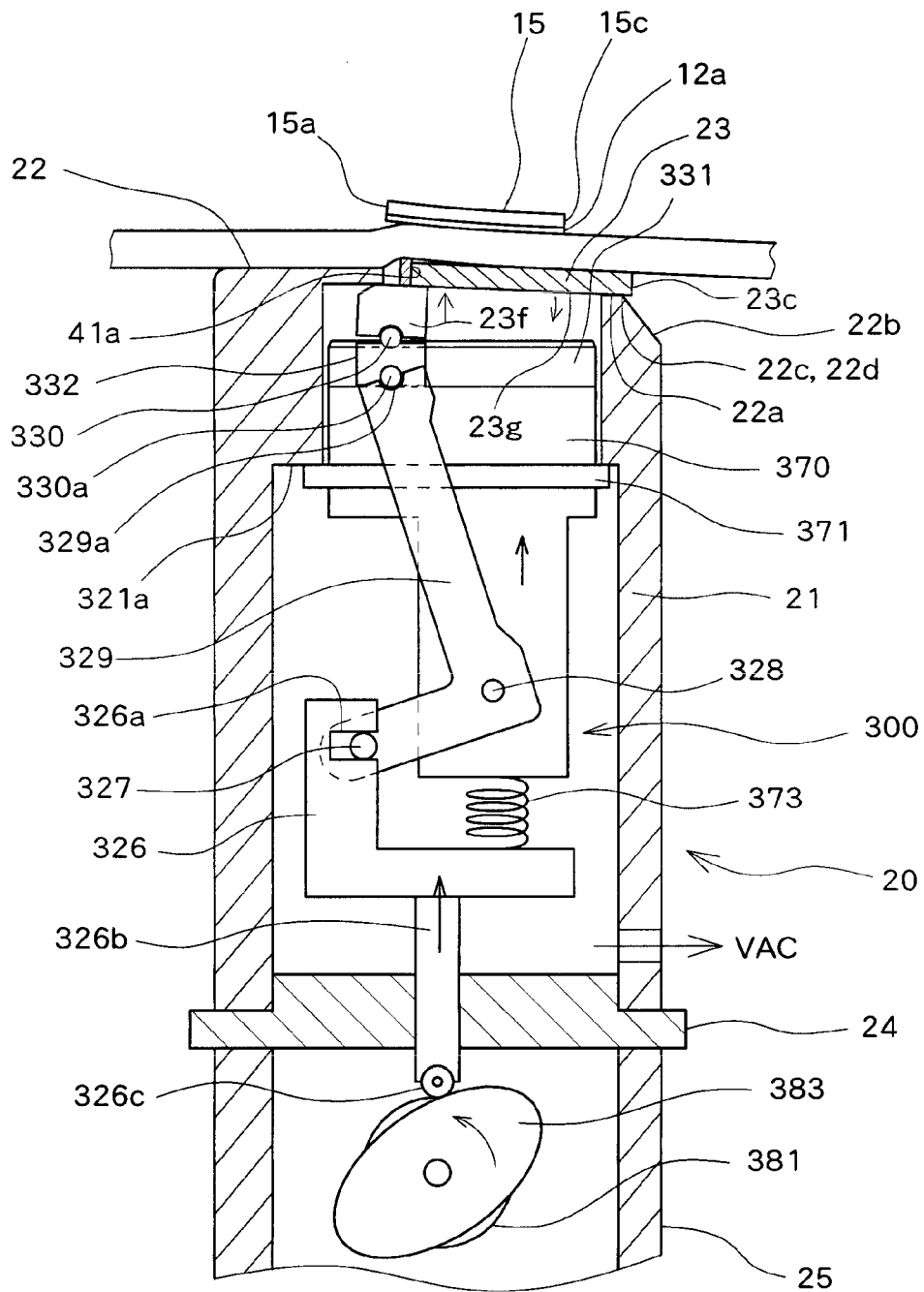
FIG. 11 is an explanatory diagram illustrating a state in which a tip end of a cover of the semiconductor die pick-up apparatus according to the embodiment of the present invention is advanced from a contact surface.

Next, the control unit illustrated in FIG. 4 starts an advancement operation of advancing the upper surface of the cover 23 from the contact surface 22. As illustrated in FIG. 11, when the motor 381 of the driving unit 25 of the slider driving mechanism 300 rotates based on a command from the control unit 70 illustrated in FIG. 4, the cam 383 attached to a shaft of the motor 381 rotates. The cam 383 is in an elliptical shape, and a cam surface is in contact with the roller 326c attached to a tip end of the shaft 326b of the first link 326, and the cam surface of the cam 383 presses the roller 326c up toward the contact surface 22 when the cam rotates in a direction indicated by an arrow in FIG. 11. This movement moves the shaft 326b upward, and therefore the first link 326 as a whole moves up toward the contact surface 22. When the first link 326 as a whole moves upward, the piston 370 connected on the side of the contact surface 22 with the spring 373 is pressed upward with the first link 326, and the piston 370 as a whole moves up toward the contact surface 22. When the piston 370 as a whole moves up toward the contact surface 22, the guide rail 331 attached to the side of the contact surface 22 also moves up toward the contact surface 22 along with the piston 370. When the guide rail 331 moves upward, the slider 332 attached so as to slide along an upper surface of the guide rail 331 also moves up toward the contact surface 22. Then, as the slider 332 moves upward, the tip end 23a of the cover 23 rotatably engaged with the slider 332 via the arm 23f advances upward from the contact surface 22.

Figure 30:
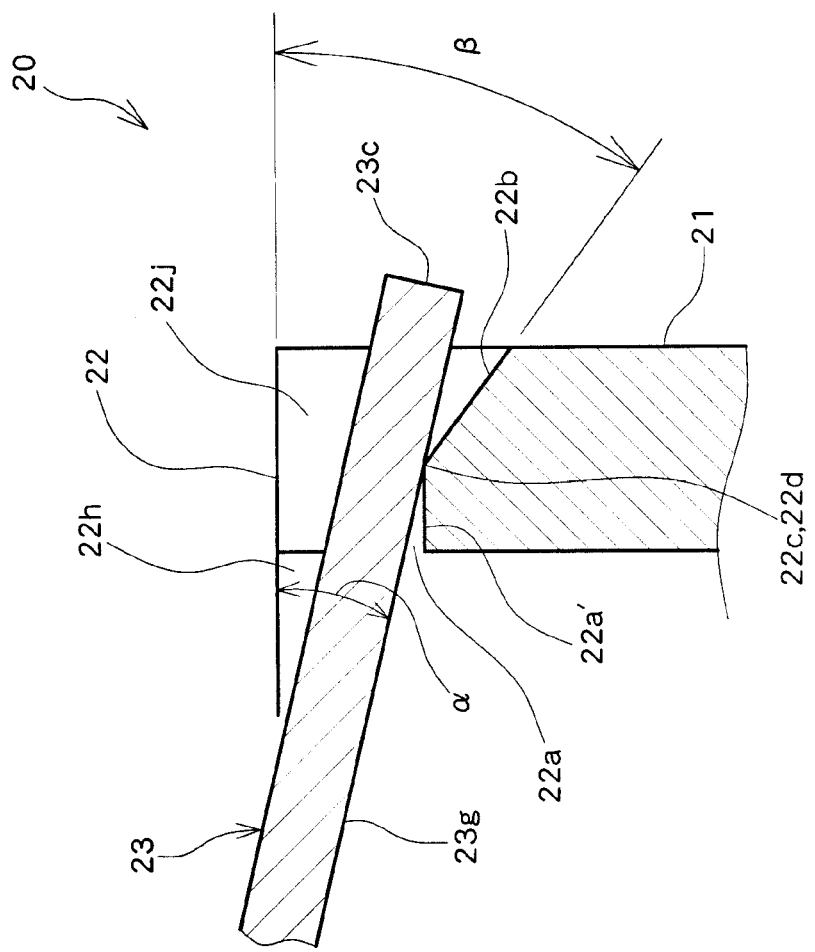
FIG. 30 is a cross-sectional view illustrating the cover and a sliding groove of the semiconductor die pick-up apparatus according to the embodiment of the present invention.

When the tip end 23a of the cover 23 advances upward from the contact surface 22, the tip end 23a of the cover 23 pushes up near the retaining sheet 12 and the tip end 15a and of the semiconductor die 15. Then, the tip end 23a receives a downward force from the retaining sheet 12, and the cover 23 rotates in a clockwise direction centering the pin 330. As illustrated in FIG. 30, upon rotation of the cover 23, a lower surface 23g that is opposite of the surface of the cover 23 that pushes up the retaining sheet 12 is supported by an edge 22d between the sliding groove 22a and the inclined surface 22b, and the cover 23 is inclined downward from the side of the tip end 23a toward the side of the back end 23c when the tip end 23a of the cover 23 moves upward. An inclination angle at this time increases as the cover 23 slides. The inclination angle of the cover 23 when the cover 23 is fully opened is an angle α with respect to the contact surface 22. In contrast, the inclined surface 22b is inclined with respect to the contact surface 22 by an angle β that is greater than the angle α. For this reason, the lower surface 23g of the cover 23 is always in line contact with the edge 22d, and this prevents the air from coming into the case 21. Therefore, it is possible to prevent a degree of vacuum within the case 21 from decreasing during the operation of picking up the semiconductor die 15, and to effectively perform separation of the retaining sheet 12. Further, as illustrated in FIG. 30, as the back end 23c of the cover 23 moves downward farther from the contact surface 22 as the cover 23 slides, the back end 23c of the cover 23 is not brought into contact with the semiconductor die 15 that is adjacent. For this reason, even if there is the semiconductor die 15 that is adjacent on the sliding side of the cover 23, it is possible to smoothly perform the operations of sliding of the cover 23 and picking up of the semiconductor die 15.

Thereafter, when the motor 381 of the slider driving mechanism 300 further rotates based on a command from the control unit 70, and when the first link 326 and the piston 370 further move up toward the contact surface 22 with the cam 383 that rotates along with the motor 381, an end surface of the flange 371 projecting to an outside surface of the piston 370 hits against the stopper 321a provided for the case 21. Then, as the piston 370 is prevented from further advancing toward the contact surface 22 with the stopper 321a, the advancement of the tip end 23a of the cover 23 from the contact surface 22 stops at a predetermined position, and the advancement operation of the cover 23 from the contact surface 22 ends. As the strength of the spring 373 of the slider driving mechanism 300 is such that it hardly flexes by just pushing the tip end 23a of the cover 23 up from the contact surface 22, a distance between the piston 370 and the first link 326 hardly changes even if the tip end 23a of the cover 23 is pushed up to a predetermined advancement height from the contact surface 22. For this reason, the cover 23 only projects from the contact surface 22 by the upward movement of the first link 326, and does not slide during the advancement operation.

As illustrated in FIG. 12b, upon completion of the advancement operation, the tip end 23a of the cover 23 moves up to a position higher than the upper end surface of the end surface projection 32 by a height h. The height h can be on the order of 0.3 mm, similarly to the height of the end surface projection 32 and the side projections 31. With this, the separation line 53 described with reference to FIG. 10a, FIG. 10b, and FIG. 10c moves in the direction that the cover 23 opens from the region of the upper end surface of the end surface projection 32 to the position of the tip end 23a of the cover 23. Further, as illustrated in FIG. 12c, also near the center in the direction that the cover 23 opens, the upper surface of the cover 23 moves up to a position higher than the upper end surface of the end surface projection 32. However, the height of the upper surface of the cover 23 becomes lower than that of the tip end 23a of the cover 23 by an amount of the inclination of the upper surface of the cover 23. As illustrated in FIG. 12a and FIG. 12c, similarly to the tip end 15a, also on the side surface 15b of the semiconductor die 15, the separation line 53 moves to the region of the upper end surface of the side projections 31 to the region of the upper surface of the cover 23 or the region on the side of inner circumference of the stage 20. As described above, by advancing the cover 23 upward from the contact surface 22 as indicated by an arrow d in FIG. 12*c*, the circumferential length of the separation line 53 becomes shorter toward the center of the semiconductor die 15, and the separated region between the die attachment film 12*a* and the retaining sheet 12 increases.

In the above description, the tip end 23*a* of the cover 23 is described as moving up to the position higher than the upper end surface of the end surface projection 32. However, depending on an adherence property and such of the retaining sheet 12, the tip end 23*a* of the cover 23 can move up to the same plane with the upper end surfaces of the end surface projection 32 and the side projections 31. In this case, the height h is zero.

Figure 13:
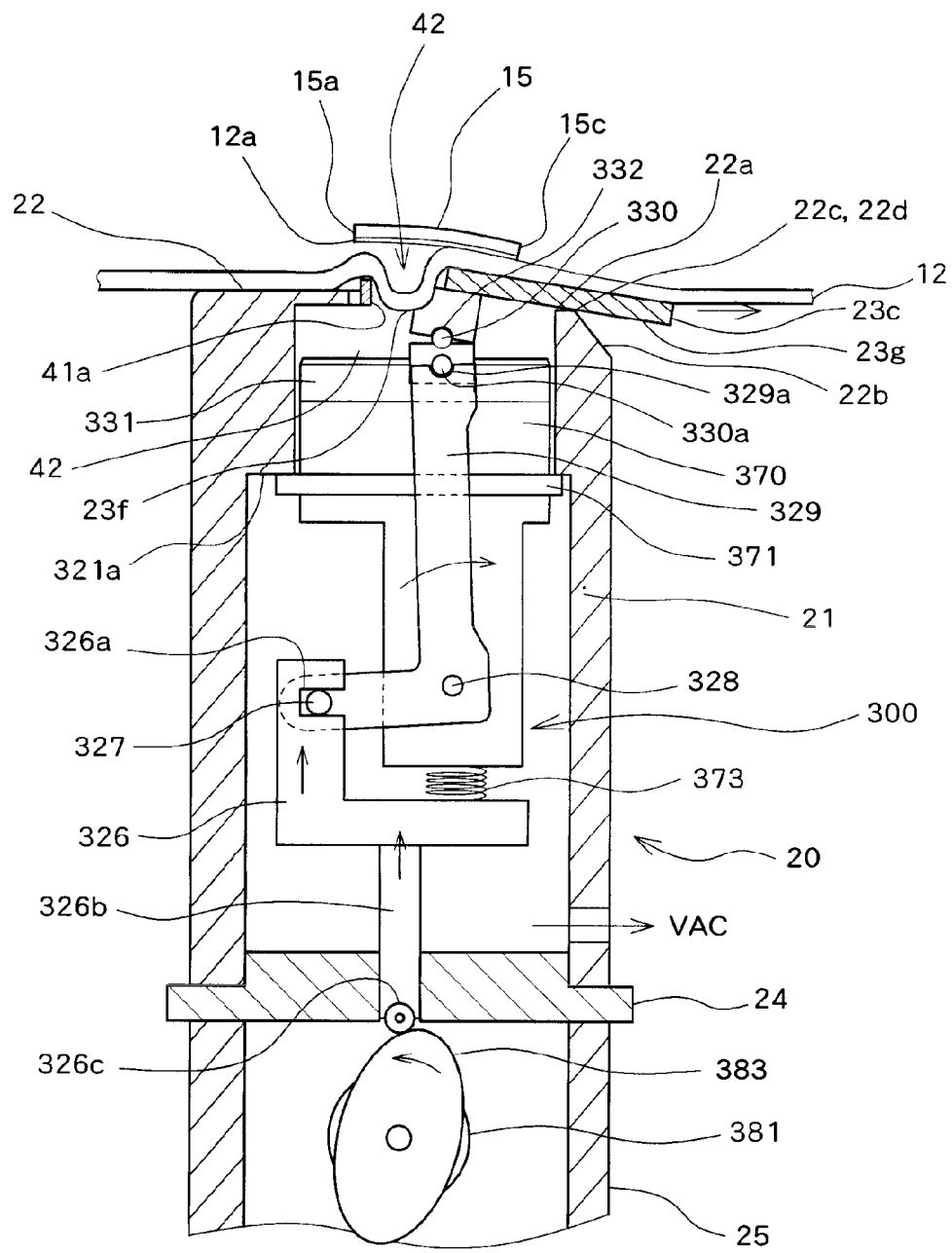
FIG. 13 is an explanatory diagram illustrating a state in which the cover of the semiconductor die pick-up apparatus according to the embodiment of the present invention slides to a first position.

As illustrated in FIG. 13, the control unit 70 illustrated in FIG. 4 starts a first sliding operation for opening the cover 23 to a first position. As illustrated in FIG. 13, when the cam 383 of the slider driving mechanism 300 further rotates based on a command from the control unit 70 and the first link 326 is pushed up toward the contact surface 22, the spring 373 between the piston 370 and the first link 326 that cannot move toward the contact surface 22 starts to be compressed by the motor 381 and the cam 383 in the direction of approach and retraction with respect to the contact surface 22. Upon compression of the spring 373, the piston 370 does not advance toward the contact surface 22, and only the first link 326 advances toward the contact surface 22. For this reason, the pin 328 of the piston 370 does not move up toward the contact surface 22, and only the pin 327 of the second link 329 fitted in the engagement groove 326*a* of the first link 326 moves up toward the contact surface 22. Then, the second link 329 starts to rotate centering the pin 328. By this rotating movement, the engagement groove 329*a* at the other end of the second link 329 moves toward the side of the outer circumference of the stage 20, and the slider 332 to which the pin 330*a* fitted in the engagement groove 329*a* is secured and the cover 23 rotatably engaged with the pin 330 of the slider 332 via the arm 23*f* start sliding toward the side of the outer circumference of the stage 20. When the tip end 23*a* of the cover 23 slides to a first position that is distant from the end surface 41*a* of the suction opening 41 by ⅓ to ½ of the length between the tip end 15*a* and the back end 15*c* of the semiconductor die 15 to be picked up in the sliding direction, the control unit 70 determines that the cover 23 has opened to the first position and stops the rotation of the motor 381 and temporarily stops the sliding of the cover 23.

As illustrated in FIG. 14*a* and FIG. 14*b*, when the cover 23 slides to the first position as indicated by an arrow e, the tip end 23*a* of the cover 23 moves away from the end surface 41*a* of the suction opening 41, the suction opening 41 opens, and the opening section 42 appears. As a vacuum is produced within the case 21 of the stage 20 by the vacuum apparatus 71, the air below the retaining sheet 12 is suctioned through the communicating holes 37 as indicated by an arrow b in FIG. 14*b*, and the opening section 42 suctions the retaining sheet 12 therein. Then, the retaining sheet 12 is pulled into the opening section 42 as the cover 23 slides, and the retaining sheet 12 is separated sequentially from the die attachment film 12*a*. As illustrated in FIG. 14*b*, the retaining sheet 12 pulled into the opening section 42 sticks to a portion near the upper surface of the connecting rib 36. Upon separation of the retaining sheet 12 from the die attachment film 12*a*, the air comes therebetween from outside as indicated by an arrow c in FIG. 14*b*. The semiconductor die 15 forms a stacked body integral with the die attachment film 12*a*, and the semiconductor die 15 and the die attachment film 12*a* are not separated. The separation line 53 on the side of the tip end 15*a* of the semiconductor die 15 moves to the direction in which the cover 23 slides as the cover 23 slides. Then, when the cover 23 reaches the first position, as illustrated in FIG. 14*a* and FIG. 14*b*, the separation line 53 on the side of the tip end 15*a* of the semiconductor die 15 has moved near the tip end 23*a* of the cover 23 at the first position.

As the cover 23 is inclined downward from the tip end 23*a* toward the back end 23*c*, when the cover 23 slides as indicated by an arrow e in FIG. 14*b*, as illustrated in FIG. 14*c*, the position of the upper surface of the cover 23 gradually moves upward, and, along with this, the separation line 53 near the both side surfaces 15*b* of the semiconductor die 15 gradually moves toward the center of the semiconductor die 15.

As described above, when the cover 23 slides to the first position, the retaining sheet 12 is separated from the die attachment film 12*a* by ⅓ to ½ of the length of the semiconductor die 15 from the tip end 15*a* of the semiconductor die 15 to be picked up, the separated region of the side surface 15*b* is slightly larger than that when the advancement operation of the cover 23 has been completed as described with reference to FIG. 12.

As illustrated in FIG. 15*b* and FIG. 15*c*, in a state in which a vacuum is produced in the suction holes 19 of the collet 18 by the vacuum apparatus 71 illustrated in FIG. 4, the control unit 70 illustrated in FIG. 4 moves the collet 18 down above the semiconductor die 15 to be picked up, and causes the collet 18 to suction the semiconductor die 15. As the die attachment film 12*a* and the retaining sheet 12 are separated only by ⅓ or ½ of the entire region, it is not possible for the collet 18 to separate an entire stacked body of the die attachment film 12*a* and the semiconductor die 15 from the retaining sheet 12 at the same time as suctioning the semiconductor die 15 and to pick up the stacked body of the die attachment film 12*a* and the semiconductor die 15. Therefore, when the semiconductor die 15 is suctioned with the collet 18, a portion of the stacked body of the die attachment film 12*a* and the semiconductor die 15 is suctioned with the collet 18, and another portion is in close contact with both of the collet 18 and the retaining sheet 12. Further, as illustrated in FIG. 15*b*, the upper surface of the semiconductor die 15 on the back end 15*c* has a small gap between the collet 18, and therefore not suctioned with the collet 18.

The control unit 70 again rotates the motor 381, and causes the cover 23 to slides to further open from the first position as indicated by an arrow e in FIG. 16*b*. As illustrated in FIG. 16*b* and FIG. 16*c*, as the cover 23 opens, the air below the retaining sheet 12 is suctioned through the communicating holes 37 as indicated by arrows b in FIG. 16*b* and FIG. 16*c*, and the retaining sheet 12 is pulled into the opening section 42 to separate the retaining sheet 12 sequentially from the die attachment film 12*a*. As illustrated in FIG. 16*b* and FIG. 16*c*, the retaining sheet 12 pulled into the opening section 42 sticks to a portion near the upper surface of the connecting rib 36. Then, as the retaining sheet 12 is separated sequentially from the die attachment film 12*a*, the upper surface of the semiconductor die 15 is sequentially suctioned to the collet 18. Thereafter, as illustrated in FIG. 16*b* and FIG. 16*c*, when the cover 23 slides to a full open position, the retaining sheet 12 is fully separated from the die attachment film 12*a*, and the stacked body of the die attachment film 12*a* and the semiconductor die 15 is suctioned only with the collet 18. Then, as illustrated in FIG. 16*a* and FIG. 16*b*, the retaining sheet 12 pulled into the opening section 42 sticks to a portion near the upper surface of the connecting rib 36 and the bottom surface 22*a*' of the sliding groove 22*a*. Further, when the cover 23 is fully opened, the opening section 42 becomes as large as the suction opening 41. When the cover 23 is fully opened, the control unit 70 moves the collet 18 upward to pick up the stacked body of the die attachment film 12a and the semiconductor die 15 as a whole.

As described above, according to the semiconductor die pick-up apparatus 100 of this embodiment, when a vacuum is produced within the case 21 of the stage 20 and the retaining sheet 12 is vacuum-suctioned to the contact surface 22, the retaining sheet 12 is deformed into a peaked shape with a large curvature, having peaks at the upper end surfaces of the side projections 31 and the end surface projection 32 inclined down to the side of the outer circumference of the stage and to the side of the inner circumference of the stage, and therefore even the stacked body of the die attachment film 12a and the semiconductor die 15 having low rigidity cannot follow this curvature. Consequently, the die attachment film 12a of the stacked body of the die attachment film 12a and the semiconductor die 15 is separated from the retaining sheet 12 at the portion sticking to the side of the outer circumference of the stage of the side projections 31 and the end surface projection 32. Then, the suction opening 41 is caused to slide at the same time as the cover 23 is advanced from the contact surface 22, and the die attachment film 12a is separated from the retaining sheet 12 taking the first separated portion as the starting point. Therefore, even the semiconductor die 15 that is largely thinner than that conventionally is, for example, thinner than 15 µm, can be easily separated from the retaining sheet 12. Further, according to this embodiment, it is not necessary to hold the semiconductor die 15 with the collet 18 until the cover 23 is partly opened, and therefore it is possible to perform other operations such as bonding to a different one of the semiconductor dice 15 with the collet 18 during this time, and thus to reduce time for die bonding of the semiconductor dice 15.

Moreover, according to this embodiment, as the inclination angle of the inclined surface 22b provided on the side of the outer circumference of the stage of the sliding groove 22a is the angle ϕ that is greater than the inclination angle α of the cover 23 when the cover 23 is fully opened, the lower surface 23g of the cover 23 is always in line contact with the edge 22d, and the air is prevented from coming into the case 21. Thus, it is possible to effectively perform separation of the retaining sheet 12. Furthermore, according to this embodiment, as the back end 23c of the cover 23 moves downward farther from the contact surface 22 as the cover 23 slides, the back end 23c of the cover 23 is not brought into contact with the semiconductor die 15 that is adjacent. Accordingly, even if there is the semiconductor die 15 that is adjacent on the sliding side of the cover 23, it is possible to smoothly perform the operations of sliding of the cover 23 and picking up of the semiconductor die 15.

Figure 17C:
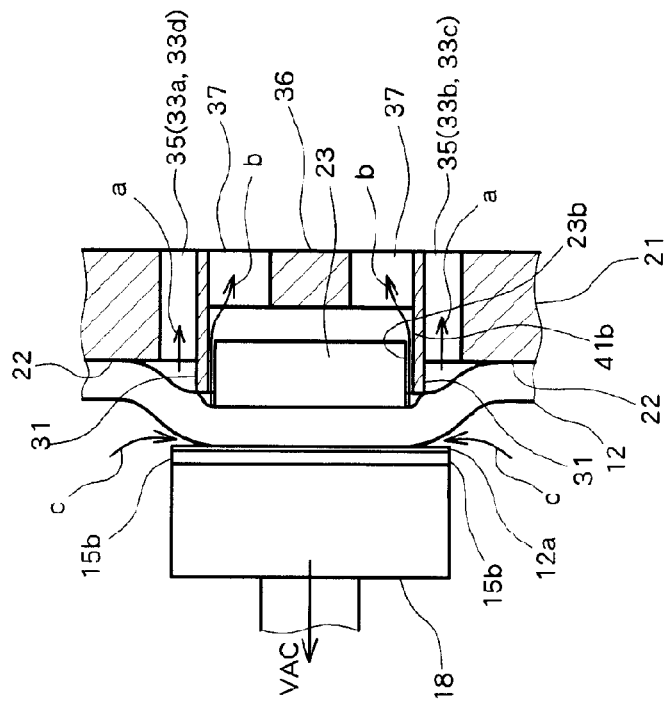
FIGS. 17a, 17b, and 17c are explanatory diagrams illustrating a state in which the collet moves down to the semiconductor die after the cover of the semiconductor die pick-up apparatus according to a different embodiment of the present invention slides to the first position.
Figure 17A:
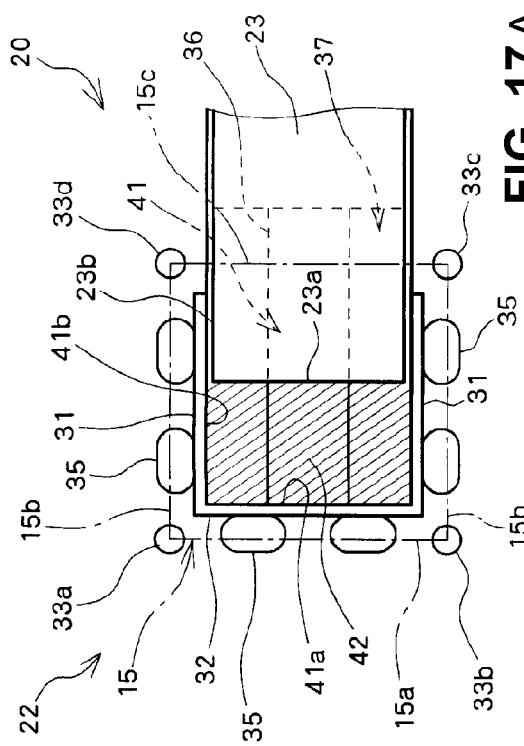
Figure 17B:
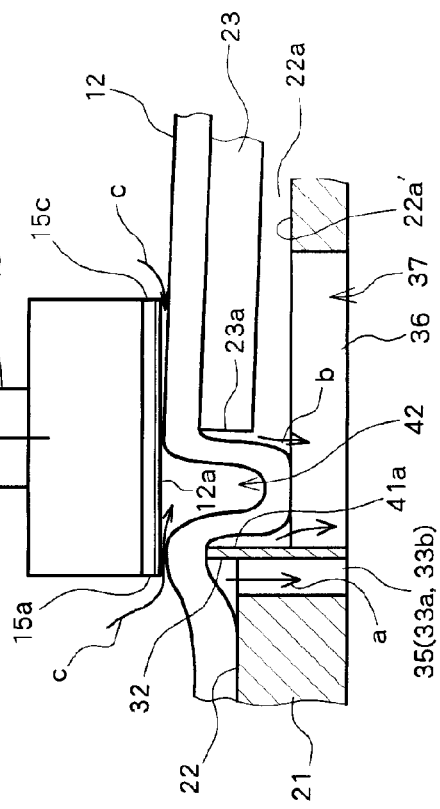

It has been described that even if the collet 18 is moved down to the upper surface of the semiconductor die 15, it is not possible to separate an entire stacked body of the die attachment film 12a and the semiconductor die 15 from the retaining sheet 12 at the same time as suctioning the semiconductor die 15 and to pickup the stacked body of the die attachment film 12a and the semiconductor die 15. However, in a case in which adhesive strength of the retaining sheet 12 is weak, when the collet 18 is moved down to the upper surface of the semiconductor die 15 as illustrated in FIGS. 17a, 17b, and 17c, an entire stacked body of the die attachment film 12a and the semiconductor die 15 can be separated from the retaining sheet 12 and pick up the stacked body at the same time as suctioning the semiconductor die 15. In this case, as the stacked body of the die attachment film 12a and the semiconductor die 15 can be picked up before fully opening the cover 23, it is possible to perform picking up of the semiconductor die 15 for a further reduced time. Further, in the above embodiment, it is described that the stacked body of the die attachment film 12a and the semiconductor die 15 is to be picked up. However, also in a case in which the die attachment film 12a is not provided and the retaining sheet 12 is directly applied to the semiconductor die 15, it is possible to pick up the semiconductor die 15 in the same manner as in this embodiment.

A different embodiment of the present invention will now be described with reference to FIGS. 18a, 18b, and 18c through FIGS. 20a, 20b, and 20c. Like components in the embodiment described with reference to FIG. 1 through FIGS. 16a, 16b, and 16c are denoted by like reference numerals and descriptions of such components shall be omitted. According to this embodiment, after producing a vacuum within the case 21 of the stage 20, the collet 18 with the suction holes 19 being vacuumized is moved down above the semiconductor die 15, and the retaining sheet is sequentially separated while the collet 18 holds the semiconductor die 15.

Figure 18A:
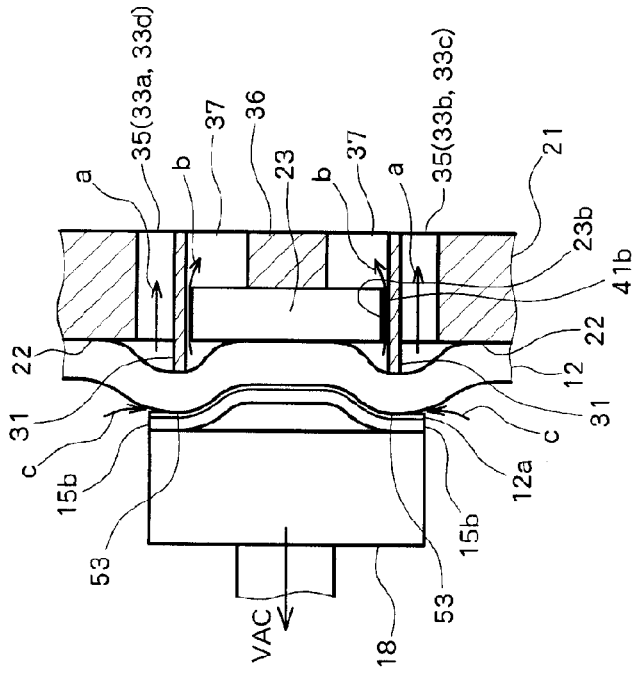
FIGS. 18a, 18b, and 18c are explanatory diagrams illustrating a state in which the collet moves down to the semiconductor die after a stage for the semiconductor die is aligned with the semiconductor die and a vacuum is produced within stage in the semiconductor die pick-up apparatus according to a different embodiment of the present invention.
Figure 18B:
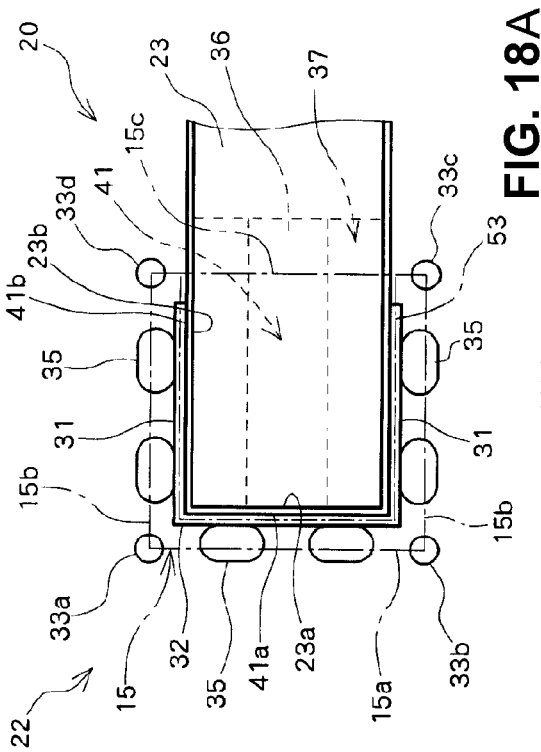
Figure 18C:
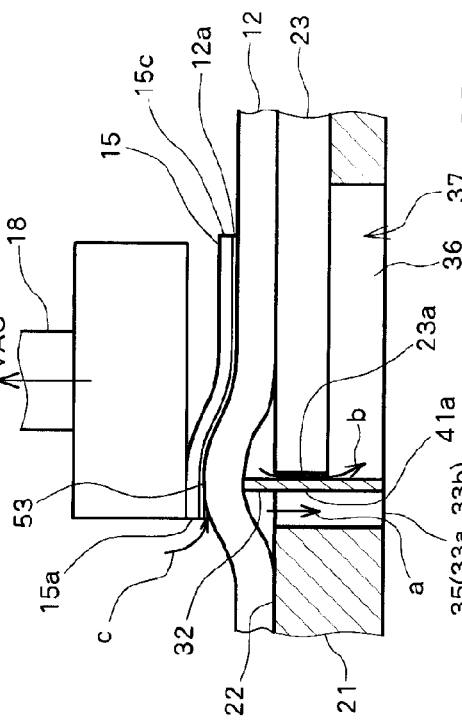

As described with reference to FIGS. 10a, 10b, and 10c, after aligning the stage 20 and the semiconductor die 15, a vacuum is produced within the case 21 of the stage 20, and then separating the retaining sheet 12 at the stacked body of the die attachment film 12a and the semiconductor die 15 sticking to the side of the outer circumference of the stage of the end surface projection 32 and the side projections 31 from the die attachment film 12a, the control unit 70 moves the collet 18 with the suction holes 19 being vacuumized down toward the upper surface of the semiconductor die 15, as illustrated in FIG. 18b and FIG. 18c. The collet 18 is driven in the vertical direction with a voice coil motor that is not depicted, and the control unit 70 determines that the lower surface of the collet 18 is brought into contact with the upper surface of the semiconductor die 15 when a difference between a command signal for a position and an actual position of the collet 18 becomes equal to or greater than a predetermined threshold level, and stops the downward movement of the collet 18 down. In a state in which the downward movement of the collet 18 stops, the side of the tip end 15a of the semiconductor die 15 is sandwiched, along with the retaining sheet 12 and the die attachment film 12a, between the collet 18 and the upper end surface of the end surface projection 32 as illustrated in FIG. 18b, the side of the side surface 15b of the semiconductor die 15 is sandwiched, along with the retaining sheet 12 and the die attachment film 12a, between the collet 18 and the upper end surface of the side projections 31 as illustrated in FIG. 18c, and thus the stacked body of the die attachment film 12a and the semiconductor die 15 is held with the collet 18. There is a gap between the lower surface of the collet 18 and the semiconductor die 15 at the region of the upper surface of the cover 23, and the semiconductor die 15 of this portion is not suctioned to the lower surface of the collet 18.

As illustrated in FIG. 19b, the control unit 70 performs the advancement operation of the cover 23 in this state. Similarly to the embodiment described above, the cover 23 is moved up to the position at which the tip end 23a is higher than the upper end surfaces of the end surface projection 32 and the side projections 31 by the height h. At this time, the collet 18 moves its lower surface up by the height h in synchronization with the upward movement of the tip end 23a of the cover 23 to maintain the holding state of the stacked body of the die attachment film 12a and the semiconductor die 15. When the tip end 23a of the cover 23 moves upward, as illustrated in FIG. 19a, FIG. 19b, and FIG. 19c, the separation line 53 moves slightly toward the center of the semiconductor die 15, and the region of the semiconductor die 15 that is suctioned with the collet 18 slightly increases.

Next, as illustrated in FIG. 20b, the control unit 70 starts the sliding operation of the cover 23. When the cover 23 is slid as illustrated in FIG. 20b, the tip end 23a of the cover 23 moves away from the end surface 41a of the suction opening 41, and the opening section 42 in the vacuum state appears. Then, as the cover 23 slides, the retaining sheet 12 is suctioned into the opening section 42 and sequentially separated from the die attachment film 12a. The air below the retaining sheet 12 is suctioned through the communicating holes 37 as indicated by an arrow b in FIG. 20b, and the retaining sheet 12 is pulled into the opening section 42, and the retaining sheet 12 is sequentially separated from the die attachment film 12a. As illustrated in FIG. 20b, the retaining sheet 12 is pulled into the opening section 42 sticks to a portion near the upper surface of the connecting rib 36. Further, as the retaining sheet 12 is separated, the stacked body of the die attachment film 12a and the semiconductor die 15 as a whole is sequentially suctioned to the collet 18. Then, as illustrated in FIG. 20a, FIG. 20b, and FIG. 20c, the separation line 53 gradually moves in the sliding direction of the cover 23. And thereafter, when the cover 23 is fully opened as the cover 23 slides, the state illustrated in FIG. 16 described in the previous embodiment is realized, and the stacked body of the die attachment film 12a and the semiconductor die 15 as a whole is picked up with the collet 18.

Similarly to the embodiment described with reference to FIG. 1 through FIGS. 16a, 16b, and 16c, the embodiment described above provides an effect that even the semiconductor die 15 that is largely thinner than that conventionally is, for example, thinner than 15 μm, can be easily separated from the retaining sheet 12. Further, according to this embodiment, as it is not necessary to temporarily stop the sliding operation while the cover 23 is sliding in order to move the collet 18 down as in the embodiment previously described, the sliding operation can be simplified.

Figure 21:
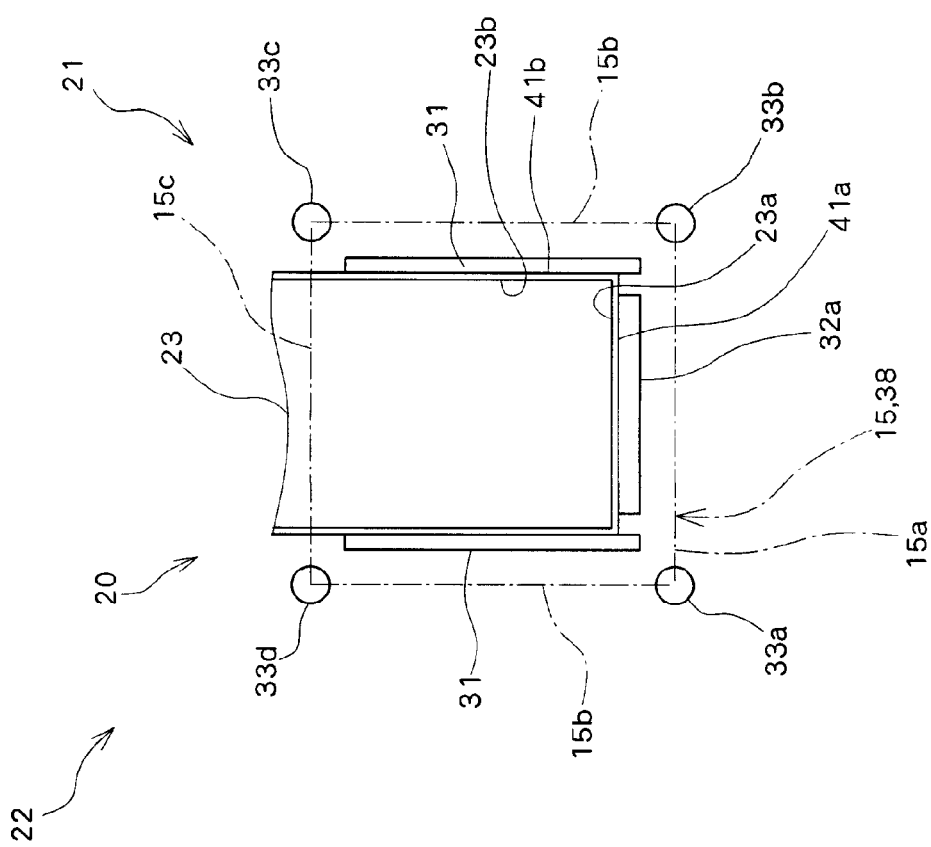
FIG. 21 is a plan view illustrating an arrangement of projections on the upper surface of the stage of the semiconductor die pick-up apparatus according to a different embodiment of the present invention.
Figure 22:
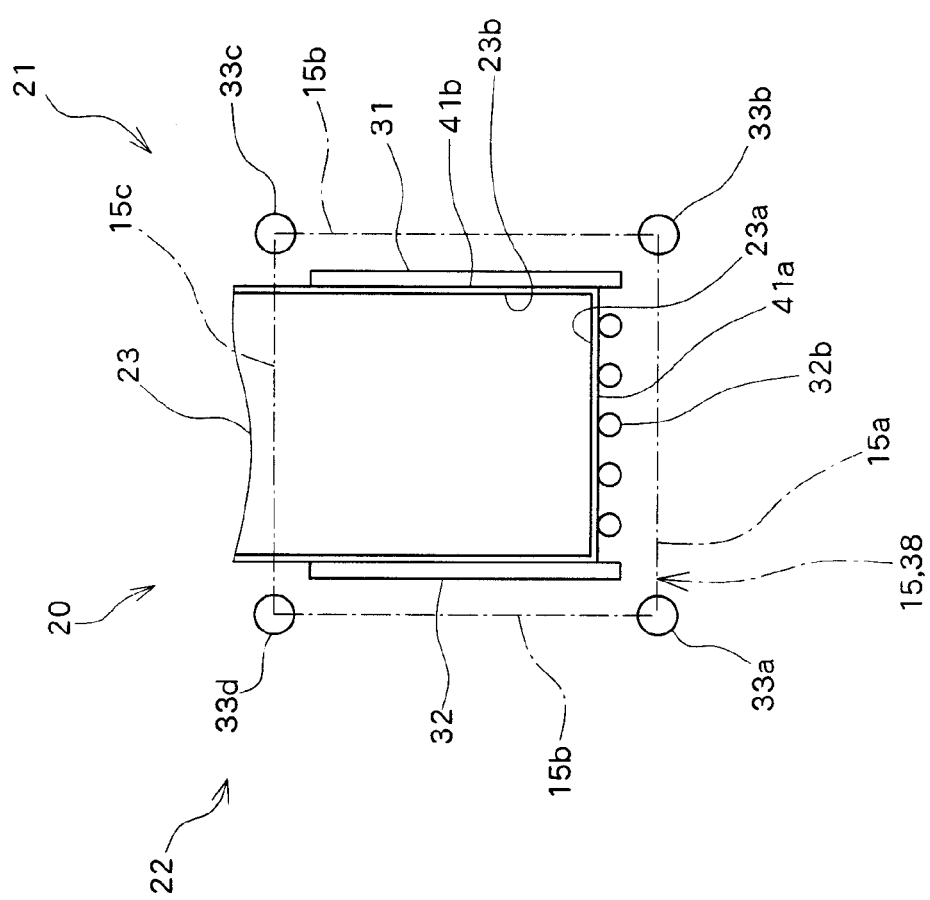
FIG. 22 is a plan view illustrating an arrangement of projections on the upper surface of the stage of the semiconductor die pick-up apparatus according to the different embodiment of the present invention.

A different embodiment of the present invention will now be described with reference to FIG. 21 and FIG. 22. FIG. 21 and FIG. 22 illustrate a different arrangement and configuration of the end surface projection 32. The embodiment described with reference to FIG. 1 through FIGS. 16a, 16b, and 16c describes that the end surface projection 32 and the side projections 31 integrally form a U shaped as a whole. However, as illustrated in FIG. 21, an end surface projection 32a can be constituted by a band plate independent of the side projections 31, and a cap can be provided between the side projections 31 and the end surface projection 32. Further, as illustrated in FIG. 22, a plurality of cylindrical stick-like projections 32b can be arranged in a line along the end surface 41a of the suction opening 41 to provide an end surface projection. Similarly, the side projection can also be provided by aligning cylindrical projections. Moreover, the embodiment described with reference to FIG. 1 through FIGS. 16a, 16b, and 16c describes that the subsidiary holes 35 are arranged in addition to the primary holes 33a-33d. However, as illustrated in FIG. 21 and FIG. 22, it is possible to eliminate the subsidiary holes 35 and arrange only the primary holes 33a-33d.

Figure 23:
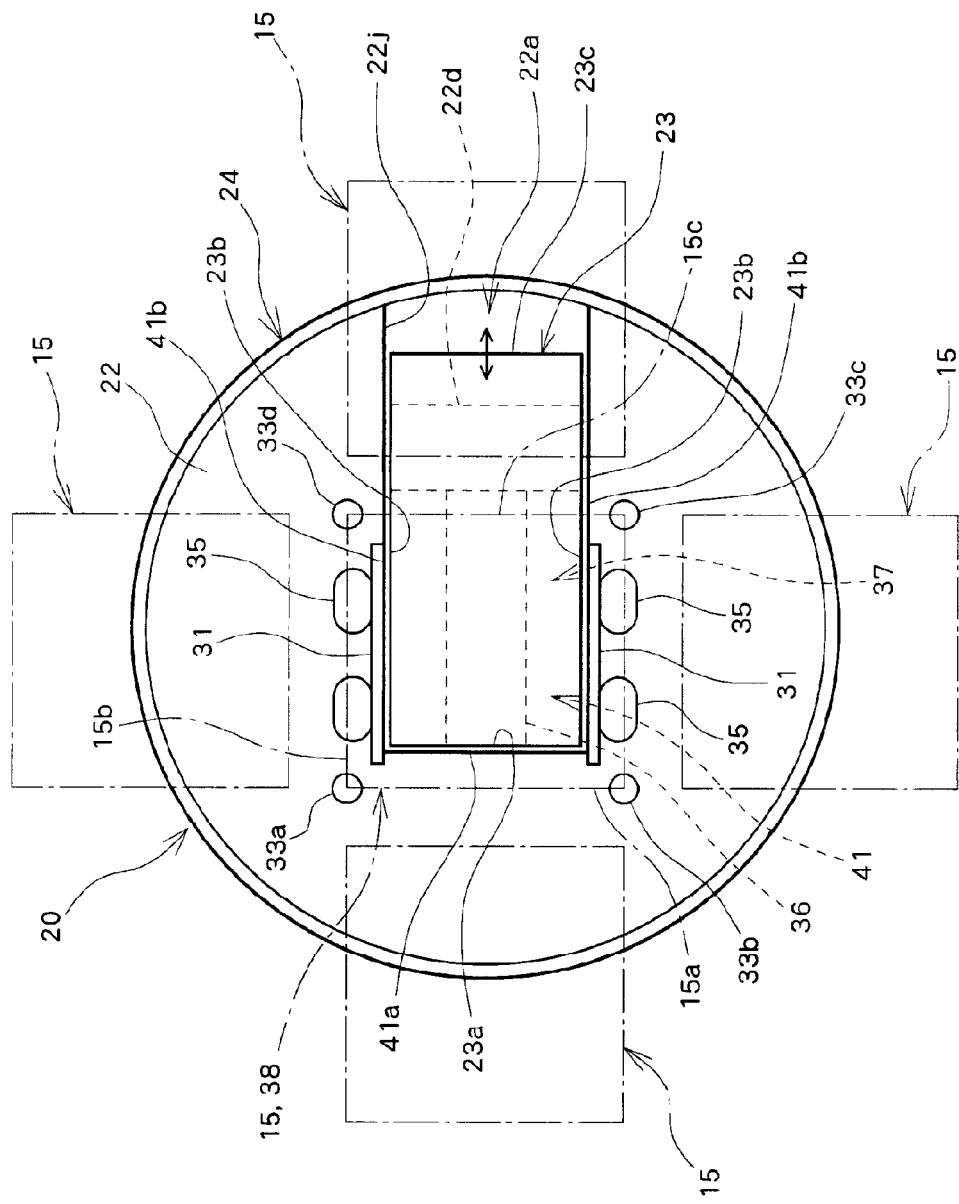
FIG. 23 is a plan view illustrating the upper surface of the stage of the semiconductor die pick-up apparatus according to a different embodiment of the present invention.

A different embodiment of the present invention will now be described with reference to FIG. 23 through FIG. 29. Like components in the embodiment described with reference to FIG. 1 through FIGS. 16a-16c are denoted by like reference numerals and descriptions of such components shall be omitted. As illustrated in FIG. 23, this embodiment is configured such that only the side projections 31 are provided, and the end surface projection 32 in the embodiment described with reference to FIG. 1 through FIGS. 16a-16c are omitted and the subsidiary holes 35 provided adjacent to the end surface projection 32 are eliminated. Other than this, this embodiment is the same as the embodiment described with reference to FIG. 1 through FIGS. 16a-16c.

Similarly to the embodiment previously described, the control unit 70 illustrated in FIG. 4 performs the alignment step between the stage 20 and the semiconductor die 15 in the state in which the cover 23 is closed. As illustrated in FIG. 24b FIG. 24b and FIG. 24c, in the state in which the alignment step has been completed, the retaining sheet 12 is in contact with the upper end surface of the side projections 31 around the side projections 31. As the height of the side projections 31 is on the order of 0.3 mm and very small as compared to the outer diameter of the stage 20, and as a tensile force is acting on the retaining sheet 12 due to the expand ring 16 of the wafer holder 10, the retaining sheet 12 is positioned substantially parallel with the contact surface 22 near the side projections 31, and distant upward from the contact surface 22 by the height of the side projections 31, as illustrated in FIG. 24b FIG. 24b and FIG. 24c. For this reason, a gap corresponds to the height of the side projections 31 is provided between the retaining sheet 12 and the contact surface 22. Further, a gap corresponds to the height of the side projections 31 is also provided between the front surface of the cover 23 in the same plane with the contact surface 22 and the retaining sheet.

Further, as illustrated in FIG. 24a and FIG. 24b FIG. 24b, in the state in which the alignment step has been completed, the tip end 15a of the semiconductor die 15 to be picked up sticks out from the end surface 41a of the suction opening 41 either to the side of the outer circumference of the stage or to the side opposite from the suction opening 41. Moreover, as illustrated in FIG. 24a and FIG. 24(c the both side surfaces 15b of the semiconductor die 15 to be picked up also stick out from the respective side projections 31 either to the side of the outer circumference of the stage or to the side opposite from the suction opening 41 of the side projections 31.

Upon completion of the alignment step, the control unit 70 starts the retaining sheet separation step as illustrated in FIG. 25 through FIG. 29. The control unit 70 illustrated in FIG. 4 produces a vacuum within the case 21 of the stage 20 using the vacuum apparatus 71 illustrated in FIG. 4. Reducing the pressure within the case 21 to a vacuum produces a vacuum within the four primary holes 33a-33d, the subsidiary holes 35, and the communicating holes 37 that communicate with the interior of the case 21 illustrated in FIG. 25a. Then, as illustrated in FIG. 25c, and the air within the gap between the contact surface 22 of the side projections 31 on the side of the outer circumference of the stage or on the side opposite from the suction opening 41 as illustrated in FIG. 24c and the retaining sheet 12 are suctioned into the case 21 through the primary holes 33a-33d and the subsidiary holes 35 as indicated by an arrow a in FIG. 25c. Further, as there are the gaps between the tip end 23a of the cover 23 and the end surface 41a of the suction opening 41 and between the side surface 23b of the cover 23 and the side surface 41b of the suction opening 41, the air between the upper surface of the cover 23 and the retaining sheet 12 is suctioned into the communicating holes 37 through the gaps as indicated by an arrow b in FIG. 25c. Then, as illustrated in FIG. 25c, the retaining sheet 12 on the side of the outer circumference of the stage from the side projections 31 or on the side opposite from the suction opening 41 is suctioned to the contact surface 22 through the primary holes 33a-33d and the subsidiary holes 35, and the retaining sheet 12 on the side of the inner circumference of the stage of the side projections 31 or on the side of the suction opening 41 or on the side of the cover 23 is suctioned to the upper surface of the cover 23. Then, as illustrated in FIG. 25c, the retaining sheet 12 is deformed into a peaked shape having a peak at an upper end surface of each of the side projections 31 inclined down in the width direction of the cover 23 toward the side of the outer circumference of the stage and to the side of the inner circumference of the stage. At this time, in the center of the cover 23, the retaining sheet 12 is suctioned in a planar manner to the contact surface 22 in the same plane with the upper surface of the cover 23 and the upper surface of the cover 23 as illustrated in FIG. 25b.

While the stacked body of the die attachment film 12a and the semiconductor die 15 applied to the retaining sheet 12 attempts to deform into the same peaked shape following the retaining sheet 12, curvature of the retaining sheet 12 is large near the side projections 31, and even the stacked body of the die attachment film 12a and the semiconductor die 15 having low rigidity cannot follow this curvature. Consequently, as illustrated in FIG. 25c, the die attachment film 12a and the retaining sheet 12 are separated at the both side surfaces 15b of the semiconductor die 15 sticking to the side of the outer circumference of the stage of the side projections 31, and the air comes into the gaps as indicated by arrows c in FIG. 25c. As illustrated in FIG. 25c, the die attachment film 12a on the side surfaces 15b of the semiconductor die 15 is separated from the retaining sheet 12 along with the semiconductor die 15 from the both side surfaces 15b to the position of the separation line 53 above the upper end surfaces of the side projections 31. While this embodiment does not include the end surface projection 32 like the embodiment previously described, the retaining sheet 12 near the corners on the side of the tip end 15a of the semiconductor die 15 is separated in the same manner from the die attachment film 12a due to the primary holes 33a and 33b and the side projections 31 that are provided immediately therebelow. Further, although no projection sticking out from the contact surface 22 is provided on a side of a back end 15c of the semiconductor die 15, the retaining sheet 12 near the corners on the side of the back end 15c of the semiconductor die 15 is separated in the same manner from the die attachment film 12a due to the primary holes 33c and 33d and the side projections 31 that are provided immediately therebelow.

As described above, by producing a vacuum within the case 21, the die attachment film 12a and the retaining sheet 12 are separated at the portions projecting to the side of the outer circumference of the stage from the side projections 31 of the both side surfaces 15b of the semiconductor die 15. At this time, the positions of the semiconductor die 15 and the stage 20 are adjusted such that the centers of the primary holes 33a-33d correspond respectively to the four corners of the semiconductor die 15, and therefore the die attachment film 12a is ensured to be separated from the retaining sheet 12 at the four corners of the semiconductor die 15. In other words, by producing a vacuum within the case 21, the die attachment film 12a and the retaining sheet 12 are separated at the four corners of the semiconductor die 15 and the both side surfaces 15b, and the separation line 53 is formed. Here, while the separation line 53 includes two straight lines in FIG. 25a, this is only schematic illustration of the separation line, and the separation line is often not constituted by straight lines.

Similarly to the embodiment previously described, the control unit 70 performs the advancement operation of the cover 23. As illustrated in FIG. 26b, upon completion of the advancement operation, the tip end 23a of the cover 23 moves up to a position higher than the upper end surface of the side projections 31 by the height h. The height h can be on the order of 0.3 mm, similarly to the height of the side projections 31. As the tip end 23a of the cover 23 moves upward from the contact surface 22, the cover 23 causes the retaining sheet 12 to be lifted to a predetermined height. As illustrated in FIG. 26b, as the retaining sheet 12 at the contact surface 22 adjacent to the tip end 23a of the cover 23 is in close contact with the contact surface 22, the retaining sheet 12 is pulled downward when the tip end 23a of the cover 23 moves upward, and separated from the die attachment film 12a. The air comes into between the die attachment film 12a and the retaining sheet 12 that are separated as indicated by arrow b in FIG. 26b. Then, when the tip end 23a of the cover 23 advances to a predetermined height, the separation line 53 is formed near the tip end 23a of the cover 23. Further, as illustrated in FIG. 26c, also near the center in the direction that the cover 23 opens, the upper surface of the cover 23 moves up to a position higher than the upper end surface of the end surface projection 32. However, the height of the upper surface of the cover 23 becomes lower than that of the tip end 23a of the cover 23 by an amount of the inclination of the upper surface of the cover 23. As illustrated in FIG. 26c, on the side surface 15b of the semiconductor die 15, the separation line 53 moves to the region of the upper end surface of the side projections 31 to the region of the upper surface of the cover 23 or the region on the side of inner circumference of the stage 20. As described above, by advancing the cover 23 upward from the contact surface 22 as indicated by an arrow d in FIG. 26b, the separation line 53 moves toward the center of the semiconductor die 15, and the separated region between the die attachment film 12a and the retaining sheet 12 increases.

In the above description, the tip end 23a of the cover 23 is described as moving up to the position higher than the upper end surface of the end surface projection 32. However, depending on an adherence property and such of the retaining sheet 12, the tip end 23a of the cover 23 can move up to the same plane with the upper end surfaces of the end surface projection 32 and the side projections 31. In this case, the height h is zero.

As illustrated in FIGS. 27a, 27b, and 27c, the control unit 70 performs the first sliding operation for opening the cover 23 to the first position. As illustrated in FIG. 27a and FIG. 27b, when the cover 23 slides to the first position as indicated by an arrow e, the tip end 23a of the cover 23 moves away from the end surface 41a of the suction opening 41, the suction opening 41 opens, and the opening 42 appears. As a vacuum is produced within the case 21 of the stage 20 by the vacuum apparatus 71, the air below the retaining sheet 12 is suctioned through the communicating holes 37 as indicated by an arrow b in FIG. 27b, and the opening section 42 suctions the retaining sheet 12 therein. Then, the retaining sheet 12 is pulled into the opening section 42 as the cover 23 slides, and the retaining sheet 12 is separated sequentially from the die attachment film 12a. As illustrated in FIG. 27b, the retaining sheet 12 pulled into the opening section 42 sticks to a portion near the upper surface of the connecting rib 36. Upon separation of the retaining sheet 12 from the die attachment film 12a, the air comes therebetween from outside as indicated by an arrow c in FIG. 27b. The semiconductor die 15 forms a stacked body integral with the die attachment film 12a, and the semiconductor die 15 and the die attachment film 12a are not separated. The separation line 53 on the side of the tip end 15a of the semiconductor die 15 moves to the direction in which the cover 23 slides as the cover 23 slides. Then, when the cover 23 reaches the first position, as illustrated in FIG. 27a and FIG. 27b, the separation line 53 on the side of the tip end 15a of the semiconductor die 15 has moved near the tip end 23a of the cover 23 at the first position.

While this embodiment does not include the end surface projection 32 like the embodiment previously described, as described above, the retaining sheet 12 near the corners on the side of the tip end 15a of the semiconductor die 15 is separated from the die attachment film 12a when a vacuum is produced within the case 21 of the stage 20. Accordingly, even if the separated region of the die attachment film 12a near the tip end 15a of the semiconductor die 15 when the tip end 23a of the cover 23 is moved upward is small, the retaining sheet 12 is separated taking the corners of the tip end 15a of the semiconductor die 15 as the starting point of separation along an entire length of the tip end 15a as the cover 23 slides, and the separation line 53 moves as the cover 23 slides.

Further, as the cover 23 is inclined downward from the tip end 23a toward the back end 23c, when the cover 23 slides as indicated by an arrow e in FIG. 27b, as illustrated in FIG. 27c, the position of the upper surface of the cover 23 gradually moves upward, and, along with this, the separation line 53 near the both side surfaces 15b of the semiconductor die 15 gradually moves toward the center of the semiconductor die 15.

As described above, when the cover 23 slides to the first position, the retaining sheet 12 is separated from the die attachment film 12a by ⅓ to ½ of the length of the semiconductor die 15 from the tip end 15a of the semiconductor die 15 to be picked up, the separated region of the side surface 15b is slightly larger than that when the advancement operation of the cover 23 has been completed as described with reference to FIGS. 26a, 26b, and 26c.

Similarly to the embodiment previously described, as illustrated in FIGS. 28a, 28b, and 28c, in the state in which a vacuum is produced in the suction holes 19 of the collet 18 by the vacuum apparatus 71 illustrated in FIG. 4, the control unit 70 moves the collet 18 down above the semiconductor die 15 to be picked up, and causes the collet 18 to suction the semiconductor die 15.

Then, similarly to the embodiment previously described, the control unit 70 causes the cover 23 to slides to further open from the first position as illustrated in FIGS. 29a, 29b, and 29c. As illustrated in FIG. 29b and FIG. 29c, as the cover 23 opens, the air below the retaining sheet 12 is suctioned through the communicating holes 37 as indicated by arrows b in FIG. 29b and FIG. 29c, and the retaining sheet 12 is pulled into the opening section 42 to separate the retaining sheet 12 sequentially from the die attachment film 12a. As illustrated in FIG. 29b and FIG. 29c, the retaining sheet 12 pulled into the opening section 42 sticks to a portion near the upper surface of the connecting rib 36. Then, as the retaining sheet 12 is separated sequentially from the die attachment film 12a, the upper surface of the semiconductor die 15 is sequentially suctioned to the collet 18. Thereafter, as illustrated in FIG. 29b and FIG. 29c, when the cover 23 slides to a full open position, the retaining sheet 12 is fully separated from the die attachment film 12a, and the stacked body of the die attachment film 12a and the semiconductor die 15 is suctioned only by the collet 18. Then, as illustrated in FIG. 29a and FIG. 29b, the retaining sheet 12 pulled into the opening section 42 sticks to a portion near the upper surface of the connecting rib 36 and the bottom surface 22a' of the sliding groove 22a. Further, when the cover 23 is fully opened, the opening section 42 becomes as large as the suction opening 41. When the cover 23 is fully opened, the control unit 70 moves the collet 18 upward to pick up the stacked body of the die attachment film 12a and the semiconductor die 15 as a whole.

The embodiment described above provides, in addition to the effects of the embodiment described with reference to FIG. 1 through FIG. 16, an effect that the structure of the stage 20 can be simplified as it is not necessary to provide the subsidiary holes 35 that are adjacent to the end surface projection 32 and the end surface projection 32. Further, also in this embodiment, similarly to the case described with reference to FIGS. 17a, 17b, and 17c, it is possible to pick up the stacked body of the die attachment film 12a and the semiconductor die 15 at the same time as the collet 18 is moved down above the semiconductor die 15.

Figure 31:
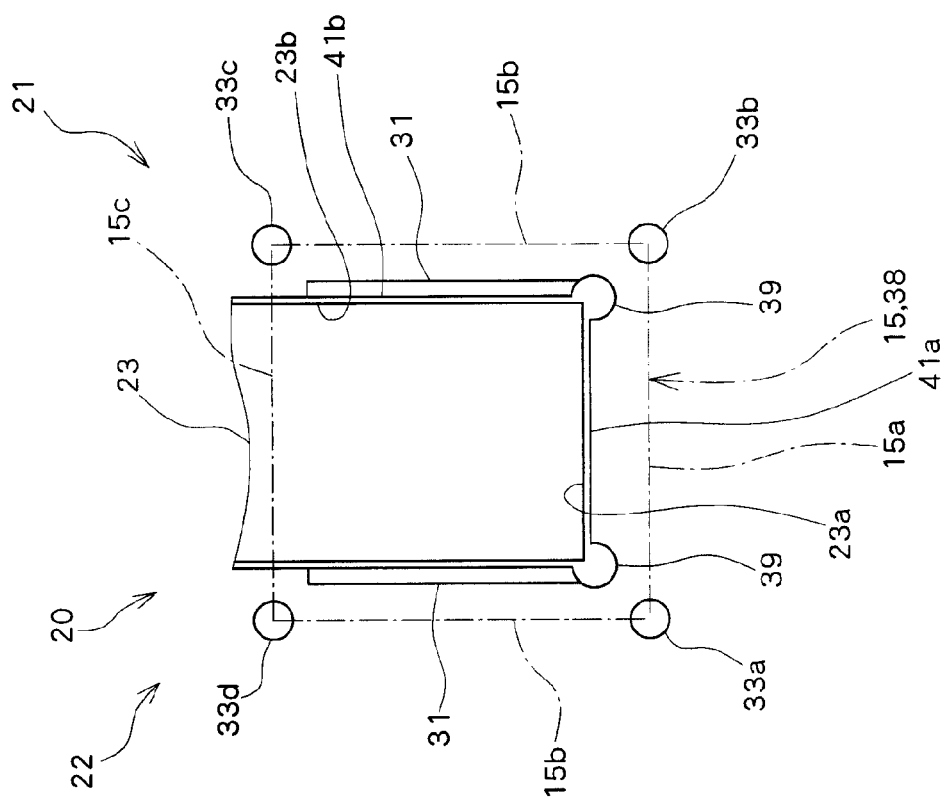
FIG. 31 is a plan view illustrating an arrangement of longitudinal grooves, holes, and side projections on the upper surface of the stage of the semiconductor die pick-up apparatus according to a different embodiment of the present invention.

A different embodiment of the present invention will now be described with reference to FIG. 31. Referring to FIG. 31, longitudinal grooves 39 that communicate with the interior of the case 21 of the stage 20 are provided at the corners of the end surface 41a and the side surface 41b of the suction opening 41. As illustrated in FIG. 31, the longitudinal grooves 39 are in ¾ circular cross section whose centers respectively correspond to the corners of the end surface 41a and the side surface 41b of the suction opening 41, and each configured as a sectoral hole having 270 degrees of central angle in a state in which the tip end 23a of the cover 23 is in contact with the end surface 41a of the suction opening 41. Further, the end surface of each the side projections 31 in contact with the longitudinal groove 39 is in a circular arc following the shape of an outer circumference of the longitudinal grooves 39. By providing the longitudinal grooves 39 as in this embodiment, it is possible to suction the corners of the tip end 15a of the semiconductor die 15 with greater strength when a vacuum is produced within the case 21 to increase the strength for separating the retaining sheet 12, and therefore it is possible to further facilitate the separation of the retaining sheet. Moreover, while in the embodiment described with reference to FIG. 23 through FIGS. 29a, 29b, and 29c, it is described that the subsidiary holes 35 are arranged in addition to the primary holes 33a-33d, it is possible to eliminate the subsidiary holes 35 and to arrange only the longitudinal groove 39 and the primary holes 33a-33d as illustrated in FIG. 31.

Figure 32:
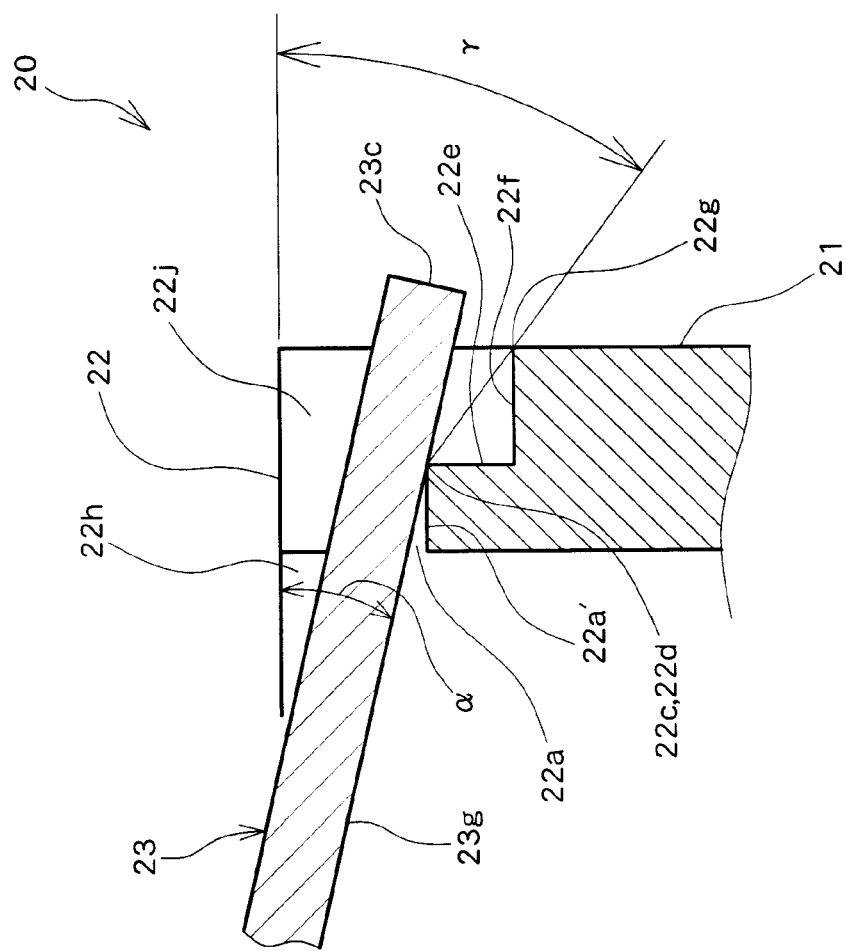
FIG. 32 is a cross-sectional view illustrating the cover and the sliding groove of the semiconductor die pick-up apparatus according to a different embodiment of the present invention.

A different embodiment of the present invention will now be described with reference to FIG. 32. While in the embodiment described with reference to FIG. 30, it is described that the inclined surface 22b is provided on the side of the outer circumference of the stage of the sliding groove 22a, the stepped portion 22f can be provided instead of the inclined surface 22b as illustrated in FIG. 32. As illustrated in FIG. 32, an angle of a plane including the edge 22d and an outer circumference side edge 22g of the stepped portion 22f with respect to the contact surface 22 is an angle γ, and an inclination angle of the lower surface 23g of the cover 23 when the cover 23 is fully opened with respect to the contact surface 22 α. As the angle γ is always greater than the angle α that is the angel of the lower surface 23g of the cover 23 with respect to the contact surface 22 even when the cover 23 slides, the outer circumference side edge 22g of the stepped portion 22f does not interfere with of the back end 23c the cover 23. Then, while the cover 23 slides, the lower surface 23g of the cover 23 is always in line contact with the edge 22d, and it is possible to prevent the air from coming through this portion. This embodiment provides the same effects as the embodiment described with reference to FIG. 30.

The present invention is not limited to the embodiments described above, and includes any modifications and alterations that are made without departing from the technical scope and the spirit of the present invention as defined by the scope of the invention.

REFERENCE MARKS IN THE DRAWINGS

10 Wafer Holder
11 Wafer
12 Retaining Sheet
12a Die Attachment Film

13 Ring
14 Cut-In Gap
15 Semiconductor Die
15a Tip End
15b Side Surface
15c Back End
16 Expand Ring
17 Ring Holder
18 Collet
19 Suction Hole
20 Stage
21 Case
22 Contact Surface
22a Sliding Groove
22a' Bottom Surface
22b Inclined Surface
22c End Portion
22d Edge
22f Stepped Portion
22g Outer Circumference Side Edge
22h, 22j Side Surface
22k End Surface
23 Cover
23a Tip End
23b Side Surface
23c Back End
23f Arm
23g Lower Surface
24 Base Body
25 Driving Unit
31 Side Projection
32, 32a End Surface Projection
32b Stick-Like Projection
33a-33d Primary Hole
35 Subsidiary Hole
36 Connecting Rib
37 Communicating Hole
38 Rectangular Region
39 Longitudinal Groove
41 Suction Opening
41a End Surface
41b Side Surface
42 Opening Section
43 Hole Region
44 Recessed Region
53 Separation Line
70 Control Unit
71 Vacuum Apparatus
72 Wafer Holder Horizontal Direction Driving Unit
73 Stage Vertical Direction Driving Mechanism
100 Pick-Up Apparatus
300 Slider Driving Mechanism
321a Stopper
326 First Link
326a Engagement Groove
326b Shaft
326c Roller
327, 328 Pin
329 Second Link
329a Engagement Groove
330, 330a Pin
331 Guide Rail
332 Slider
370 Piston
371 Flange
381 Motor
383 Cam

The invention claimed is:

1. A semiconductor die pick-up apparatus for picking up a semiconductor die applied to a retaining sheet, the apparatus comprising:
 a stage comprising a contact surface configured to be in close contact with a first surface of the retaining sheet, the first surface being opposite of a second surface to which the semiconductor die is applied;
 a suction opening provided in the contact surface;
 a cover provided for the stage so as to allow a tip end of the cover on a closing side of the suction opening to advance freely from the contact surface, and configured to slide along the contact surface to open and close the suction opening;
 a supporting structure for supporting the semiconductor die from below and arranged along a circumferential edge of the suction opening, the supporting structure extending from the contact surface, the supporting structure comprising a U-shape having one end projection and two side projections, each of the side projections joined at a respective end of the end projection;
 a plurality of suction holes provided in the contact surface on a side of an outer circumference of the stage from the projection; and
 a collet configured to suction the semiconductor die, wherein
 when picking up the semiconductor die, in a state in which at least a portion of a contour of the semiconductor die to be picked up extends from the projection toward the outer circumference of the stage, the retaining sheet at the portion extending from the projection toward the outer circumference of the stage is suctioned into the suction holes.

2. A semiconductor die pick-up apparatus for picking up a semiconductor die applied to a retaining sheet, the apparatus comprising:
 a stage comprising a contact surface configured to be in close contact with a first surface of the retaining sheet, the first surface being opposite of a second surface to which the semiconductor die is applied;
 a suction opening provided in the contact surface;
 a cover provided for the stage so as to allow a tip end of the cover on a closing side of the suction opening to advance freely from the contact surface, and configured to slide along the contact surface to open and close the suction opening;
 a projection arranged along a circumferential edge of the suction opening and extending from the contact surface;
 a plurality of suction holes provided in the contact surface on a side of an outer circumference of the stage from the projection; and
 a collet configured to suction the semiconductor die, wherein
 when picking up the semiconductor die, in a state in which at least a portion of a contour of the semiconductor die to be picked up extends from the projection toward the outer circumference of the stage, the retaining sheet at the portion extending from the projection toward the outer circumference of the stage is suctioned into the suction holes;
 the tip end of the cover advances to a position equal to or higher than an upper end surface of the projection from the contact surface,
 the cover slides while the retaining sheet and the semiconductor die to be picked up are pushed upward to open the suction opening, the opened suction opening suctions the retaining sheet to separate the retaining sheet from the semiconductor die to be picked up, and the collet suctions the semiconductor die to be picked up.

3. The semiconductor die pick-up apparatus according to claim 2, wherein the suction opening extends linearly, and the projection comprises a first side projection and a second side projection, the first side projection respectively provided linearly extending along a first section of the circumferential edge of the suction opening, the second side projection respectively provided linearly extending along a second section of the circumferential edge of the suction opening, the first side projection and the second side projection spaced apart on opposing sides of the suction opening.

4. The semiconductor die pick-up apparatus according to claim 3, wherein the projection further comprises an end surface projection provided along a section of the circumferential edge at an end of the suction opening, the tip end of the cover moving closer to and away from the suction opening.

5. The semiconductor die pick-up apparatus according to claim 3, wherein the suction holes comprise four primary holes arranged at four corners of a rectangular region that comprises the end of the suction opening which the tip end of the cover moves closer to and away from and at least a portion of the side projections, two facing sides of the rectangular region being parallel with the side projections.

6. The semiconductor die pick-up apparatus according to claim 4, wherein the suction holes comprise four primary holes arranged at four corners of a rectangular region that comprises the end of the suction opening which the tip end of the cover moves closer to and away from and at least a portion of the side projections, two facing sides of the rectangular region being parallel with the side projections.

7. The semiconductor die pick-up apparatus according to claim 2, wherein when picking up the semiconductor die, the tip end of the cover is caused to advance up to the position equal to or higher than the upper end surface of the projection from the contact surface, the cover is caused to slide to a first predetermined position while the retaining sheet and the semiconductor die to be picked up are pushed upward to open the suction opening to the first predetermined position, the opened suction opening is caused to suction the retaining sheet to separate the retaining sheet from the semiconductor die to be picked up to a portion near the first predetermined position, the collet is moved down immediately above the semiconductor die to be picked up to suction a portion of the semiconductor die to be picked up, the cover thereafter is caused to slide further in the sliding direction from the first predetermined position while the retaining sheet and the semiconductor die to be picked up are pushed upward to open the suction opening further in the sliding direction from the first predetermined position, the further opened suction opening is caused to suction the retaining sheet to separate the retaining sheet from the semiconductor die to be picked up further in the sliding direction from the portion near the first predetermined position, and the collet is caused to suction the remaining portion of the semiconductor die to be picked up.

8. The semiconductor die pick-up apparatus according to claim 2, wherein when picking up the semiconductor die, the tip end of the cover is caused to advance up to the position equal to or higher than the upper end surface of the projection from the contact surface, the cover is caused to slide to a first predetermined position while the retaining sheet and the semiconductor die to be picked up are pushed upward to open the suction opening to the first predetermined position, the opened suction opening is caused to suction the retaining sheet to separate the retaining sheet from the semiconductor die to be picked up to a portion near the first predetermined position, the collet is moved down immediately above the semiconductor die to be picked up to suction the semiconductor die to be picked up, the cover thereafter is caused to slide further in the sliding direction from the first predetermined position while the retaining sheet and the semiconductor die to be picked up are pushed upward to open the suction opening further in the sliding direction from the first predetermined position, and the further opened suction opening is caused to suction the retaining sheet to separate the retaining sheet from the semiconductor die to be picked up further in the sliding direction from the portion near the first predetermined position.

9. The semiconductor die pick-up apparatus according to claim 2, wherein when picking up the semiconductor die, the collet suctions the semiconductor die to be picked up as the retaining sheet is separated from the semiconductor die to be picked up in a state in which the collet holds the semiconductor die to be picked up.

10. The semiconductor die pick-up apparatus according to claim 9, wherein when picking up the semiconductor die, the collet is moved upward in synchronization with the tip end of the cover as the tip end of the cover advances to the position equal to or higher than the upper end surface of the projection from the contact surface.

11. The semiconductor die pick-up apparatus according to claim 2, wherein the stage is cylindrical, the cover is substantially as wide as the suction opening, and when the tip end is advanced from the contact surface, a surface that pushes up the retaining sheet is inclined downward from a side of the tip end to a back end on the side of opening the suction opening, a sliding groove is provided, the sliding groove being recessed from the contact surface by a thickness of the cover, the sliding groove being substantially as wide as the cover, and the sliding groove extending toward an outer circumferential surface of the stage from a position of an end of the suction opening on an opening side of the cover to a position on a side of an inner circumference of the stage from a position of the back end of the cover in a state in which the cover closes the suction opening at a position that deviates from overlapping with a cylindrical surface of the outer circumference of the stage, an inclined surface is provided, the inclined surface extending from a bottom surface of the sliding groove at a side edge of at the outer circumference of the stage toward a side opposite of the contact surface, and when picking up the semiconductor die, the cover is caused to slide to open the suction opening while a surface of the cover that is opposite of a surface pushing up the retaining sheet is brought into contact with an edge between the bottom surface of the sliding groove and the inclined surface.

12. The semiconductor die pick-up apparatus according to claim 11, wherein an inclination angle of the inclined surface with respect to the contact surface is greater than an inclination angle of the surface of the cover that is opposite of the surface pushing up the retaining sheet with respect to the contact surface.

13. The semiconductor die pick-up apparatus according to claim 11, wherein a stepped portion is provided, the stepped portion extending from the inclined surface to the outer circumference surface of the stage along the contact surface, and an angle of a surface comprising the edge and the side edge of the stepped portion at the outer circumference of the stage with respect to the contact surface is greater than an inclination angle of the surface of the cover that is opposite of the surface pushing up the retaining sheet with respect to the contact surface.

14. A method of picking up a semiconductor die applied to a retaining sheet using a semiconductor die pick-up apparatus for picking up the semiconductor die applied to the retaining sheet, the method comprising:

a preparing step of preparing the semiconductor die pick-up apparatus, the apparatus comprising:

a stage comprising a contact surface configured to be in close contact with a first surface of the retaining sheet, the first surface being opposite of a second surface to which the semiconductor die is applied;

a suction opening provided in the contact surface;

a cover provided for the stage so as to allow a tip end of the cover on a closing side of the suction opening to advance freely from the contact surface, and configured to slide along the contact surface to open and close the suction opening;

a projection arranged along a circumferential edge of the suction opening and extending from the contact surface;

a plurality of suction holes provided in the contact surface on a side of an outer circumference of the stage from the projection; and a collet configured to suction the semiconductor die, an alignment step of, when picking up the semiconductor die, aligning positions of the semiconductor die to be picked up in a state in which at least a portion of a contour of the semiconductor die to be picked up sticks out from the projection toward the outer circumference of the stage; and a pick-up step of picking up the semiconductor die by suctioning the retaining sheet at the portion sticking out from the projection toward the outer circumference of the stage into the suction holes, causing the tip end of the cover to advance up to a position equal to or higher than an upper end surface of the projection from the contact surface, causing the cover to slide while the retaining sheet and the semiconductor die to be picked up are pushed upward to open the suction opening, causing the opened suction opening to suction the retaining sheet to separate the retaining sheet from the semiconductor die to be picked up, and causing the collet to suction the semiconductor die to be picked up.

15. The method of picking up a semiconductor die according to claim 14, wherein the pick-up step comprises, when picking up the semiconductor die, causing the tip end of the cover to advance up to the position equal to or higher than the upper end surface of the projection from the contact surface, causing the cover to slide to a first predetermined position while the retaining sheet and the semiconductor die to be picked up are pushed upward to open the suction opening to the first predetermined position, causing the opened suction opening to suction the retaining sheet to separate the retaining sheet from the semiconductor die to be picked up to a portion near the first predetermined position, moving the collet down immediately above the semiconductor die to be picked up to suction a portion of the semiconductor die to be picked up, thereafter causing the cover to slide further in the sliding direction from the first predetermined position while the retaining sheet and the semiconductor die to be picked up are pushed upward to open the suction opening further in the sliding direction from the first predetermined position, causing the further opened suction opening to suction the retaining sheet to separate the retaining sheet from the semiconductor die to be picked up further in the sliding direction from the portion near the first predetermined position, and causing the collet to suction the remaining portion of the semiconductor die to be picked up.

16. The method of picking up a semiconductor die according to claim 14, wherein the pick-up step comprises, when picking up the semiconductor die, causing the tip end of the cover to advance up to the position equal to or higher than the upper end surface of the projection from the contact surface, causing the cover to slide to a first predetermined position while the retaining sheet and the semiconductor die to be picked up are pushed upward to open the suction opening to the first predetermined position, causing the opened suction opening to suction the retaining sheet to separate the retaining sheet from the semiconductor die to be picked up to a portion near the first predetermined position, moving the collet down immediately above the semiconductor die to be picked up to suction the semiconductor die to be picked up, thereafter causing the cover to slide further in the sliding direction from the first predetermined position while the retaining sheet and the semiconductor die to be picked up are pushed upward to open the suction opening further in the sliding direction from the first predetermined position, and causing the further opened suction opening to suction the retaining sheet to separate the retaining sheet from the semiconductor die to be picked up further in the sliding direction from the portion near the first predetermined position.

17. The method of picking up a semiconductor die according to claim 14, wherein the pick-up step comprises, when picking up the semiconductor die, causing the collet to suction the semiconductor die to be picked up as the retaining sheet is separated from the semiconductor die to be picked up in a state in which the collet holds the semiconductor die to be picked up.

18. The method of picking up a semiconductor die according to claim 17, further comprising:

moving the collet upward, when picking up the semiconductor die, in synchronization with the tip end of the cover as the tip end of the cover advances to the position equal to or higher than the upper end surface of the projection from the contact surface.

19. The method of picking up a semiconductor die according to claim 14, wherein
the projection of the semiconductor die pick-up apparatus comprises two side projections respectively provided along linearly extending opposing sections of the circumferential edge of the suction opening,
the suction holes comprise four primary holes arranged at four corners of a rectangular region that comprises the end of the suction opening which the tip end of the cover moves closer to and away from and at least a portion of the side projections, two facing sides of the rectangular region being parallel with the side projections,
a width of the rectangular region in a direction perpendicular to a direction in which the suction opening extends is substantially the same as a width of the semiconductor die to be picked up,
a length of the rectangular region in the direction in which the suction opening extends is substantially the same as a length of the semiconductor die to be picked up, and
the alignment step comprises aligning the positions of the semiconductor die to be picked up such that four corners of the semiconductor die to be picked up respectively come above the primary holes.

* * * * *